(12) United States Patent
Murakami et al.

(10) Patent No.: US 7,765,686 B2
(45) Date of Patent: Aug. 3, 2010

(54) MULTILAYER WIRING STRUCTURE AND METHOD OF MANUFACTURING THE SAME

(75) Inventors: Akishige Murakami, Ohta-ku (JP); Ikue Kawashima, Ohta-ku (JP); Yoshikazu Akiyama, Ohta-ku (JP)

(73) Assignee: Ricoh Company, Ltd., Tokyo (JP)

( * ) Notice: Subject to any disclaimer, the term of this patent is extended or adjusted under 35 U.S.C. 154(b) by 292 days.

(21) Appl. No.: 11/908,731

(22) PCT Filed: Mar. 2, 2006

(86) PCT No.: PCT/JP2006/304528
§ 371 (c)(1),
(2), (4) Date: Sep. 14, 2007

(87) PCT Pub. No.: WO2006/098207
PCT Pub. Date: Sep. 21, 2006

(65) Prior Publication Data
US 2009/0025215 A1    Jan. 29, 2009

(30) Foreign Application Priority Data

| Mar. 14, 2005 | (JP) | ............................. 2005-070227 |
| May 17, 2005 | (JP) | ............................. 2005-143590 |
| Oct. 21, 2005 | (JP) | ............................. 2005-306592 |

(51) Int. Cl.
*H05K 3/20*    (2006.01)
(52) U.S. Cl. .............................. 29/831; 29/833; 29/834; 29/428; 29/840; 29/846; 427/97.4; 438/694

(58) Field of Classification Search .................. 29/846, 29/428, 826, 840, 847, 831, 833, 834; 427/97.4; 438/694
See application file for complete search history.

(56) References Cited

U.S. PATENT DOCUMENTS 4,883,766 A    11/1989    Ishida et al.

(Continued)

FOREIGN PATENT DOCUMENTS

CN    1452451 A    10/2003

(Continued)

*Primary Examiner*—Derris H Banks
*Assistant Examiner*—Jeffrey Carley
(74) *Attorney, Agent, or Firm*—Oblon, Spivak, McClelland, Maier & Neustadt, L.L.P.

(57) ABSTRACT

A method of manufacturing a multilayer wiring structure is disclosed. The method comprises a step of forming a via post on a first metal wiring element, a step of printing an interlayer insulation film on the first metal wiring element, with use of a screen mask having a non-ejection area slightly larger than a head of the via post, such that the interlayer insulation film has an upper surface at the level lower than the head of the via post, while generally aligning the non-ejection area with the head of the via post, a step of curing the interlayer insulation film, and a step of forming a second metal wiring element in contact with the via post on the interlayer insulation film such that the first metal wiring element and the second metal wiring element are connected through the via post.

8 Claims, 33 Drawing Sheets

U.S. PATENT DOCUMENTS

| | | | |
|---|---|---|---|
| 5,053,844 A | 10/1991 | Murakami et al. | |
| 5,060,041 A | 10/1991 | Haga et al. | |
| 5,140,397 A | 8/1992 | Haga et al. | |
| 5,162,240 A * | 11/1992 | Saitou et al. | 427/8 |
| 5,589,712 A | 12/1996 | Kawashima et al. | |
| 5,729,262 A | 3/1998 | Akiyama et al. | |
| 5,937,327 A | 8/1999 | Kawashima | |
| 5,976,971 A | 11/1999 | Kinpara et al. | |
| 6,320,262 B1 | 11/2001 | Murakami | |
| 6,436,734 B1 * | 8/2002 | Lin | 438/121 |
| 6,874,898 B2 | 4/2005 | Akiyama | |
| 7,166,689 B2 | 1/2007 | Sagisaka et al. | |
| 7,285,305 B2 * | 10/2007 | Furusawa et al. | 427/117 |
| 7,582,904 B2 * | 9/2009 | Fujii et al. | 257/72 |
| 2003/0213952 A1 | 11/2003 | Iechi et al. | |
| 2004/0201096 A1* | 10/2004 | Iijima et al. | 257/734 |
| 2009/0231820 A1* | 9/2009 | Tanaka | 361/764 |

FOREIGN PATENT DOCUMENTS

| | | |
|---|---|---|
| CN | 1571621 | 1/2005 |
| JP | 61 13646 | 1/1986 |
| JP | 3 185788 | 8/1991 |
| JP | 7 64110 | 3/1995 |
| JP | 07-245479 * | 9/1995 |
| JP | 07245479 A * | 9/1995 |
| JP | 9 116247 | 5/1997 |
| JP | 11 87925 | 3/1999 |
| JP | 11 186731 | 7/1999 |
| JP | 2001 165785 | 6/2001 |
| JP | 2001 168491 | 6/2001 |
| JP | 2001 217548 | 8/2001 |
| JP | 2001 274547 | 10/2001 |
| JP | 2003 48303 | 2/2003 |
| JP | 2003 309369 | 10/2003 |
| JP | 2005 93517 | 4/2005 |
| KR | 2003-0088911 A | 11/2003 |
| TW | 577176 | 2/2004 |
| TW | 592019 | 6/2004 |

* cited by examiner

FIG.4

| OL(um) | CONTACT RESISTANCE | VIA HOLE |
|---|---|---|
| 0 | △ | |
| 5 | △ | |
| 10 | ○ | ○ |
| 20 | ○ | ○ |
| 30 | ○ | ○ |
| 40 | ○ | ○ |
| 50 | ○ | ○ |
| 60 | ○ | HOLE WITH VOID: 3 |
| 70 | ○ | HOLE WITH VOID: 7 |
| 80 | ○ | HOLE WITH VOID: 6 |
| 90 | ○ | HOLE WITH VOID: 12 |
| 100 | ○ | HOLE WITH VOID: 20 |

×: CONDUCTION FAILURE
△: CONTACT RESISTANCE INCREASED
○: CONTACT RESISTANCE < 10Ω

○: ONE OR NO HOLE WITH VOID

| OL(μm) | CONTACT RESISTANCE | VIA HOLE |
|---|---|---|
| 0 | △ | ○ |
| 5 | △ | ○ |
| 10 | ○ | ○ |
| 20 | ○ | ○ |
| 30 | ○ | ○ |
| 40 | ○ | ○ |
| 50 | ○ | ○ |
| 60 | ○ | HOLE WITH VOID: 3 |
| 70 | ○ | HOLE WITH VOID: 5 |
| 80 | ○ | HOLE WITH VOID: 6 |
| 90 | ○ | HOLE WITH VOID: 10 |
| 100 | ○ | HOLE WITH VOID: 9 |

×: CONDUCTION FAILURE
△: CONTACT RESISTANCE INCREASED
○: CONTACT RESISTANCE <10Ω

○: NO HOLE WITH VOID

FIG.11

| OL(μm) | DEFECTIVE BIT | VIA HOLE |
|---|---|---|
| 0 | × | ○ |
| 5 | △ | ○ |
| 10 | ○ | ○ |
| 20 | ○ | ○ |
| 30 | ○ | ○ |
| 40 | ○ | ○ |
| 50 | ○ | ○ |
| 60 | ○ | HOLE WITH VOID: 5 |
| 70 | ○ | HOLE WITH VOID: 5 |
| 80 | ○ | HOLE WITH VOID: 11 |
| 90 | ○ | HOLE WITH VOID: 19 |
| 100 | ○ | HOLE WITH VOID: 32 |

×: DEFECTIVE BIT ≧ 100
△: 10 ≦ DEFECTIVE BIT < 100
○: DEFECTIVE BIT < 10

○: ONE OR NO HOLE WITH VOID

FIG.14

| OL(um) | DEFECTIVE BIT | VIA HOLE |
|---|---|---|
| 0 | × | |
| 5 | △ | |
| 10 | ○ | ○ |
| 20 | ○ | ○ |
| 30 | ○ | ○ |
| 40 | ○ | ○ |
| 50 | ○ | ○ |
| 60 | ○ | HOLE WITH VOID: 4 |
| 70 | ○ | HOLE WITH VOID: 8 |
| 80 | ○ | HOLE WITH VOID: 22 |
| 90 | ○ | HOLE WITH VOID: 27 |
| 100 | ○ | HOLE WITH VOID: 39 |

×: DEFECTIVE BIT ≧ 100
△: 10 ≦ DEFECTIVE BIT < 100
○: DEFECTIVE BIT < 10

○: ONE OR NO HOLE WITH VOID

INSULATION LAYER SURFACE
MECHANICALLY POLISHED

FIG.19A
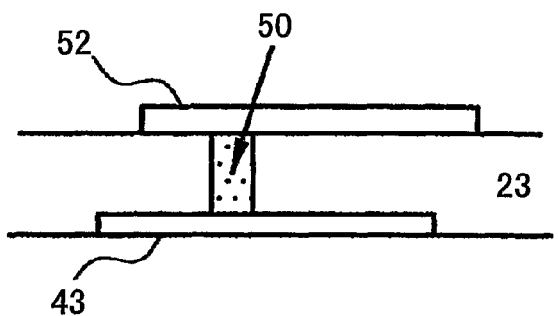
FIG.19B1
FIG.19B2
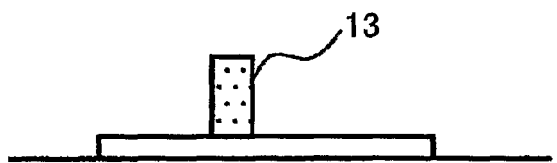
FIG.19B3
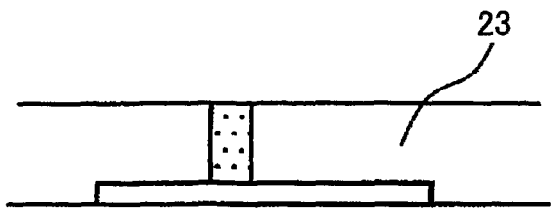
FIG.19B4
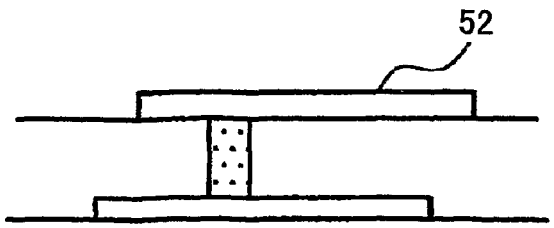

FIG.21A (A1) 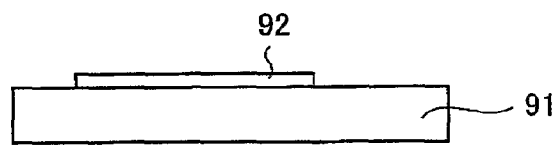
FIG.21B (B1) 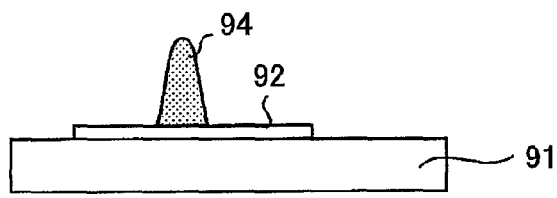
FIG.21C (C1) 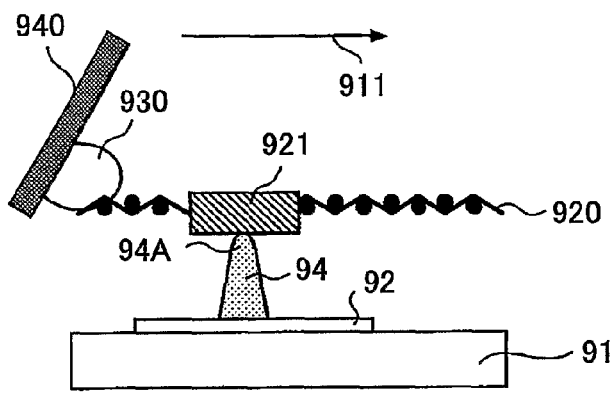
FIG.21D (D1) 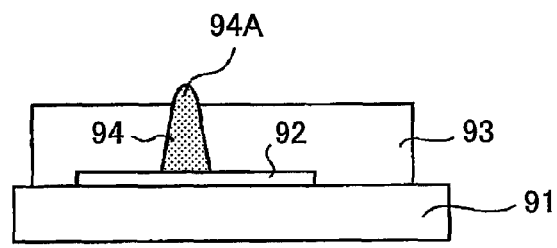
FIG.21E (E1) 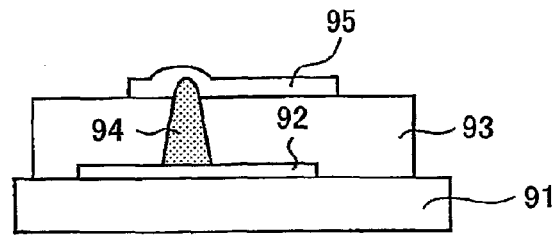

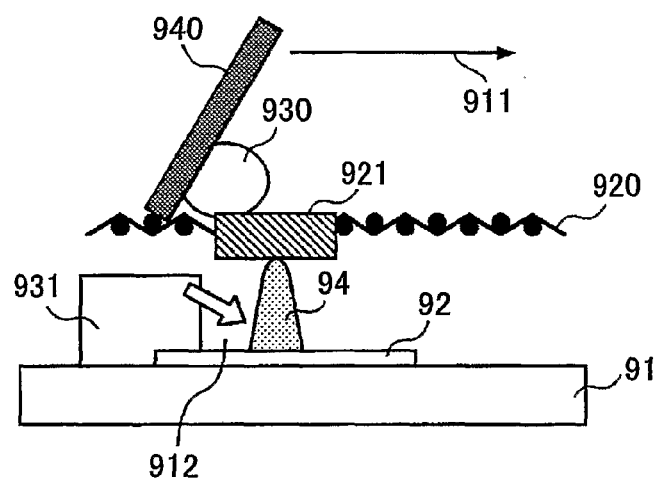
FIG.23A (C1-1)
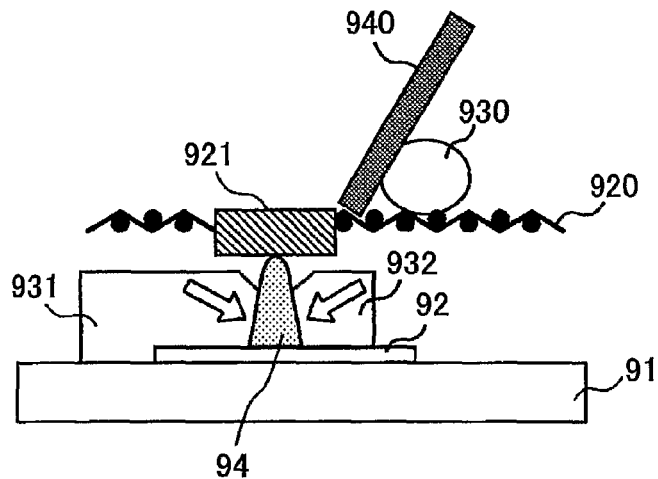
FIG.23B (C1-2)
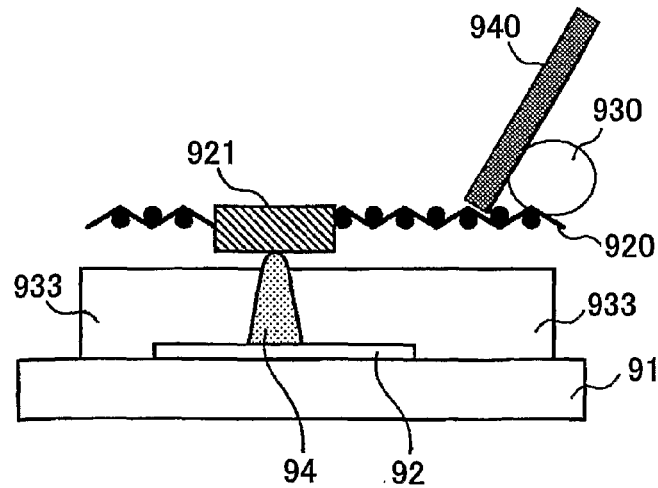
FIG.23C (C1-3)

FIG.25A (A2) 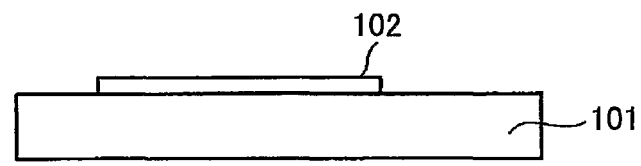
FIG.25B (B2) 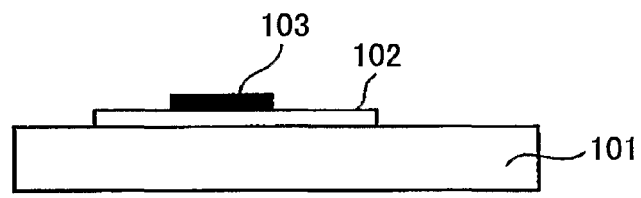
FIG.25C (C2) 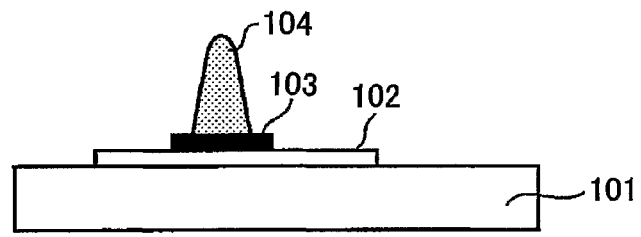

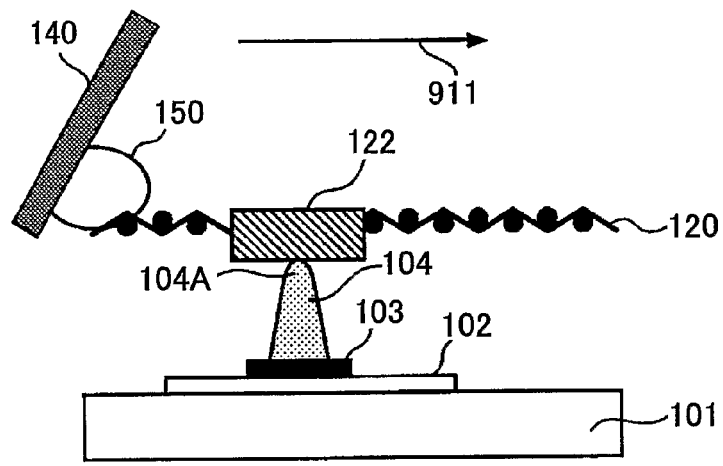
FIG.25D (D2)
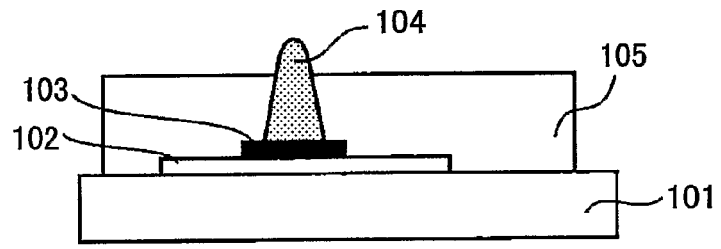
FIG.25E (E2)
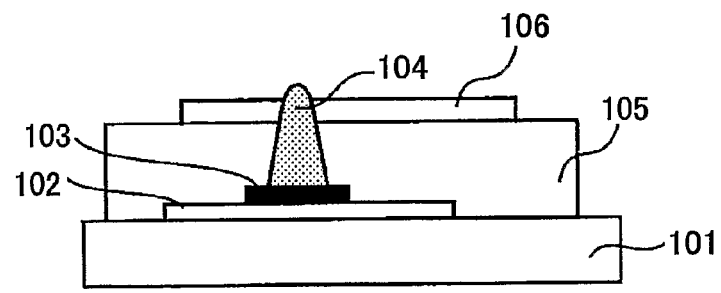
FIG.25F (F2)

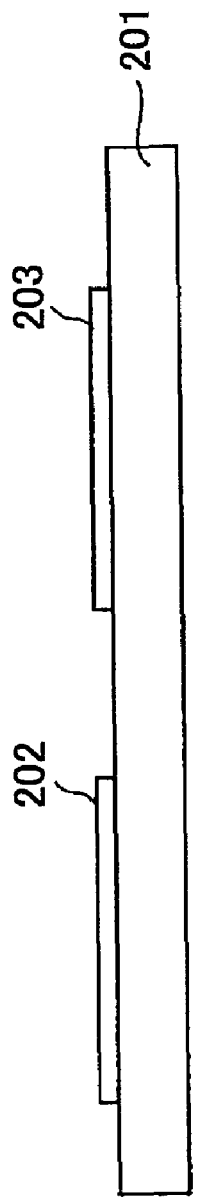
FIG.27A (A3)
FIG.27B (B3)
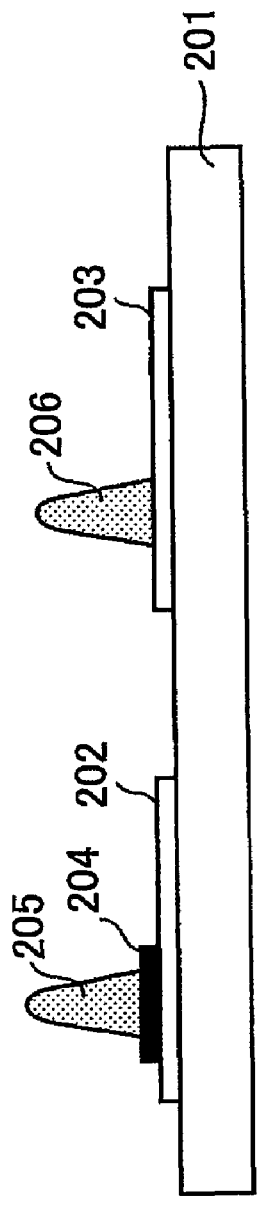
FIG.27C (C3)

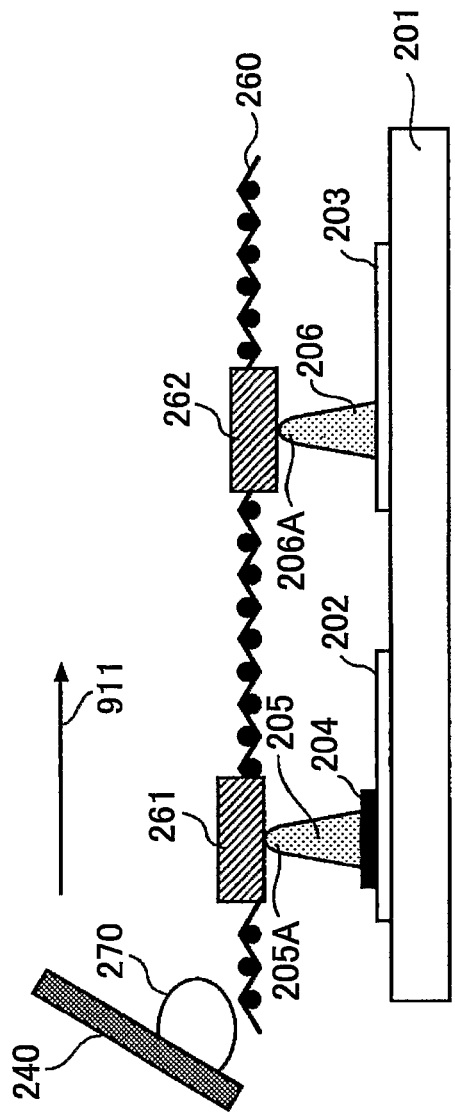
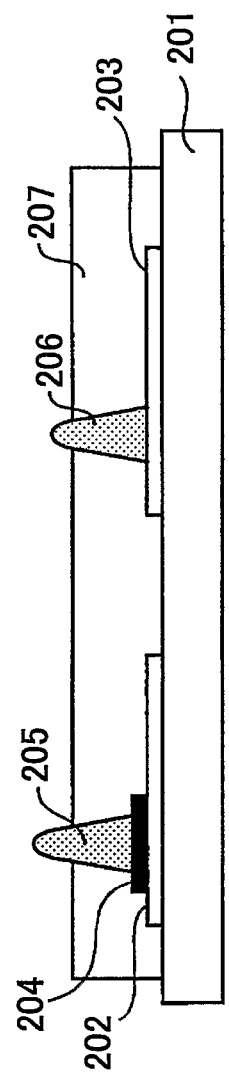
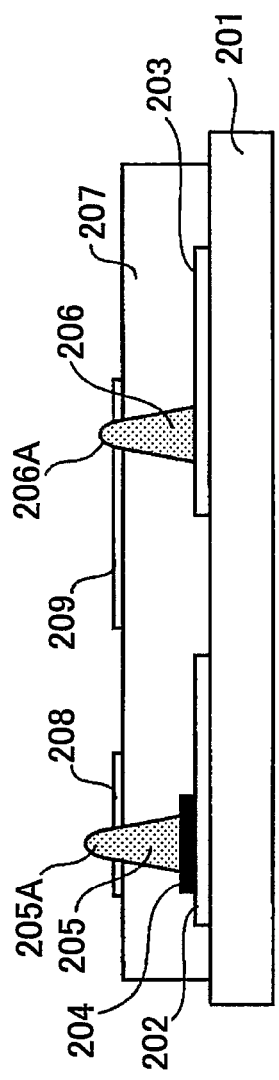
FIG.27D (D3)
FIG.27E (E3)
FIG.27F (F3)

MULTILAYER WIRING STRUCTURE AND METHOD OF MANUFACTURING THE SAME

TECHNICAL FIELD

The present invention generally relates to a method of manufacturing a multilayer wiring structure, and particularly relates to a method of manufacturing a multilayer wiring structure in which an upper metal electrode and a lower metal electrode are connected to each other through a via hole. The present invention also relates to a printed board, a ceramic substrate, a flat panel display, a method of manufacturing a multilayer wiring printed board, a method of manufacturing a multilayer wiring ceramic substrate, and a method of manufacturing a drive circuit for a flat panel display. The present invention further relates to a multilayer wiring structure, an element substrate comprising the same, a flat panel display device using the same, and a method of manufacturing the multilayer wiring structure.

BACKGROUND ART

Multilayer wiring structures are widely used in printed boards and ceramic substrates having laminated ceramic green sheets. When the wiring structures are manufactured, techniques for connecting lower metal wiring elements and upper metal wiring elements, being separated by interlayer insulation layers, to each other through via holes are used. Especially, in recent years and continuing, techniques for connecting lower metal wiring elements and upper metal wiring elements to each other through small via holes are attracting interest due to an increasing demand for higher density mounting on printed wiring boards and ceramic substrates along with a trend toward more highly integrated and higher speed LSIs.

The manufacturing process of the printed boards and ceramic substrates uses screen printing as a method of filling via holes. If the diameter of a via hole is several hundreds μm, the via hole can be easily filled with a conductive paste by screen printing.

However, if the diameter of the via hole is as small as about 100 μm, air in the via hole is not completely removed by the conductive paste, so that unwanted air bubbles and voids remain in the via hole filled with the conductive paste. As a result, the contact resistance of the via hole is increased, which lowers output signal and frequency properties. The increase of contact resistance lowers long-term reliability of the printed boards and ceramic substrates.

Patent Document 1 entitled "MANUFACTURING METHOD OF PRINTED WIRING BOARD" discloses a method of filling small via holes.

According to the method disclosed in Patent Document 1, with reference to FIG. 16, a via hole 50 is filled with a conductive paste 15 with use of a screen mask 17 having an ejection hole 44 with a diameter greater than the diameter of the via hole 50. Then, the conductive paste 15 is heated and cured while a substrate 51 is vibrated at 1-100 Hz. During curing of the conductive paste 15, air bubbles and voids in the via hole 50 are pushed out by the vibration and the vacated space is filled with the conductive paste 15. Therefore, neither air hole nor air gap remains in the via holes 50.

However, when the via hole 50 has a smaller diameter, a conductive paste 15 having higher viscosity is used. As the viscosity increases, removal of the air bubbles and gaps by vibration becomes more difficult and incomplete. In one embodiment illustrated in Patent Document 1, the method is used for filling the via hole 50 having a diameter of 100 μm with the conductive paste (Ag paste) 15 having a viscosity of 1000-3000 Pa·s. It seems that this method cannot be used for filling a via hole having a diameter smaller than 100 μm. Another problem with this method is that a special heating oven is required for generating vibration of 1-100 Hz.

Another method of filling small via holes is disclosed in Patent Document 2 entitled "SCREEN PRINTING METHOD AND METHOD FOR MANUFACTURING LAMINATED CERAMIC ELECTRONIC PART".

According to the method disclosed in Patent Document 2, with reference to FIG. 17, two squeegees having different attack angles are arranged in a moving direction. A process of printing upper metal electrodes and a process of filling via holes are simultaneously performed while two squeegees move toward same direction on the surface of the object to be printed. Since the attack angle of the squeegee arranged upstream in the moving direction is relatively large, the upper electrodes can be formed without blur. On the other hand, since the attack angle of the squeegee arranged downstream in the moving direction is relatively small, the via holes can be efficiently filled.

However, the squeegee used for filling the via holes is the one arranged downstream in the moving direction. Using a squeegee having a small attack angle for filling via holes is well known in the art. Therefore, it seems to be difficult to fill via holes smaller than conventional via holes by using the method of Patent Document 2. The main advantage of the method of Patent Document 2 is that via holes having about the same size as the conventional via holes can be filled while printing the upper electrodes without blur.

Patent Document 3 discloses a method of connecting upper metal wiring elements and lower metal wiring elements through small via holes. According to Patent Document 3, with reference to FIGS. 18A-18E, a columnar conductor 46 of conductive paste is formed on a lower metal wiring element 45. Then, the lower metal wiring element 45 and the columnar conductor 46 are covered with an insulation layer 47. The surface of the insulation layer 47 is polished by mechanical polishing until a head of the columnar conductor 46 is exposed. An upper metal wiring element 49 is then formed on the polished insulation layer 47, so that the lower metal wiring element 45 and the upper metal wiring element 49 are connected to each other. The method of Patent Document 3 does not inherently have the problem related to air bubbles and voids remaining in via holes because the columnar conductor 46 is used in place of a via hole filled with a conductive paste.

Electric circuits formed on printed wiring boards and ceramic wiring boards include various capacitors, inductors, resistors, and LSIs. A technique for embedding the capacitors into the boards is attracting attention because of demand for higher signal speed and higher mounting density.

According to a well-know method, an internal capacitor is formed by applying a dielectric paste and then sandwiching the dielectric paste with upper and lower electrodes.

However, the capacitor formed using this method occupies a relatively large area and prevents high density mounting on the board even if the size of via holes is reduced. For this reason, smaller internal capacitors are needed.

A method of forming small internal capacitors is disclosed in Patent Document 4.

According to the method of Patent Document 4, a hole for capacitor paste and a hole for a plating post are formed on a lower metal wiring element. Then, the hole for the capacitor paste is filled with the capacitor paste by screen printing, and then the plating post is formed in the other hole by plating. After that, photoresist is removed, and the capacitor paste and the plating post are covered with an interlayer of insulating resin. The surface of the insulation resin interlayer is polished with a buff or the like by mechanical polishing so as to expose heads of the capacitor paste and the plating post. An upper metal wiring element is then formed on the capacitor paste and the plating post. Thus, a multilayer wiring structure having an internal capacitor and the upper and lower metal wiring elements connected through the via holes is formed.

The method disclosed in Patent Document 1 utilizes the method disclosed in Patent Document 3, and can form small internal capacitors with use of a capacitor paste containing a filler of a suitable relative dielectric constant.

A common problem for the methods disclosed in Patent Documents 3 and 4 is that dust is generated during the polishing process for exposing the head of the columnar conductor 46 (the capacitor paste and the plating metal), and the dust might cause contact failure if deposited on an interface between the columnar conductor 46 (the capacitor paste and the plating metal) and the upper metal wiring element 49. A cleaning process is therefore added after the mechanical polishing process, making the manufacturing process more complex. Moreover, polishing machines and cleaning machines increase the cost of manufacturing equipment. In addition, a larger production space is required because the polishing machines and cleaning machines are needed to be isolated from other work spaces in order to prevent the dust from scattering. As for the method disclosed in Patent Document 4, the reliability of the internal capacitor is lowered if air bubbles and voids are present between the interlayer insulating resin and the capacitor paste.

As can be seen from the above description, filling small via holes is a big challenge in manufacturing printed boards and ceramic substrates having multilayer wiring structures.

Flat panel displays including, e.g., liquid crystal display devices, EL devices, and electrophosphorescent devices use multilayer wiring structures having relatively loose DR. Because higher definition, faster response, and lower costs are important for the flat panel displays, techniques for manufacturing active matrix drive circuits at low cost are needed.

The active matrix drive circuits have been manufactured using LSI production techniques such as photolithography and dry etching. However, DRs of the metal wiring width and via holes are about 10-100 μm, and the LSI production techniques are the over specifications. For this reason, printing techniques, especially wiring processes using screen printing, are attracting interest as lower cost production methods.

Screen printing has been already put into practical use in producing printed wiring boards and ceramic substrates. The minimum line width of metal wires achieved with use of a conductive paste is 30-50 μm at the mass production level and 10-30 μm at the research level. Metal wiring of the active matrix drive circuits are expected to be realized by applying such a screen printing technique to production of the active matrix drive circuits.

However, the active matrix drive circuits also have multilayer wiring structures, and there are almost no techniques for printing a via hole with a diameter as small as about 50-100 μm in interlayer insulation films. Therefore, laser drilling and photolithography and dry etching are mainly used in research and development. Moreover, techniques for filling holes of 50-100 μm with conductive paste are not yet established as in the case of the printed wiring boards and the ceramic substrates.

Screen printing uses a screen mask with an emulsion pattern for printing via holes. The emulsion pattern formed on the screen mask corresponding to via holes is an isolated pattern. For example, there is about only one node in an emulsion pattern having a diameter of 50 μm formed on a screen mask of 380-590 meshes for high definition printing. Therefore, the emulsion pattern more easily comes off from the screen mask compared to conventional screen masks. Since the emulsion pattern may possibly come off during production of the screen mask, it is very difficult to produce the screen mask having no defects. Even if a defect-free screen can be produced, an emulsion pattern formed thereon easily comes off during printing. Thus, the life of the screen mask is much shorter compared to conventional screen masks.

As can be seen, manufacturing a defective-free and long-life screen mask for forming via holes as well as completely filling small via holes with a conductive paste are big technical problems in forming active matrix drive circuits by screen printing in the production process of the flat panel displays.

In recent years, TFTs (organic TFTs) using organic semiconductors have been attracting attention as switching elements of active matrix drive circuits of flat panel displays.

Although crystalline organic semiconductors such as pentacene have high mobility and are therefore promising in terms of high speed drive, the crystalline organic semiconductors are disadvantageous in that production of large-size and uniform semiconductors is difficult because of the use of vacuum deposition as well as in that they are easily oxidized because of relatively low ionization potential.

On the other hand, polythiophene, polyphenylene vinylene, and polyfluorene, etc., are suitable materials for the flat panel displays because these materials are soluble in an organic solvent and therefore deposition using spin coat methods or inkjet methods, which can produce large-size and uniform semiconductors, are applicable.

Especially, triaryl amine polymer is more readily soluble than other materials, and therefore easily adjusted when used in solution for spin coat methods and inkjet methods. Moreover, the triaryl amine polymer is not easily oxidized due to relatively high ionization potential, and therefore has high long-term reliability. For these reasons, development of the triaryl amine polymer has been intensively studied.

However, because the above organic semiconductor materials soluble in an organic solvent are easily solved in a developer and a remover used during photolithography, it is difficult to process such organic semiconductors by using photolithography. In addition, after the organic semiconductors are covered with an interlayer insulation film, the developer and the remover might penetrate through the interface between the organic semiconductors and the interlayer insulation film and dissolve the organic semiconductors during the process of forming via holes and pixel electrodes. It is therefore preferable to avoid photolithography.

Thus, a technique for printing a via hole having a diameter of about 50-100 μm in the interlayer insulation film covering the organic semiconductors is especially needed for producing the flat panel displays comprising the organic TFTs, but almost no such technique exists currently as described above.

Generally, the organic semiconductor materials that are soluble in an organic solution have low glass transition temperatures and therefore are easily damaged by heat and plasma. Also, if via holes are formed in the interlayer insulation films by laser drilling and dry etching, the Ion/Ioff and mobility of the organic TFTs are lowered. Therefore, the technique for printing a via hole in the interlayer insulation films is strongly desired in view of switching performance of the organic TFTs as well.

It is preferable to fill a via hole having a diameter of 50-100 μm with a conductive material by printing without using photolithography in the process of forming pixel electrodes as well, but such a technique is not yet established as described above.

Using the flat panel displays as electronic paper has been attracting attention. In many flat panel displays that maintain indications even if power is off, capacitors for accumulating charges are provided in parallel with TFTs. Therefore, there is a strong demand for a method of embedding small capacitors into active matrix drive circuits. Since the electronic paper requires lightness, slimness, rigidity, memory properties, film substrates having a thickness of 0.1-0.2 mm are used substrates of the active matrix drive circuits of the flat panel displays in place of glass substrates. Also, display elements having memory properties are used in the flat panel displays.

The film substrates shrink significantly in heating process. Therefore, if the TFTs are formed by dry etching, the substrates shrink when heated during the process of baking resists and forming films and cause misalignment between upper and lower layers. Especially, if a large-size substrate is used as in the active matrix drive circuits, a big alignment error between the upper and lower layers is caused near the substrate. In the worst case, a via hole is brought out of contact with a TFT and a pixel electrode and fails to connect the TFT to the pixel electrode, resulting in a defective bit. Therefore, the flat panel displays (electronic paper) using the film substrates cannot have as much pixels as the flat panel displays using the glass substrates.

Patent Document 5 entitled "FORMATION OF INTERLAYER INSULATING FILM IN MULTILAYER INTERCONNECTION" relates to contact holes of the same magnification sensors. According to a method disclosed in Patent Document 5, an interlayer insulation film is formed by screen printing, and a contact hole is formed therein. Then, an upper electrode is formed to fill the contact hole. Since the interlayer insulation film is formed by screen printing, the interlayer insulation film having a large flat surface can be formed. Accordingly, occurrence of disconnection of the upper electrode formed on the interlayer insulation film can be prevented.

<Patent Document 1> Japanese Patent Laid-Open Publication No. 2001-274547
<Patent Document 2> Japanese Patent Laid-Open Publication No. 2003-48303
<Patent Document 3> Japanese Patent Laid-Open Publication No. 11-87925
<Patent Document 4> Japanese Patent Laid-Open Publication No. 9-11624
<Patent Document 5> Japanese Patent Laid-Open Publication No. 61-13646

As described above, the problem with the related art methods of manufacturing multilayer wiring structures is that, if the via hole has a diameter as small as about 100 μm, air in the via hole is not completely removed by the conductive paste, so that unwanted air bubbles and voids remain in the filled via hole. Another problem is that, when the via hole has a smaller diameter, the conductive paste having higher viscosity is used, resulting in making the removal of the air bubbles and voids by vibration more difficult and incomplete. Using a squeegee having a small attack angle for filling via holes is well known in the art, and it seems to be difficult to fill via holes smaller than conventional via holes using the method of Patent Document 2. According to some methods, a cleaning process is added after the mechanical polishing process, which makes the manufacturing process more complex. Moreover, polishing machines and cleaning machines increase the cost of manufacturing equipment. In addition, a larger production space is required because the polishing machines and cleaning machines are needed to be isolated from other work spaces in order to prevent the dust from scattering.

It is preferable for the method of manufacturing a flat display comprising organic TFTs to avoid photolithography after covering the organic semiconductors with interlayer insulation film, because the organic semiconductor materials are easily dissolved in the developer and the remover used during photolithography.

Therefore, with reference to FIGS. 19A and 19B1-19B2, a technique for printing a via hole having a diameter of about 50-100 μm in an interlayer insulation film 23 covering a semiconductor and a technique for filling a via hole with a conductive material by a printing method are important. However, almost no such techniques are available now, and it is difficult to produce flat panel displays having high image quality. For now, only experimental production of displays using some materials is being carried out.

The organic semiconductor materials have low glass transition temperatures and therefore are easily damaged by heat and plasma. Also, if via holes are formed in the interlayer insulation films by laser drilling and dry etching, switching performance of the organic TFTs is lowered.

DISCLOSURE OF THE INVENTION

The present invention may solve at least one problem described above.

According to one aspect of the present invention, there is provided a method of manufacturing a multilayer wiring structure having smaller via holes in which a void hardly remains.

According to another aspect of the present invention, there is provided a method of manufacturing a multilayer wiring structure at lower cost.

According to a further aspect of the present invention, there is provided a method of manufacturing a multilayer wiring structure with small via holes having good contact resistance.

According to still another aspect of the present invention, there is provided a printed board or a ceramic substrate that includes a multilayer wiring structure with small via holes having good contact resistance.

According to still another aspect of the present invention, there is provided a flat panel display including an organic TFT with high image quality.

According to still another aspect of the present invention, there is provided a method of manufacturing a flat panel display including an organic TFT with high quality image.

According to still another aspect of the present invention, there is provided a flat panel display including an organic TFT with high quality image and memory properties.

According to still another aspect of the present invention, there is provided a method of manufacturing a flat panel display including an organic TFT with high quality image and memory properties.

According to still another aspect of the present invention, there is provided a method of manufacturing a multilayer wiring structure that comprises a step of forming a via post on a first metal wiring element; a step of printing an interlayer insulation film on the first metal wiring element, with use of a screen mask having a non-ejection area slightly larger than a head of the via post, such that the interlayer insulation film has an upper surface at a level lower than the head of the via post, while generally aligning the non-ejection area with the head of the via post; a step of curing the interlayer insulation film; and a step of forming a second metal wiring element in contact with the via post on the interlayer insulation film such that the first metal wiring element and the second metal wiring element are connected through the via post.

Accordingly, a via hole smaller than via holes formed with the related art methods, especially a via hole having a diameter of 100 µm or less, can be easily formed.

Since the interlayer insulation film is printed to have the upper surface at a level lower than the head of the via post, the via post extends outward beyond the surface of the interlayer insulation film without being completely covered with the interlayer insulation film. Therefore, good contact resistance is obtained by just forming the second metal wiring element directly on the via post.

The interlayer insulation film may be printed with an insulation paste using a screen mask having the non-ejection area slightly larger than the head of the via post, while the non-ejection area is generally aligned with the head of the via post. Therefore, an air gap between the via post and the insulation paste can be filled by properly controlling the viscosity of the insulation paste while leveling the insulation paste. Even if a small void remains between the via post and the interlayer insulation film after the leveling of the insulation paste, since the small void is present on the surface of the interlayer insulation film, the small void can be easily filled with a conductive paste in the process of printing the second metal wiring element. Accordingly, the frequency of the void remaining between the via post and the interlayer insulation film is lowered compared to the case using the related art methods, and long-term reliability of the multilayer wiring structure is improved.

According to still another aspect of the present invention, there is provided a method of manufacturing a multilayer wiring structure that comprises a step of forming a via post on a first metal wiring element; a step of printing an interlayer insulation film on the first metal wiring element by an inkjet method or a dispenser method such that the interlayer insulation film has an upper surface at a level lower than a head of the via post; a step of curing the interlayer insulation film; and a step of forming a second metal wiring element in contact with the via post on the interlayer insulation film such that the first metal wiring element and the second metal wiring element are connected through the via post.

Accordingly, a via hole smaller than via holes formed with the related art methods, especially a via hole having a diameter of 100 µm or less, can be easily formed.

Since the interlayer insulation film is printed to have the upper surface at the level lower than the head of the via post, the via post extends outward beyond the surface of the interlayer insulation film without being completely covered with the interlayer insulation film. Therefore, good contact resistance is obtained by just forming the second metal wiring element directly on the via post.

When pattern forming is not required, an insulation ink having relatively low viscosity can be used with the inkjet method or the dispenser method. When such an insulation ink is ejected except on the non-print area (area not to be printed) slightly larger than the outer circumference of the via post, the ejected insulation ink can easily fill the air gap between the via post and the insulation ink. Accordingly, the frequency of the void remaining between the via post and the interlayer insulation film is lowered compared to the case using the related art methods, and long-term reliability of the multilayer wiring structure is improved.

According to still another aspect of the present invention, there is provided a method of manufacturing a multilayer wiring structure that comprises a step of forming a via post on a first metal wiring element; a step of printing an interlayer insulation film on the first metal wiring element, with use of a screen mask having a non-ejection area slightly larger than a head of the via post, such that the interlayer insulation film has an upper surface at the level lower than the head of the via post, while generally aligning the non-ejection area with the head of the via post; a step of heating the interlayer insulation film at a temperature lower than a curing temperature of the interlayer insulation film; a step of curing the interlayer insulation film; and a step of forming a second metal wiring element in contact with the via post on the interlayer insulation film such that the first metal wiring element and the second metal wiring element are connected through the via post.

Since the viscosity of an insulation paste, which is to form the interlayer insulation film when cured, is lowered in the step of heating the interlayer insulation film at the temperature lower than the curing temperature of the interlayer insulation film, the insulation paste can fill an air gap between at the interface with the via post. Accordingly, the frequency of the void remaining between the via post and the interlayer insulation film is further lowered than with the above-described methods.

According to still another aspect of the present invention, there is provided a multilayer wiring structure that comprises an interlayer insulation film formed on a first metal wiring element; a second metal wiring element formed on the interlayer insulation film; and a via post formed on the first metal wiring element, the via post extending through the interlayer insulation film such that the first wiring element and the second wiring element are connected through the via post; wherein a head of the via post extends out of the interlayer insulation film. The head of the via post extending out of the interlayer insulation film may be covered with the second metal wiring element, or may extend through the second metal wiring element. Since the via post is in contact at the head or side surface thereof with the second metal wiring element, the contact resistance of the via post is low.

According to still another aspect of the present invention, there is provided a flat panel display that comprises an active matrix drive circuit including plural TFTs each including an organic semiconductor; an interlayer insulation film covering the TFTs; and plural pixel electrodes arranged in a matrix form on the interlayer insulation film; wherein at least one of a source electrode and a drain electrode of each TFT is connected to the corresponding pixel electrode through a via post having a head extending out of the interlayer insulation film; and a display device is formed on the active matrix drive circuit.

Since the via post is in contact at the head or the side surface thereof with the pixel electrode, contact resistance between the pixel electrode and the source or drain electrode connected through the via post is very low.

Therefore, if any one of TFTs is turned on by a certain combination of a select signal input to a gate electrode and a data signal input to the drain or source electrode, high potential can be efficiently induced in the pixel electrode connected to the turned-on organic TFT due to very small voltage loss.

According to still another aspect of the present invention, there is provided a method of manufacturing a flat panel display that comprises a step of forming a via post on at least one of a source electrode and a drain electrode of a TFT; a step of printing an interlayer insulation film, with use of a screen mask having a non-ejection area slightly larger than a head of the via post, such that the interlayer insulation film has an upper surface at the level lower than the head of the via post, while generally aligning the non-ejection area with the head of the via post; a step of curing the interlayer insulation film;

and a step of forming a pixel electrode in contact with the via post on the interlayer insulation film by a printing method.

According to still another aspect of the present invention, there is provided a method of manufacturing a flat panel display that comprises a step of forming a via post on at least one of a source electrode and a drain electrode of a TFT; a step of printing an interlayer insulation film by an inkjet method or a dispenser method such that the interlayer insulation film has an upper surface at the level lower than a head of the via post; a step of curing the interlayer insulation film; and a step of forming a pixel electrode in contact with the via post on the interlayer insulation film by a printing method.

According to still another aspect of the present invention, there is provided a flat panel display that comprises an active matrix drive circuit including plural TFTs each including an organic semiconductor; an interlayer insulation film covering the TFTs; plural lower electrodes and a dielectric film stacked in this order on the interlayer insulation film; and plural pixel electrodes arranged in a matrix form on the dielectric film; wherein at least one of a source electrode and a drain electrode of each TFT is connected to the corresponding pixel electrode through a via post having a head extending out of the dielectric film; the lower electrode, the dielectric film, and the corresponding pixel electrode form a capacitor; and a display device is formed on the active matrix drive circuit.

Since the lower electrode, the dielectric film, and the pixel electrode are stacked to form a capacitor, the potential of the pixel electrode can be maintained by the capacitor even when the corresponding TFT that has been on is turned off. Accordingly, the flat panel display has good memory properties.

In this flat panel display, the switching properties depend on the structure of the TFTs, while the charge holding capacity mainly depends on the capacitors. Therefore, the structure of the flat panel can be optimized by separately optimizing the structure of the TFTs and the structure of the capacitors.

According to still another aspect of the present invention, there is provided a method of manufacturing a flat panel display that comprises a step of forming a via post on at least one of a source electrode and a drain electrode of a TFT; a step of printing an interlayer insulation film with use of a first screen mask having a non-ejection area slightly larger than a head of the via post while generally aligning the non-ejection area with the head of the via post; a step of curing the interlayer insulation film; a step of forming a lower electrode on the interlayer insulation film by a printing method; a step of printing a dielectric interlayer insulation film with use of a second screen mask having a non-ejection area slightly larger than a head of the via post while generally aligning the non-ejection area with the head of the via post; a step of curing the dielectric film; and a step of forming a pixel electrode in contact with the via post on the dielectric film by a printing method; wherein film thicknesses of the interlayer insulation film, the lower electrode, and the dielectric film are adjusted such that the via post extends out of the dielectric film.

According to still another aspect of the present invention, there is provided a method of manufacturing a flat panel display that comprises a step of forming a via post on at least one of a source electrode and a drain electrode of a TFT; a step of printing an interlayer insulation film by an inkjet method or a dispenser method; a step of curing the interlayer insulation film; a step of forming a lower electrode on the interlayer insulation film by a printing method; a step of printing a dielectric interlayer insulation film with use of a second screen mask having a non-ejection area slightly larger than a head of the via post while generally aligning the non-ejection area with the head of the via post; a step of curing the dielectric film; and a step of forming a pixel electrode in contact with the via post on the dielectric film by a printing method; wherein film thicknesses of the interlayer insulation film, the lower electrode, and the dielectric film are adjusted such that the via post extends out of the dielectric film.

According to still another aspect of the present invention, there is provided a method of manufacturing a flat panel display that comprises a step of forming a via post on at least one of a source electrode and a drain electrode of a TFT; a step of printing an interlayer insulation film with use of a first screen mask having a non-ejection area slightly larger than a head of the via post while generally aligning the non-ejection area with the head of the via post; a step of curing the interlayer insulation film; a step of forming a lower electrode on the interlayer insulation film by a printing method; a step of printing a dielectric film by an inkjet method or a dispenser method; a step of curing the dielectric film; and a step of forming a pixel electrode in contact with the via post on the dielectric film by a printing method; wherein film thicknesses of the interlayer insulation film, the lower electrode, and the dielectric film are adjusted such that the via post extends out of the dielectric film.

According to still another aspect of the present invention, there is provided a method of manufacturing a flat panel display that comprises a step of forming a via post on at least one of a source electrode and a drain electrode of a TFT; a step of printing an interlayer insulation film by an inkjet method or a dispenser method; a step of curing the interlayer insulation film; a step of forming a lower electrode on the interlayer insulation film by a printing method; a step of printing a dielectric film by an inkjet method or a dispenser method; a step of curing the dielectric film; and a step of forming a pixel electrode in contact with the via post on the dielectric film by a printing method; wherein film thicknesses of the interlayer insulation film, the lower electrode, and the dielectric film are adjusted such that the via post extends out of the dielectric film.

According to still another aspect of the present invention, there is provided a multilayer wiring structure with a small internal capacitor.

According to still another aspect of the present invention, there is provided a method of a manufacturing multilayer wiring structure with a small internal capacitor without adding a polishing process or a cleaning process.

According to still another aspect of the present invention, there is provided an element substrate comprising a multilayer wiring structure with a small internal capacitor.

According to still another aspect of the present invention, there is provided a flat panel display device comprising a multilayer wiring structure with a small internal capacitor.

According to still another aspect of the present invention, there is provided a multilayer wiring structure that comprises a first metal wiring element, an interlayer insulation film formed on the first metal wiring element, a second metal wiring element formed on the interlayer insulation film, and an intermediate body extending through the interlayer insulation film and connected to the first and second metal wiring elements, wherein the intermediate body includes an end portion extending beyond a surface of the interlayer insulation film at the second metal wiring element side.

According to still another aspect of the present invention, there is provided an element substrate that comprises an insulation substrate and the above-described multilayer wiring structure formed on the insulation substrate.

According to still another aspect of the present invention, there is provided a flat panel display that comprises the above-described multilayer wiring structure.

According to still another aspect of the present invention, there is provided a method of manufacturing a multilayer wiring structure, the method comprising a first step of forming a first metal wiring element on a substrate by a screen printing method, a second step of forming an intermediate body on the first metal wiring element by the screen printing method, a third step of forming an interlayer insulation film on the first metal wiring element by the screen printing method, the interlayer insulation film having a film thickness less than a height of the intermediate body, and a fourth step of forming a second metal wiring element on the intermediate body and the interlayer insulation film by a screen printing method.

According to some of the above-descried aspects of the present invention, the first metal wiring element, the intermediate body, the interlayer insulation film, and the second metal wiring element are formed in this order.

Therefore, the multilayer wiring structure can be formed without using a mechanical polishing process and a cleaning process.

BRIEF DESCRIPTION OF THE DRAWINGS

FIG. 4 is a table showing a result of a measurement of contact resistance after forming a double layer wiring structure according to an embodiment of the present invention;

FIG. 11 is a table showing an evaluation result of Embodiment 12;

FIGS. 12A and 20B illustrate a flat panel display according to Embodiment 13 of the present invention;

FIG. 14 is a table showing an evaluation result of Embodiment 18;

FIGS. 19A and 19B1-19B4 illustrate a via hole and a via post according to an embodiment of the present invention;

FIGS. 21A-21E illustrate a method of manufacturing the multilayer wiring structure of FIG. 20;

FIGS. 23A-23C illustrate Step C1 of FIG. 21C in greater detail;

FIGS. 25A-25F illustrate a method of manufacturing the multilayer wiring structure of FIG. 24;

FIGS. 27A-27F illustrate a method of manufacturing the multilayer wiring structure of FIG. 26;

BEST MODE FOR CARRYING OUT THE INVENTION

The following description provides exemplary embodiments of the present invention with reference to the accompanying drawings.

Embodiment 1

FIGS. 1A-1E illustrate a method of manufacturing a multilayer wiring structure according to Embodiment 1 of the present invention.

Figure 1A:
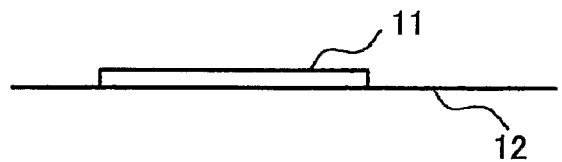
FIGS. 1A-1E illustrate a method of manufacturing a multilayer wiring structure according to Embodiment 1 of the present invention.

In the step shown in FIG. 1A, a first metal wiring element 11 is formed on a glass substrate 12 using a screen printing method. A conductive paste used herein for printing is an Ag paste that contains Ag particles, acrylic resin, carbitol acetate, etc., and has a viscosity of 100-220 Pa·s. It is to be noted that the viscosity measurement is performed at 10 rpm using Brookfield HBT No. 14 spindle at room temperature. These conditions are applied to other viscosity measurements that follow. A screen mask used herein is a stainless mesh No. 500 with an emulsion thickness of 8 μm. The first metal wiring element 11 having a width of 50 μm is printed with the Ag paste, using the above screen mask and a squeegee 14 having a rubber hardness of 70. The land diameter of a via hole through which the first metal wiring element 11 and a second metal wiring element 19 are connected is 150 μm.

After printing the first metal wiring element 11 with the Ag paste, the Ag paste is cured by heating in an oven at 180° C. for 30 minutes to finish the first metal wiring element 11.

Figure 1B:
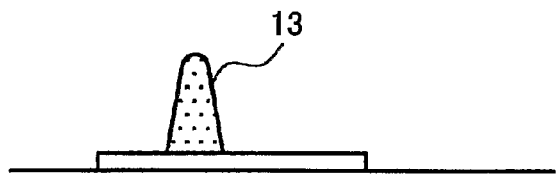

In the step shown in FIG. 1B, a via post 13 having a diameter of 100 μm is formed on a land of the first metal wiring element 11 using the screen printing method. A conductive paste used herein for printing is an Ag paste that contains Ag particles, acrylic resin, butyl carbitol, etc., and has a viscosity of 150-300 Pa·s. A screen mask used herein is a stainless mesh No. 500 with an emulsion thickness of 10 μm. This screen mask has an ejection hole with a diameter of 100 μm that is not sealed by the emulsion. An alignment mark of this screen mask is aligned with an alignment mark of the first metal wiring element 11. Then, the via post 13 is printed with the Ag paste using a squeegee 14 having a rubber hardness of 70. Then, the Ag paste is cured by heating in an oven at 180° C. for 30 minutes to finish the via post 13. The via post 13 has a tapered shape, and has a head size of 50-60 μm and a height of 11-13 μm.

Figure 1C:
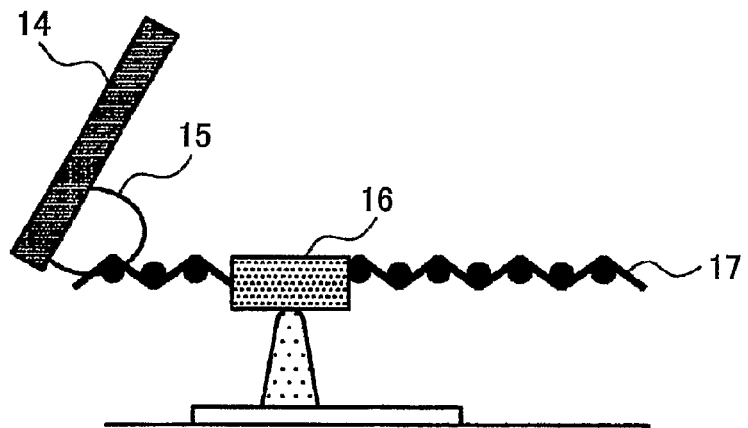
Figure 2:
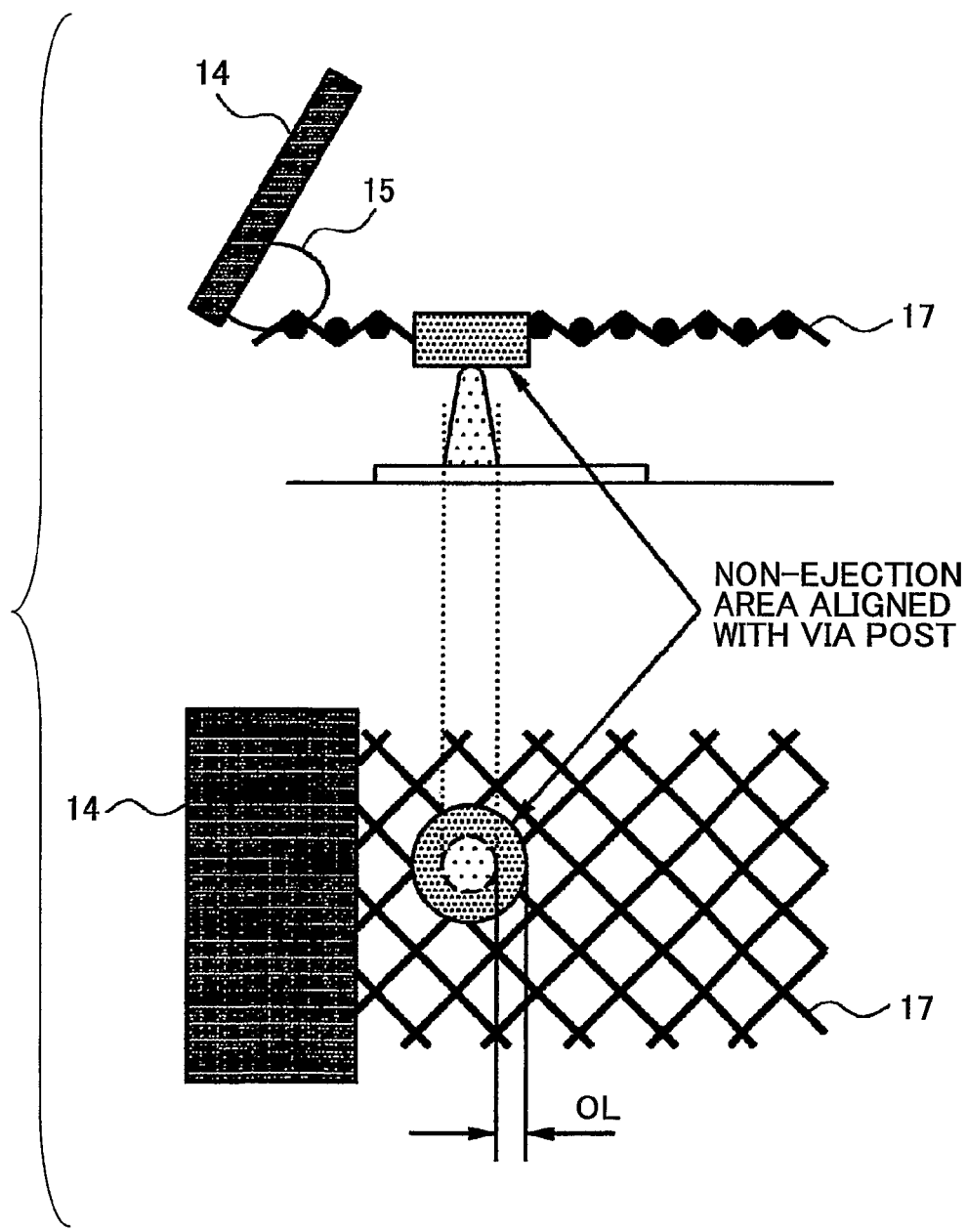
FIG. 2 illustrates a screen mask for use in a process for printing an interlayer insulation film according to an embodiment of the present invention.

In the step shown in FIG. 1C, an interlayer insulation film 18 is formed on the first metal wiring element 11 using an off-contact screen printing method. An insulation paste 15 used herein for printing includes a silica filler, cresol novolac epoxy resin, epoxy resin, and butyl cellosolve acetate, etc., and has a viscosity of 90-100 Pa·s. A screen mask 17 used herein is a stainless mesh No. 640 with an emulsion thickness of 5 μm. This screen mask 17 has a non-ejection area 16 with a diameter of 130 μm sealed by the emulsion. An alignment mark of the screen mask 17 is aligned with an alignment mark at the same layer as the via post 13 on the substrate, so that the non-ejection area 16 is positioned on the head of the via post 13. Since a printing machine used herein has an alignment accuracy of ±10 μm, the head of the via post 13 formed on the first metal wiring element 11 is located completely within the non-ejection area 16 of the screen mask 17 even with an alignment error. The design rule of a distance OL (see FIG. 2) between the via post 13 (at the bottom) and the non-ejection area 16 is 15 μm.

Figure 1D:
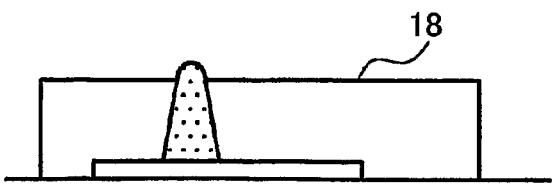

After the screen mask 17 is positioned, the insulation paste 15 is printed using a squeegee 14 having a rubber hardness of 60 in the step shown in FIG. 1D. In this step, the insulation paste 15 is formed to have the upper surface at the level lower than the head of the via post 13 by properly controlling the mesh, rubber hardness, printing pressure, attack angle, etc. In this embodiment, the print thickness of the insulation paste 15 is 6-8 μm, and the head of the via post 13 extends outward beyond the surface of the printed insulation paste 15 by 3-5 μm.

Figure 3A:
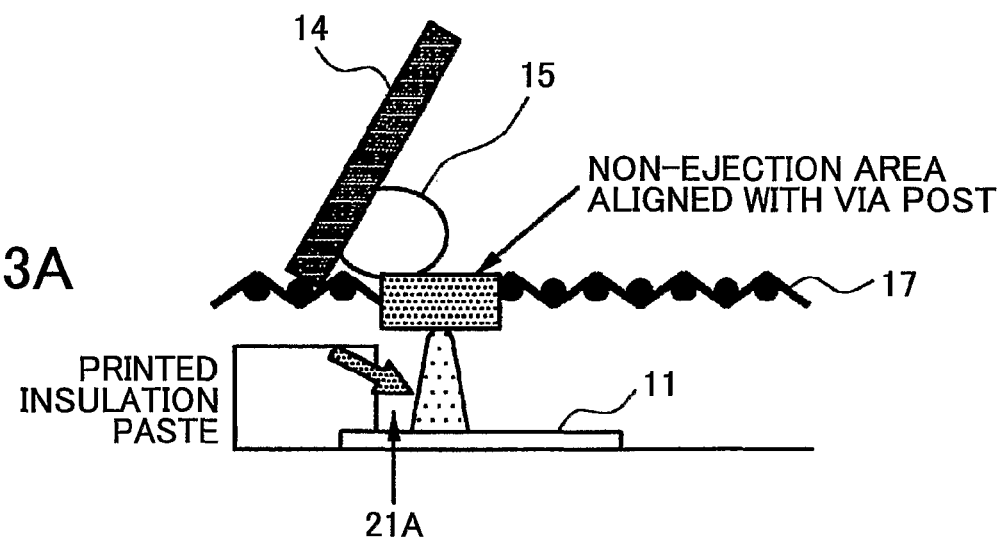
FIGS. 3A-3C are schematic illustrations showing a process of filling a void between a via post and an interlayer insulation film.
Figure 3B:
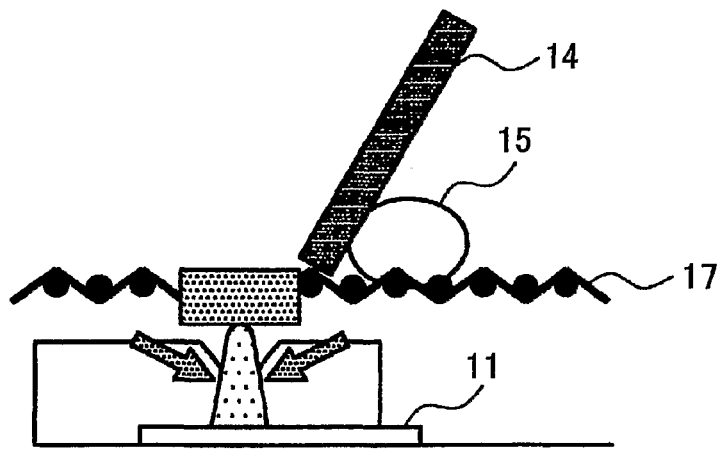
Figure 3C:
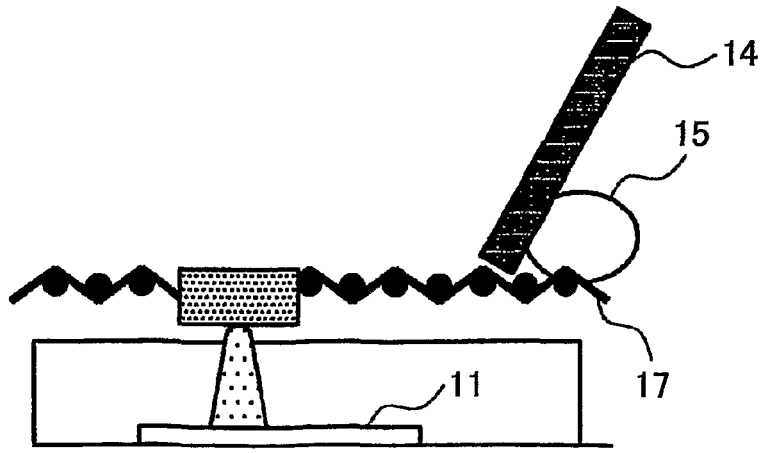

During the off-contact printing, high shear stress is exerted on the insulation paste 15 when the screen mask 17 is separated from the substrate 12. Then, the viscosity of the insulation paste 15 is lowered, so that the insulation paste 15 is leveled. If the insulation paste 15 has a suitable viscoelasticity, the insulation paste 15 is fluidized upon separation of screen mask from the substrate and fills a void between the insulation paste 15 and the via post 13 (see FIGS. 3A-3C).

The insulation paste 15 used in this embodiment has a TI, which is an indication of viscoelasticity, of 1.5-4.5 (measured at 10 rpm and 50 rpm using Brookfield HBT No. 14 spindle).

In some cases, the small void 21A remains between the interlayer insulation film 18 and the via post 13 without being filled with the fluidized insulation paste 15. However, the small void 21A is filled with a conductive paste in the next step of printing the second metal wiring element 19. Accordingly, the frequency at which the void 21A remains between the via post 13 and the interlayer insulation film 18 is lowered compared to the case using the related art methods. The reason is described below in greater detail.

The insulation paste 15 is cured by heating in an oven at 150° C. for 30 minutes to finish the interlayer insulation film 18. Because the volume of the insulation paste 15 after the curing process is reduced by about 20-30%, the head of the via post 13 extends outward beyond the surface of the interlayer insulation film 18 by 5-7 μm.

Figure 1E:
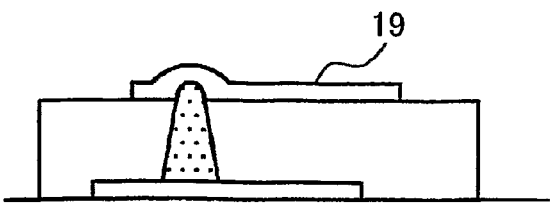

In the step shown in FIG. 1E, the second metal wiring element 19 is formed on the surface of the interlayer insulation film 18 using the screen printing method. A land of the second metal wiring element 19 is positioned on the head of the via post 13 extending out of the interlayer insulation film 18.

The conductive paste used herein for printing is the same paste as the Ag paste used for the first metal wiring element 11, which contains Ag particles, acrylic resin, carbitol acetate, etc., and has a viscosity of 100-220 Pa·s. A screen mask used herein is a stainless mesh No. 500 with an emulsion thickness of 8 μm. An alignment mark of this screen mask is aligned with an alignment mark at the same layer as the via post 13 on the substrate, so that the land of the second metal wiring element 19 is positioned on the head of the via post 13.

The second metal wiring element 19 having a width of 100 μm is printed with the above Ag paste, using the above screen mask and a squeegee 14 having a rubber hardness of 70. The diameter of the land connected to the via post 13 is 150 μm.

As mentioned above, in the process of printing the interlayer insulation film 18, the small void 21A might remain without being completely filled during the leveling of the insulation paste 15. However, the void 21A is present on the surface of the interlayer insulation film 18 and therefore can be easily filled with the conductive paste in the process of printing the second metal wiring element 19. Therefore, the frequency of the void 21A remaining between the via post 13 and the interlayer insulation film 18 is lowered compared to the related art structures.

After printing the second metal wiring element 19 with the Ag paste, the Ag paste is cured by heating in an oven at 180° C. for 30 minutes to finish the second metal wiring element 19. The film thickness of the second metal wiring element 19 is about 8 μm, and the head of the via post 13 extending out of the interlayer insulation film 18 is covered with the second metal wiring element 19.

The contact chain of the first metal wiring element 11 and the second metal wiring element 19 connected through the via post 13 in the resulting double layer wiring structure was evaluated, and it was found that the contact resistance of the via post 13 is 10 Ω or less, which is considered good.

Also, one thousand via posts 13 were randomly selected and observed with a supersonic microscope. The result showed that only one via post 13 has the void 21A at the interface with the interlayer insulation film 18. It is found from this result that the void 21A between the insulation paste 15 and the via post 13 is efficiently filled with use of the manufacturing method of this embodiment.

As described above, according to the manufacturing method of Embodiment 1, the via post 13 is formed on the first metal wiring element 11, and then the interlayer insulation film 18 and the second metal wiring element 19 are formed in this order. Thus, the first metal wiring element 11 and the second metal wiring element 19 are connected through a via hole (corresponding to the via post 13 in Embodiment 1). Generally, screen printing is more suitable for dot printing than for hole printing. At present, although it is difficult to print a hole having a diameter as large as 100 μm, it is easy to print a dot having a diameter as small as 50 μm. In Embodiment 1, since the via post 13 having a dot shape is used to form a via hole, a via hole smaller than via holes formed with the related art methods, especially a via hole having a diameter of 100 μm or less, can be easily formed.

Since the interlayer insulation film 18 is printed to have the upper surface at a level lower than the head of the via post 13, the via post 13 extends outward beyond the surface of the interlayer insulation film 18 without being completely covered with the interlayer insulation film 18. Therefore, good contact resistance is obtained by just forming the second metal wiring element 19 directly on the via post 13. Furthermore, the manufacturing process is simplified because the mechanical polishing process, which is necessary for the method disclosed in Patent Document 3, can be excluded.

Moreover, since the head of the via post 13 extending out of the interlayer insulation film 18 is connected to the second metal wiring element 19, lower resistance contact can be easily obtained compared to the related art method of filling via holes with a conductive paste.

The insulation paste 15 is printed using the screen mask 17 having the non-ejection area 16 slightly larger than the head of the via post 13 while the non-ejection area 16 is generally aligned with the head of the via post 13. Therefore, the void 21A between the via post 13 and the insulation paste 15 can be filled during the leveling by properly controlling the viscoelasticity of the insulation paste 15. Even if the small void 21A remains between the via post 13 and the interlayer insulation film 18 after the insulation paste leveling, since the small void 21A is present on the surface of the interlayer insulation film 18, the small void 21A can be easily filled with the conductive paste in the process of printing the second metal wiring element 19. Therefore, the frequency of the void 21A remaining between the via post 13 and the interlayer insulation film 18 is lowered compared to the case using the related art methods, and long-term reliability of the multilayer wiring structure is improved.

According to the manufacturing method of Embodiment 1, since the first and second metal wiring elements 11 and 19, the via post 13, and the interlayer insulation film 18 are all formed using the screen printing method, which is a low cost production process, a multilayer wiring structure with a small via hole can be manufactured at low cost.

Although the screen printing method is used in all the printing steps in Embodiment 1, metal wiring elements can be formed at relatively low cost with use of an inkjet method or a dispenser method. Multilayer wiring structures with small via holes (via posts) can be formed. Therefore, the first and second metal wiring elements 11 and 19 can be formed with the inkjet method and the dispenser method.

Although Ag paste is used for forming the first and second metal wiring elements 11 and 19 and the via post 13 in Embodiment 1, other commonly used conductive pastes, such as Cu paste, Ni Paste, Pd paste, carbon resin, and conductive polymer resin, may alternatively be used.

Although the insulation paste 15 including cresol novolac epoxy resin and epoxy resin is used in Embodiment 1, other insulation pastes including polyimide resin, phenolic resin, acrylic resin, polyvinyl resin, etc., may be used as the insulation paste 15. Further, the insulation paste 15 may be thermocuring type or may be photocuring type. If a photocuring insulation paste is used, the interlayer insulation film 18 is cured not by heating but by irradiation of ultraviolet rays.

Although the method of forming the double layer wiring structure is illustrated in Embodiment 1, multilayer wiring structures having three or more layers can be formed by repeating the above-described steps.

Embodiment 2

The following describes Embodiment 2, again with reference to FIGS. 1A-1E.

In the same way as in Embodiment 1, a first metal wiring element 11 (having a width of 50 μm and a land diameter of 150 μm) is formed on a glass substrate 12, and then a via post 13 is formed on a land of the first metal wiring element 11. The via post 13 has a head size of 50-60 μm and a height of 11-13 μm.

After that, an insulation paste 15 is printed by screen printing and cured by heating so as to form an interlayer insulation film 18. A screen mask 17 used herein has a non-ejection area 16. The design rule of a distance OL between the non-ejection area 16 and the via post 13 with one side is in a range of 10-50 μm. An insulation paste 15 and a squeegee 14 used in Embodiment 2 are the same as those in Embodiment 1.

Then, in the same way as in Embodiment 1, a second metal wiring element 19 (having a width of 100 μm and a land diameter of 150 μm) is formed on the surface of the interlayer insulation film 18 using a screen printing method. A land of the second metal wiring element 19 is positioned on the head of the via post 13 extending out of the interlayer insulation film 18.

The design rule of the distance OL, which is in a range of 10-50 μm, is selected based on the following evaluation results.

Double layer wiring structures were prepared with the above described method, wherein the distance OL between the non-ejection area 16 and the via post 13 with one side was changed in a range of 0-100 μm for evaluation purposes. The contact resistances of the double layer wiring structures were measured in the same manner as in Embodiment 1. Also, one thousand via posts 13 were randomly selected and observed with a supersonic microscope.

The table of FIG. 4 shows the evaluation results. In the table of FIG. 4, ○ indicates that the contact resistance is less than 10 Ω, which is considered as a desired range, or, in other words, good contact resistance is obtained; Δ indicates that the contact resistance is increased; and X indicates conduction failure.

When the distance OL was in the range of 10-50 μm, the contact resistance was in the desired range, and almost no void was found.

However, when the distance OL was in a range of 0-5 μm, the contact resistance was increased in some of the double layer wiring structures. When the distance OL was in a range of 60-100 μm, the contact resistance was in the desired range, but voids were found in 3-20 out of the one thousand via holes.

From the above results, the distance OL in a range of 10-50 μm is found to be preferable and selected for the manufacturing method of this embodiment. However, since the double layer wiring structure in which the diameter of the via hole 13 is 100 μm and the distance OL is in a range of 60-100 μm achieves good contact resistance, the distance OL may be in the range of 60-100 μm in Embodiment 2 if the size of the void satisfies the specification of the target multilayer wiring structure.

Embodiment 3

The following describes Embodiment 3, again with reference to FIGS. 1A-1E.

In the same way as in Embodiment 1, a first metal wiring element 11 (having a width of 50 μm) is formed. Then, a via post 13 having a diameter of 50 μm is formed on a land of the first metal wiring element 11 using the dispenser method. A conductive paste used herein for printing is an Ag paste that contains Ag particles, acrylic resin, butyl carbitol, etc., and has a viscosity of 300-600 Pa·s.

More specifically describing the above process, the substrate 12 is absorbed on a substrate stage of a dispenser by vacuum, and an alignment mark of the first metal wiring element 11 is read by a CCD camera to find the position of the substrate 12. Then, a printing pattern is input to the dispenser, and the Ag paste is applied to the land of the first metal wiring element 11 so as to form the via post 13. The Ag paste is cured by heating in an oven at 250° C. for 20 minutes to finish the via post 13. The via post 13 is substantially in a vertical form, and has a head size of 45-50 μm and a height of 4-5 μm.

Then, an interlayer insulation film 18 is formed on the first metal wiring element 11 using the off-contact screen printing method. An insulation paste 15 used herein for printing includes a silica filler, soluble polyimide resin, NMP, etc., and has a viscosity of 10-20 Pa·s. A screen mask 17 used herein is a stainless mesh No. 640 with an emulsion thickness of 1 μm or less. This screen mask 17 has a non-ejection area 16 with a diameter of 90 μm sealed by the emulsion. In Embodiment 3, as in Embodiment 1, an alignment mark of the screen mask 17 is aligned with an alignment mark at the same layer as the via post 13 on the substrate 12, so that the non-ejection area 16 is positioned on the head of the via post 13.

After the screen mask 17 is positioned, the insulation paste 15 is printed using a squeegee 14 having a rubber hardness of 70. The print thickness of the insulation paste 15 is 2-3 μm such that the head of the via post 13 extends outward beyond the surface of the printed insulation paste 15 by 2-3 μm.

The insulation paste 15 is cured by heating in an oven at 200° C. for 30 minutes to finish the interlayer insulation film 18. The volume of the insulation paste 15 after the curing process is reduced by about 20-30%, so that the head of the via post 13 after the curing process remains extending outward beyond the surface of the interlayer insulation film 18.

Then, in the same way as in Embodiment 1, a second metal wiring element 19 (having a width of 50 μm and a land diameter of 120 μm) is formed on the surface of the interlayer insulation film 18 using the screen printing method. A land of the second metal wiring element 19 is positioned on the head of the via post 13 extending out of the interlayer insulation film 18. A conductive paste used herein for printing is the same Ag paste as used for the first metal wiring element 11.

After printing the second metal wiring element 19 with the Ag paste, the Ag paste is cured by heating in an oven at 180° C. for 60 minutes to finish the second metal wiring element 19. The film thickness of the second metal wiring element 19 is about 8 μm, and the head of the via post 13 extending out of the interlayer insulation film 18 is covered with the second metal wiring element 19.

In Embodiment 3, the contact resistance and the via hole shape were evaluated in the same manner as in Embodiment 1, and it was found that even when the diameter of the via hole 13 is 50 μm, good contact resistance was obtained and almost no void was found between the via post 13 and the interlayer insulation film 18.

It was found from the above results that even when the via post 13 is formed with the dispenser method, a multilayer wiring structure having the via hole 13 completely filled with the conductive paste and having good contact resistance can be formed.

Embodiment 4

The following describes Embodiment 4, again with reference to FIGS. 1A-1E.

In the same way as in Embodiment 1, a first metal wiring element 11 (having a width of 50 μm and a land diameter of 100 μm) is formed on a polycarbonate substrate 12, and plural pairs of alignment marks are formed on each end of the substrate 12. Then, a via post 13 having a diameter of 70 μm is formed on a land of the first metal wiring element 11 using the inkjet method. A conductive ink used herein for printing is a nano Ag ink (Harima Chemicals, Inc.). The ink is ejected onto the same spot two or more times so as to form the via post 13 having a desired thickness because the via post 13 having the desired thickness cannot be formed by one ejection.

More specifically describing the above process, the polycarbonate substrate 12 is absorbed on a substrate stage of an inkjet machine by vacuum, and an arbitrary pair of alignment marks of the first metal wiring element 11 are read by a CCD camera to find the position of the substrate 12. Then, a printing pattern is input to the inkjet machine, and the nano Ag ink is applied to the land of the first metal wiring element 11 so as to form the via post 13 while sequentially reading the pairs of alignment marks formed on each end of the substrate 12, feeding back the positions of the alignment marks to the inkjet machine, and correcting the position of the substrate stage.

The nano Ag ink is cured by heating in an oven at 180° C. for 60 minutes to finish the via post 13. The via post 13 has a tapered shape, and has a head size of 30-40 μm and a height of 3-4 μm.

Then, an interlayer insulation film 18 is formed on the first metal wiring element 11 using the off-contact screen printing method. An insulation paste 15 used herein for printing includes a silica filler, polyvinyl alcohol resin, butoxyethanol, etc., and has a viscosity of 10-20 Pa·s. A screen mask 17 used herein is a stainless mesh No. 640 with an emulsion thickness of 1 μm or less. This screen mask 17 has a non-ejection area 16 with a diameter of 110 μm sealed by the emulsion. In this embodiment, as in Embodiment 1, an alignment mark of the screen mask 17 is aligned with an alignment mark at the same layer as the via post 13 on the substrate, so that the non-ejection area 16 is positioned on the head of the via post 13.

After the screen mask 17 is positioned, the insulation paste 15 is printed using a squeegee 14 having a rubber hardness of 70. The print thickness of the insulation paste 15 is 2-3 μm such that the head of the via post 13 extends outward beyond the surface of the printed insulation paste 15.

The insulation paste 15 is cured by heating in an oven at 150° C. for 30 minutes to finish the interlayer insulation film 18. The volume of the insulation paste 15 after the curing process is reduced by about 20-30%, so that the head of the via post 13 after the curing process remains extending outward beyond the surface of the interlayer insulation film 18.

Then, in the same way as in Embodiment 1, a second metal wiring element 19 (having a width of 50 μm and a land diameter of 100 μm) is formed on the surface of the interlayer insulation film 18 using the screen printing method. A land of the second metal wiring element 19 is positioned on the head of the via post 13 extending out of the interlayer insulation film 18. A conductive paste used herein for printing is the same Ag paste as used for the first metal wiring element 11.

After printing the second metal wiring element 19 with the Ag paste, the Ag paste is cured by heating in an oven at 150° C. for 60 minutes to finish the second metal wiring element 19. The film thickness of the second metal wiring element 19 is about 8 μm, and the head of the via post 13 extending out of the interlayer insulation film 18 is covered with the second metal wiring element 19.

In this embodiment, the contact resistance and the via hole shape were evaluated in the same manner as in Embodiment 1, and it was found that even when the diameter of the via hole 13 is 70 μm, good contact resistance was obtained and almost no void was found. It was found from the above results that even when the via post 13 is formed with the inkjet method, a multilayer wiring structure having the via hole 13 completely filled with the conductive paste and having good contact resistance can be formed.

The inkjet machine forms the via posts 13 one by one by ejecting ink droplets from a head. In this embodiment, since the plural pairs of alignment marks are formed on each end of the substrate, the via posts 13 can be formed while sequentially reading the pairs of alignment marks and correcting the position of the substrate 12 each time the alignment marks are read. Therefore, the via posts 13 and the first metal wiring element 11 can be more accurately aligned.

If a film substrate is used as the substrate 12, the screen printing method that forms the via posts 13 all at once causes a big alignment error within the substrate 12 because the substrate 12 shrinks due to heat during the heat curing process of the first metal wiring element 11. Especially, in the case of a large-size substrate 12, the via posts 13 might be located out of the land of the first metal wiring element 11. However, with use of the inkjet machine, the via posts 13 can be formed while performing position correction with reference to the plural pairs of alignment marks as in this embodiment. Therefore, alignment is correctly performed within all area of the substrate 12, and the multilayer wiring structure having little alignment error between the first metal wiring element 11 and the via posts 13 can be formed.

Embodiment 5

FIGS. 5A-5E illustrate a method of manufacturing a multilayer wiring structure according to Embodiment 5 of the present invention.

Figure 5A:
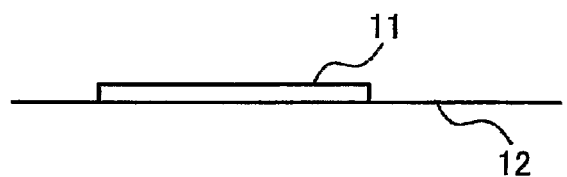
FIGS. 5A-5E illustrate a method of manufacturing a multilayer wiring structure according to Embodiment 5 of the present invention.
Figure 5B:
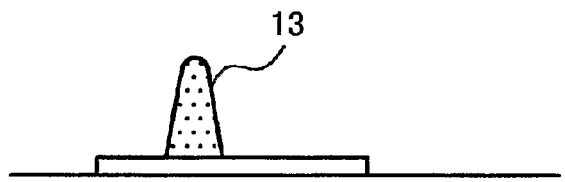

In the steps shown in FIGS. 5A and 5B, in the same way as in Embodiment 1, a first metal wiring element 11 (having a width of 50 μm and a land diameter of 150 μm) is formed on a glass substrate 12 using the screen printing method, and then a via post 13 is formed on a land of the first metal wiring element 11. The via post 13 has a head size of 50-60 μm and a height of 11-13 μm.

Figure 5C:
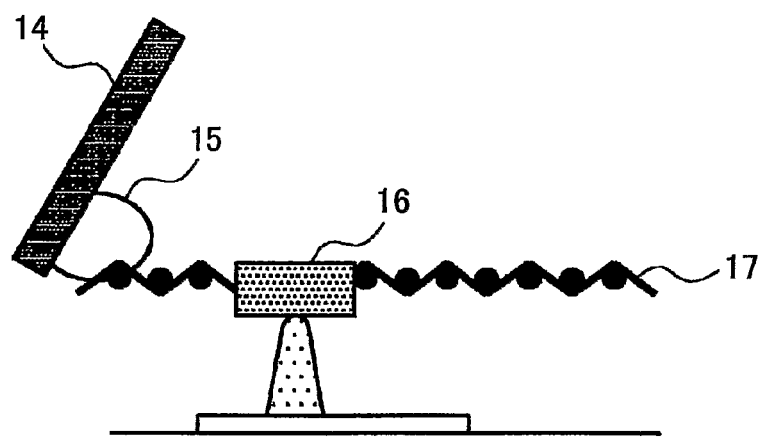
Figure 5D:
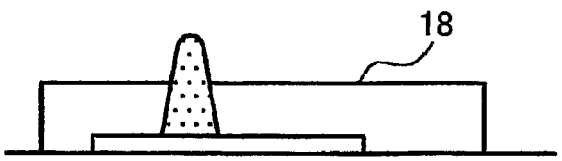

In the steps shown in FIGS. 5C and 5D, as in Embodiment 1, an insulation paste 15 having a thickness in a range of 6-8 μm is printed by screen printing, and then cured by heating so as to form an interlayer insulation film 18. A screen mask 17 used herein has a non-ejection area 16 at a distance OL from the via post 13 equaling 15 μm.

Figure 5E:
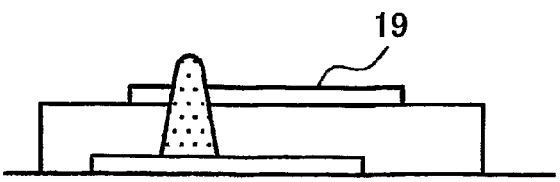

In the step shown in FIG. 5E, a second metal wiring element 19 (having a width of 100 μm and a land diameter of 150 μm) is formed on the surface of the interlayer insulation film 18 using the inkjet method. A conductive ink used herein is a nano Ag ink with a viscosity of 10-15 cP in which nano-sized Ag particles surrounded by a dispersing agent are dispersed in an organic solvent.

More specifically describing the above process, the substrate 12 is positioned while reading an alignment mark of the first metal wiring element 11 by a CCD camera of an inkjet machine. Then the nano Ag ink is printed. The nano Ag ink is cured by heating in an oven at 200° C. for 30 minutes to finish the second metal wiring element 19.

As the film thickness of the second metal wiring element 19 is 0.5 μm, the via post 13 extending beyond the surface of the interlayer insulation film 18 extends through the second metal wiring element 19.

In this embodiment, the contact resistance was evaluated in the same manner as in Embodiment 1, and it was found that the contact resistance of the via post 13 was 10 Ω or less. In other words, good contact resistance was obtained. According to the manufacturing method of Embodiment 5, since the via post 13 extends through the second metal wiring element 19, the via post 13 is connected at the side surface to the second metal wiring element 19. Therefore, a multilayer wiring structure having good resistance can be formed.

Embodiment 6

FIGS. 6A-6F illustrate a method of manufacturing a multilayer wiring structure according to Embodiment 6 of the present invention.

Figure 6A:
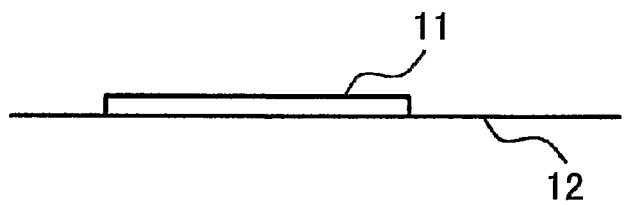
FIGS. 6A-6F illustrate a method of manufacturing a multilayer wiring structure according to Embodiment 6 of the present invention.

In the step shown in FIG. 6A, a first metal wiring element 11 is formed on a glass substrate 12 using a screen printing method. A conductive paste used herein for printing is an Ag paste that contains Ag particles, acrylic resin, carbitol acetate, etc., and has a viscosity of 150-250 Pa·s. A screen mask used herein is a stainless mesh No. 500 with an emulsion thickness of 5 μm. The first metal wiring element having a width of 50 μm is printed with the Ag paste, using the screen mask and a squeegee 14 having a rubber hardness of 70. The land diameter of a via hole through which the first metal wiring element 11 and a second metal wiring element 19 are connected is 100 μm. After printing the first metal wiring element 11 with Ag paste, the Ag paste is cured by heating in an oven at 200° C. for 30 minutes to finish the first metal wiring element 11.

Figure 6B:
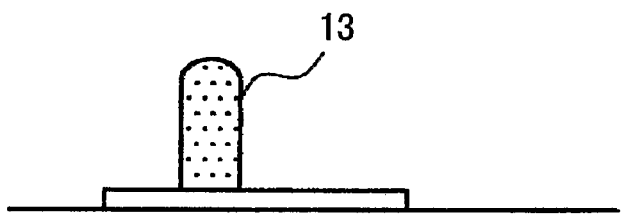

In the step shown in FIG. 6B, a via post 13 having a diameter of 75 μm is formed on a land of the first metal wiring element 11 using a contact screen printing method. A conductive paste used herein for printing is an Ag paste that contains Ag particles, acrylic resin, butyl carbitol, etc., and has a viscosity of 250-420 Pa·s. A screen mask used herein is a Ni metal mask having a thickness of 20 μm. An ejection hole with a diameter of 75 μm is formed in this screen mask.

In a chamber, an alignment mark of the screen mask is aligned with an alignment mark of the first metal wiring element 11, and the Ag paste is printed using a squeegee 14 having a rubber hardness 70. Then, an air bag is inflated in the chamber. Thus, the pressure against the screen mask is increased so as to force the Ag paste to be ejected from the screen mask. Then, the Ag paste is cured by heating in an oven at 200° C. for 30 minutes to finish the via post 13. The via post 13 is substantially in a vertical form, and has a head size of 65-75 μm and a height of 8-9 μm.

Figure 6C:
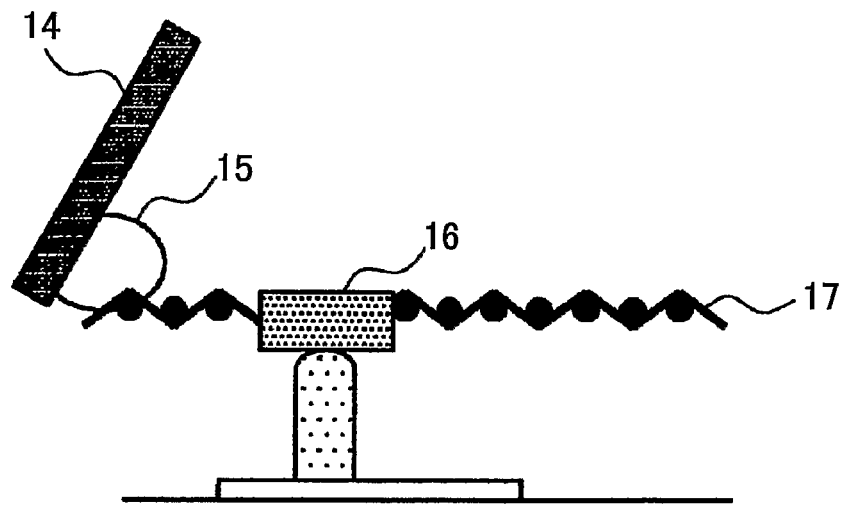

In the step shown in FIG. 6C, an interlayer insulation film 18 is formed on the first metal wiring element 11 using the off-contact screen printing method. An insulation paste 15 used herein for printing includes a silica filler, soluble polyimide resin, NMP, etc., and has a viscosity of 50-60 Pa·s. A screen mask 17 used herein is a stainless mesh No. 640 with an emulsion thickness of 1 μm or less. This screen mask 17 has a non-ejection area 16 with a diameter of 100 μm sealed by the emulsion. An alignment mark of the screen mask 17 is aligned with an alignment mark at the same layer as the via post 13 on the substrate, so that the non-ejection area 16 is positioned on the head of the via post 13.

Figure 6D:
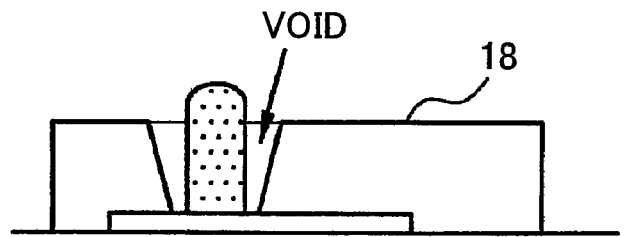

After the screen mask 17 is positioned, the insulation paste 15 is printed using a squeegee 14 having a rubber hardness of 60 in the step shown in FIG. 6D. The print thickness of the insulation paste 15 is 5-6 μm.

Figure 6E:
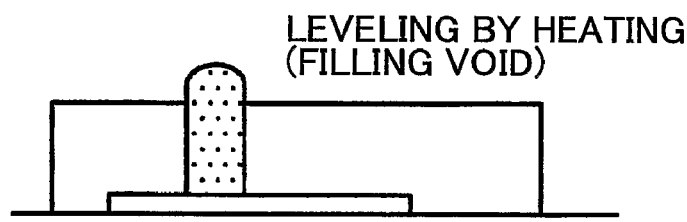

In the step shown in FIG. 6E, the glass substrate 12 on which the insulation paste 15 (interlayer insulation film 18) is printed is heated at a temperature lower than a curing temperature (200° C. in this embodiment) of the insulation paste 15. In Embodiment 5, the glass substrate 12 is heated in an oven at 50° C. for 10 minutes.

The viscosity of the insulation paste 15 is lowered due to heat, so that the insulation paste 15 fills a void present at the interface with the via post 13. The filling effect is estimated to be enhanced especially in early stages of the heating process.

Then, the insulation paste 15 is cured by heating in an oven at 200° C. for 30 minutes to finish the interlayer insulation film 18. The volume of the insulation paste 15 after the curing process is reduced by about 20-30%, so that the head of the via post 13 after the curing process remains extending outward beyond the surface of the interlayer insulation film 18.

Figure 6F:
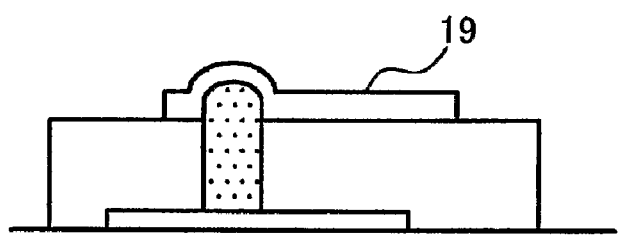

In the step shown in FIG. 6F, the second metal wiring element 19 is formed on the surface of the interlayer insulation film 18 using the screen printing method.

A land of the second metal wiring element 19 is positioned on the head of the via post 13 extending out of the interlayer insulation film 18.

The conductive paste used herein for printing is the same paste as the Ag paste used for the first metal wiring element 11, which contains Ag particles, acrylic resin, carbitol acetate, etc., and has a viscosity of 230-250 Pa·s.

A screen mask used herein is a stainless mesh No. 500 with an emulsion thickness of 5 µm. An alignment mark of this screen mask is aligned with an alignment mark at the same layer as the via post 13 on the substrate, so that the land of the second metal wiring element 19 is positioned on the head of the via post 13.

The second metal wiring element 19 (having a width of 50 µm and a land diameter of 100 µm) is printed with the above Ag paste, using the above screen mask and a squeegee 14 having a rubber hardness of 80. Then, the Ag paste is cured by heating in an oven at 180° C. for 30 minutes to finish the second metal wiring element 19. The film thickness of the second metal wiring element 19 is about 8 µm, and the head of the via post 13 extending out of the interlayer insulation film 18 is covered with the second metal wiring element 19.

In Embodiment 6, the same evaluations as in Embodiment 1 were conducted, and it was found that even in the case where the via hole 13 with a diameter of 75 µm was formed using the screen printing method, good contact resistance was obtained and almost no void was found between the interlayer insulation film 18 and the via post 13.

According to the manufacturing method of Embodiment 6, the via post 13 is formed on the first metal wiring element 11, and the interlayer insulation film 18 lower than the via post 13 is printed using the screen mask 17 having the non-ejection area 16 slightly larger than the head of the via post 13 while the non-ejection area 16 is generally aligned with the head of the via post 13. Then the substrate 12 is heated at a temperature lower than the curing temperature of the interlayer insulation film 18 (insulation paste 15). Therefore, the viscosity of the insulation paste 15 is lowered due to heat, so that the insulation paste 15 fills a void present at the interface with the via post 13. Accordingly, the frequency of the void remaining between the via post 13 and the interlayer insulation film 18 is further lowered.

Although the screen printing method is used for forming the via post 13 in Embodiment 6, the dispenser method and the inkjet method may alternatively be used for forming the via post 13 as in Embodiments 3 and 4.

Embodiment 7

The following describes Embodiment 7, again with reference to FIGS. 6A-6F.

In the same way as in Embodiment 6, a first metal wiring element 11 (having a width of 50 µm and a land diameter of 100 µm) is formed on a glass substrate 12, and then a via post 13 is formed on a land of the first metal wiring element 11. The via post 13 has a head size of 65-75 µm and a height of 8-9 µm.

Then an insulation paste 15 is printed by screen printing. A screen mask 17 used herein has a non-ejection area 16. The design rule of a distance OL between the non-ejection area 16 and the via post 13 with one side is in a range of 10-50 µm. An insulation paste 15 and a squeegee 14 used in this embodiment are the same as those in Embodiment 6.

As in the same manner in Embodiment 6, the glass substrate 12 on which the insulation paste 15 (interlayer insulation film 18) is printed is heated at a temperature lower than a curing temperature (200° C. in this embodiment) of the insulation paste 15. In Embodiment 7, the glass substrate 12 is heated in an oven at 50° C. for 10 minutes.

Then, the insulation paste 15 is cured by heating in an oven at 200° C. for 30 minutes to finish the interlayer insulation film 18.

Then, a second metal wiring element 19 (having a width of 50 µm and a land diameter of 100 µm) is formed on the surface of the interlayer insulation film 18 using the screen printing method. A land of the second metal wiring element 19 is positioned on the head of the via post 13 extending out of the interlayer insulation film 18.

The design rule of the distance OL, which is in a range of 10-50 µm, is selected based on the following evaluation results.

The same evaluations as in Embodiment 1 were conducted. Double layer wiring structures were prepared with the above described method, wherein the distance OL between the non-ejection area 16 and the via post 13 with one side was changed in a range of 0-100 µm for evaluation purposes.

Figure 7:
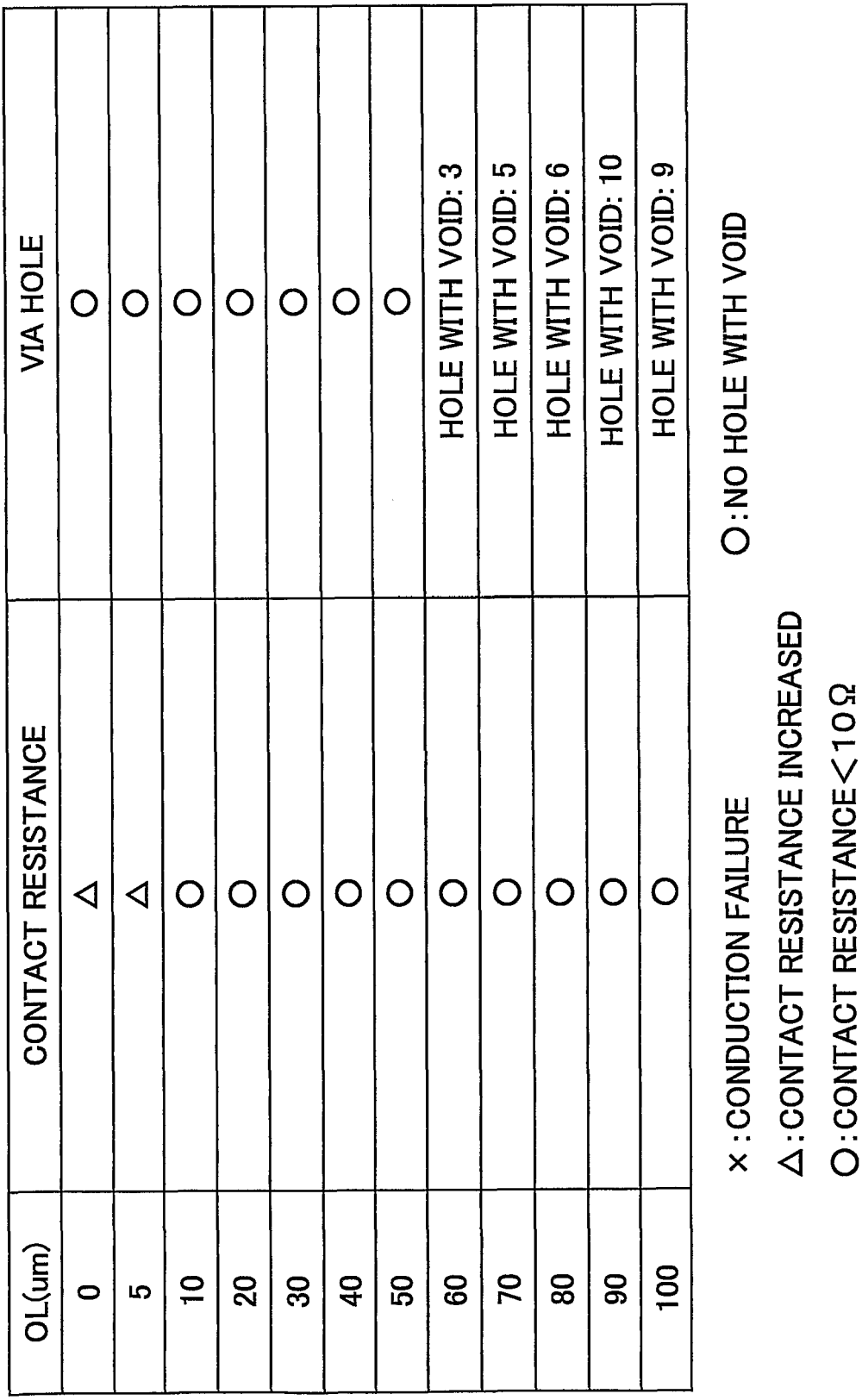
FIG. 7 is a table showing an evaluation result after forming a double layer wiring structure according to an embodiment of the present invention.

The table of FIG. 7 shows the evaluation results. In the table of FIG. 7, ○ indicates that the contact resistance is less than 10Ω, which is considered as a desired range, or, in other words, good contact resistance is obtained; Δ indicates that the contact resistance is increased; and X indicates conduction failure.

When the distance OL was in the range of 10-50 µm, the contact resistance was in the desired range, and almost no void was found.

However, when the distance OL was in a range of 0-5 µm, the contact resistance was increased in some of the double layer wiring structures. When the distance OL was in a range of 60-100 µM, voids were found in some via holes.

From the above results, the distance OL in a range of 10-50 µm is found to be preferable and selected for the manufacturing method of this embodiment in which the substrate 12 is heated at a temperature lower than the curing temperature of the insulation paste 15 after printing the interlayer insulation film 18.

Embodiment 8

FIGS. 8A-8E illustrate a method of manufacturing a multilayer wiring structure according to Embodiment 8 of the present invention.

Figure 8A:
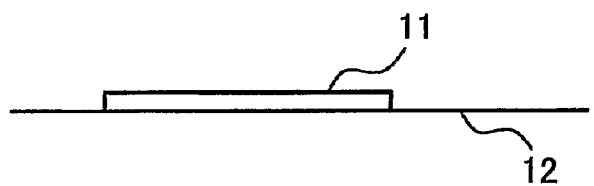
FIGS. 8A-8E illustrate a method of manufacturing a multilayer wiring structure according to Embodiment 8 of the present invention.
Figure 8B:
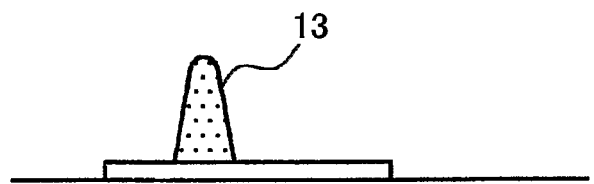
Figure 8C:
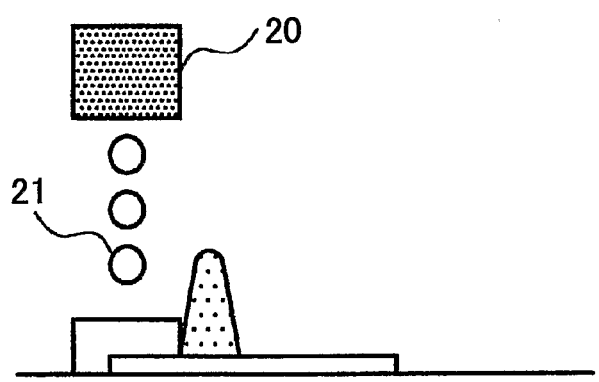

In the steps shown in FIGS. 8A and 8B, in the same way as in Embodiment 1, a first metal wiring element 11 (having a width of 50 µm and a land diameter of 150 µm) is formed on a glass substrate 12, and then a via post 13 is formed on a land of the first metal wiring element 11. The via post 13 has a head size of 50-60 µm and a height of 11-13 µm. In the step shown in FIG. 8C, an interlayer insulation film 23 is formed on the first metal wiring element 11 using the inkjet method. An insulation ink 21 used herein for printing contains polyvinyl alcohol, a dispersing agent, etc., and has a viscosity of 5-30 Pa·S.

More specifically describing the above process, the substrate 12 is positioned while reading an alignment mark of the via post 13 by a CCD camera of an inkjet machine. Then, printing data of an interlayer insulation film 23 are input to the inkjet machine, and printing is performed by ejecting the insulation ink 21 from an ejection head 20.

To prevent the insulation ink 21 from being printed to the head of the via post 13, an area slightly larger than the outer circumference of the via post 13 is determined as a non-print area (area not to be printed) in view of the inclination of the head 20, ink destination accuracy, and alignment accuracy of the inkjet machine. In this embodiment, the non-print area is the area inside the outer circumference of the via post 13 and the area extending outward by 20 μm around the outer circumference of the via post 13.

When the interlayer insulation film 23 does not require pattern forming as in this embodiment, an ink having relatively low viscosity can be used by the inkjet machine. Therefore, the ejected insulation ink 21 is easily spread on the first metal wiring element 11 and can fill the void between the via post 13 and the insulation ink 21.

Since the interlayer insulation film 23 having a target thickness cannot be formed by one ejection with the inkjet method, the insulation ink 21 is ejected onto the same spot two or more times until the interlayer insulation film 23 has the target thickness.

The ejected insulation ink 21 is formed to be about 2 μm thick so as to have the upper surface at the level lower than the head of the via post 13 in this embodiment. Therefore, the via post 13 extends outward beyond the surface of the printed interlayer insulation film 23 by about 10 μm.

Figure 8D:

In the step shown in FIG. 8D, the insulation ink 21 is cured by heating in an oven at 150° C. for 30 minutes to finish the interlayer insulation film 23. The volume of the insulation ink 21 after the curing process is reduced, so that the via post 13 after the curing process remains extending outward beyond the surface of the interlayer insulation film 23.

Figure 8E:
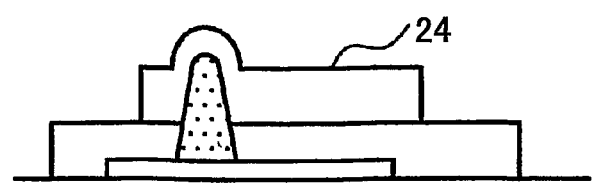

In the step shown in FIG. 8E, in the same way as in Embodiment 1, a second metal wiring element 24 (having a width of 50 μm and a land diameter of 150 μm) is formed on the surface of the interlayer insulation film 23 using the screen printing method.

The film thickness of the second metal wiring element 24 is about 8 μm, and the head of the via post 13 extending out of the interlayer insulation film 23 is covered with the second metal wiring element 24.

In this embodiment, The contact resistance was evaluated in the same manner as in Embodiment 1, and it was found that the contact resistance of the via post 13 was 10Ω or less. In other words, good contact resistance was obtained.

Also, one thousand via posts 13 were randomly selected and observed with a supersonic microscope, and it was found that almost no via hole had a void between the via post 13 and the interlayer insulation film 23. From these results, it is found that the void between the insulation ink 21 and the via post 13 is efficiently filled with the use of the manufacturing method of this embodiment.

According to the manufacturing method of Embodiment 8, since the interlayer insulation film 23 is printed to have the upper surface at the level lower than the head of the via post 13 after forming the via post 13 on the first metal wiring element 11, the via post 13 extends outward beyond the surface of the interlayer insulation film 18. Therefore, good contact resistance is obtained by just forming the second metal wiring element 24 directly on the via post 13. Furthermore, the manufacturing process is simplified because the mechanical polishing process, which is necessary for the method disclosed in Patent Document 3, can be excluded.

When the interlayer insulation film 23 does not require pattern forming as in this embodiment, ink having relatively low viscosity can be used by the inkjet machine. When such an insulation ink 21 is printed except on the non-print area slightly larger than the outer circumference of the via post, the ejected insulation ink 21 is easily spread on the first metal wiring element 11 and can fill the void between the via post 13 and the insulation ink 21.

Although the insulation ink 21 containing polyvinyl alcohol is used in this embodiment, other insulation inks including cresol novolac epoxy resin, epoxy resin, polyimide resin, phenolic resin, acrylic resin, polyvinyl resin, etc., may be used as the insulation ink 21.

Although the interlayer insulation film 23 is printed using the inkjet method in this embodiment, the dispenser method that ejects ink droplets may alternatively be used for printing the interlayer insulation film 23. Even if the dispenser method is used, the insulation ink 21 having relatively low viscosity can be used as long as the interlayer insulation film 23 does not require pattern forming as in this embodiment. Therefore, the same effects can be obtained.

Although the screen printing method is used for forming the via post 13 in this embodiment, the dispenser method and the inkjet method may alternatively be used for forming the via post 13 as in Embodiments 3 and 4.

Embodiment 9

FIGS. 9A-9F illustrate a method of manufacturing a multilayer wiring structure according to Embodiment 9 of the present invention.

Figure 9A:
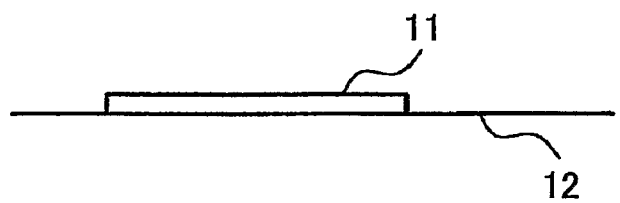
FIGS. 9A-9F illustrate a method of manufacturing a multilayer wiring structure according to Embodiment 9 of the present invention.
Figure 9B:
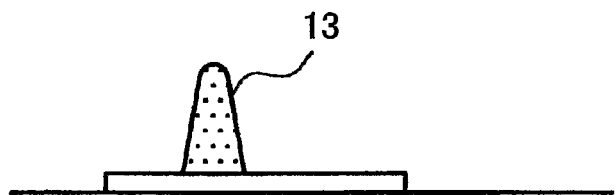
Figure 9C:
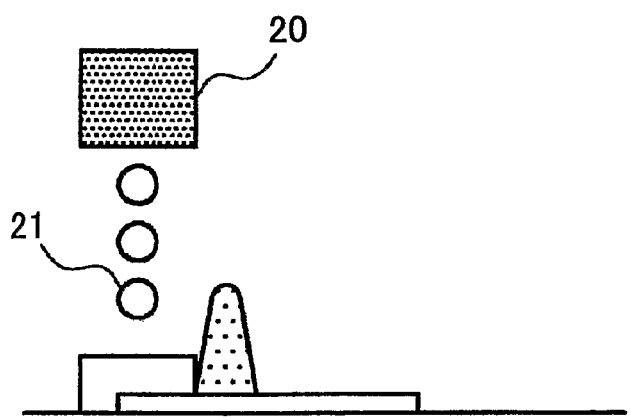

In the steps shown in FIGS. 9A and 9B, in the same way as in Embodiment 8, a first metal wiring element 11 (having a width of 50 μm and a land diameter of 150 μm) is formed on a glass substrate 12, and then a via post 13 is formed on a land of the first metal wiring element 11. The via post 13 has a head size of 50-60 μm and a height of 11-13 μm. In the step shown in FIG. 8C, an interlayer insulation film 23 is formed on the first metal wiring element 11 using the inkjet method. An insulation ink 21 used herein for printing is the same one as used in Embodiment 8.

In this embodiment, to prevent the insulation ink 21 from being printed to the head of the via post 13, an area larger than the outer circumference of the via post 13 is determined as a non-print area (area not to be printed). More specifically, the non-print area is the area inside the outer circumference of the via post 13 and the area extending outward by 40 μm around the outer circumference of the via post 13.

Figure 9D:
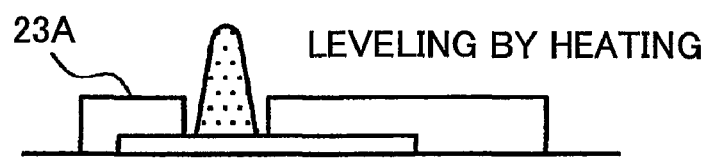

In the step shown in FIG. 9D, the glass substrate 12 on which the insulation ink 21 is printed is heated at a temperature lower than a curing temperature (150° C. in this embodiment) of the insulation ink 21. In this embodiment, the glass substrate 12 is heated in an oven at 40° C. for 15 minutes.

The viscosity of the insulation ink 21 is lowered due to heat, so that the insulation ink 21 fill's an air gap present at the interface with the via post 13.

Figure 9E:
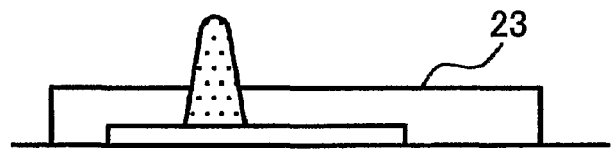

In the step shown in FIG. 9E, the insulation ink 21 is cured by heating in an oven at 150° C. for 30 minutes to finish the interlayer insulation film 23. The head of the via post 13 after the process of curing the insulation ink 21 remains extending outward beyond the surface of the interlayer insulation film 23.

Figure 9F:
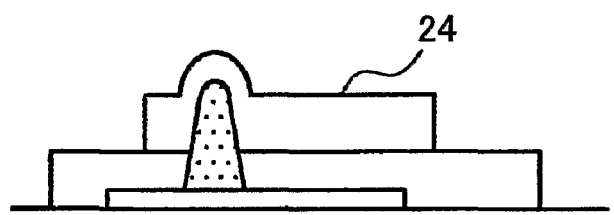

In the step shown in FIG. 9F, in the same way as in Embodiment 8, a second metal wiring element 24 (having a width of 50 μm and a land diameter of 150 μm) is formed on the surface of the interlayer insulation film 23 using the screen printing method.

The film thickness of the second metal wiring element 24 is about 8 μm in this embodiment as well, and the head of the via post 13 extending out of the interlayer insulation film 23 is covered with the second metal wiring element 24.

In this embodiment, the contact resistance was evaluated in the same manner as in Embodiment 8, and it was found that the contact resistance of the via post 13 was 10 Ω or less. In other words, good contact resistance was obtained.

Also, one thousand via posts 13 were randomly selected and observed with a supersonic microscope, and it was found that no via hole had a void between the via post 13 and the interlayer insulation film 23. From these results, it is found that the void between the interlayer insulation film 23 and the via post 13 is more efficiently filled with use of the manufacturing method of this embodiment.

According to the manufacturing method of this embodiment, the interlayer insulation film 23 is printed with the inkjet method so as to have the upper surface at the level lower than the head of the via post 13. Then the substrate 12 is heated at a temperature lower than the curing temperature of the interlayer insulation film 23 (insulation ink 21). The viscosity of the insulation ink 21 is lowered due to heat, so that the insulation ink 21 fills the void present at the interface with the via post 13. Therefore, the frequency of the void remaining between the via post 13 and the interlayer insulation film 23 is further lowered.

Embodiment 10

The following describes Embodiment 10 with reference to FIGS. 1A-1E, FIGS. 6A-6F, and FIGS. 8A-8E.

A flexible printed board (not shown) according to Embodiment 10 comprises a three-layer wiring structure (not shown) formed on a polyimide substrate 12. The three-layer wiring structure is formed using the same method as the method of Embodiment 1, and includes a first metal wiring element 11 (50 μm), a second metal wiring element 19 (100 μm), a third wiring element (100 μm) (not shown), and a via post 13 (100 μm).

For evaluation purposes, a thermal impact test (one hundred heat cycles of −65° C. and +200° C.) was performed on the flexible printed board. After the test, there was good conduction between the first metal wiring element 11 and the second metal wiring element 19 connected through a via hole (via post 13) and between the second metal wiring element 19 and the third metal wiring element connected through the via hole (via post 13).

According to Embodiment 10, the flexible printed board may alternatively comprise a multilayer wiring structure formed by using the same method as the method of Embodiment 6 or Embodiment 8. For evaluation purposes, the thermal impact test was also performed on the flexible printed board comprising the multilayer wiring structure formed by using the same method as the method of Embodiment 6 or Embodiment 8, and no via hole (via post 13) had poor connection.

The via hole diameter of the multilayer wiring element formed with a method that uses screen printing for printing holes and filling the hole with a conductive paste is about 150-200 μm. With the method of this embodiment, the via hole method can be reduced to ½-⅔.

The flexible printed board of Embodiment 10 may alternatively be a multilayer wiring ceramic substrate comprising the multilayer wiring structure formed with the method of Embodiment 1, 6, or 8. The multilayer wiring ceramic substrate provides the same effect as described above.

Embodiment 11

Figure 10A:
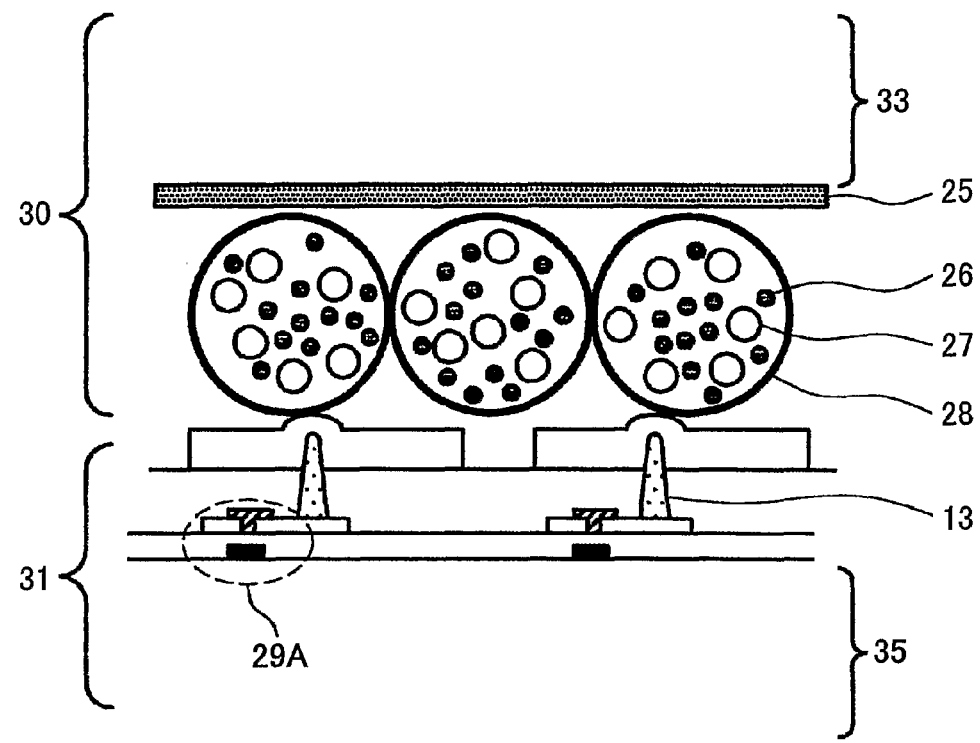
FIGS. 10A and 10B illustrate a flat panel display according to Embodiment 11 of the present invention.
Figure 10B:
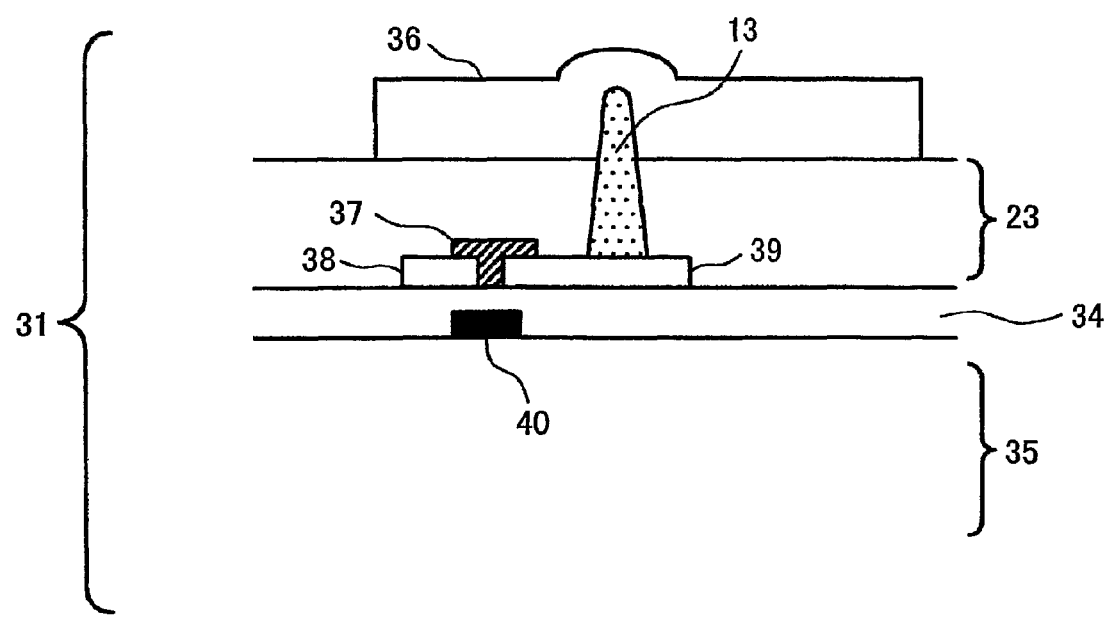

FIGS. 10A and 10B illustrate an example of a flat panel display according to Embodiment 11 of the present invention. FIG. 10A is a cross-sectional view of the flat panel display including an active matrix drive circuit 31, and FIG. 10B is a cross-sectional view of the active matrix drive circuit 31 including organic TFTs 29A.

The active matrix drive circuit 31 includes 320×240 elements of the organic TFT 29A arranged at 300 μm intervals in a matrix form on a film substrate 35 made of polyimide.

A gate electrode 40, a source electrode 39, and a drain electrode 38 of the organic TFT 29A are made of Ag. An organic semiconductor 37 made of triaryl amine polymer forms an active layer. A gate insulation film 34 is made of polyimide. The organic TFTs 29A arranged in a matrix form are covered with an interlayer insulation film 23 containing a silica system filler. On the interlayer insulation film 23, plural pixel electrodes 36 (320×240 elements) made of Ag are arranged in a matrix form. The source electrode 39 and the corresponding pixel electrode 36 of the organic TFT 29A are connected through a corresponding via hole (via post 13).

The head of the via post 13 (via hole) formed on the source electrode 39 extends outward beyond the surface of the interlayer insulation film 23 as in Embodiment 1, and is covered with the pixel electrode 36.

An electrophoresis device 30 is attached on the active matrix drive circuit 31 comprising the organic TFTs 29A so as to form the flat panel display.

In the electrophoresis device 30, microcapsules 28 in which charged graphite particles 26 and $TiO_2$ particles 27 are dispersed in a silicone oil are interposed between the pixel electrodes 36 and an opposed substrate 33 made of polycarbonate. A common transparent electrode 25 made of ITO is disposed on the surface of the opposed substrate 33 in contact with the microcapsule 28.

The flat panel display including the organic TFTs 29A is manufactured with the method described below according to this embodiment. With use of the inkjet method, the gate electrode 40 having a width of 60 μm is printed with a nano Ag ink on the film substrate 35 having a surface with a silicon oxide film. The substrate 35 is heated in an oven at 200° C. to finish the gate electrode 40.

Then, polyimide is deposited onto the gate electrode 40 by a spin coat method and heated in an oven at 250° C., so that the polyimide is imidized to become a gate insulation film 34.

A photomask is placed on the gate insulation film 34 such that ultraviolet rays are irradiated onto only the areas where the source electrode 39 and the drain electrode 38 are to be formed. Thus, the polyimide surface exposed to ultraviolet rays is modified.

Then, a nano Ag ink is ejected onto the modified polyimide surface using the inkjet method. A heat treatment is performed in an oven at 200° C. to form the source electrode 39 having a width of 140 μm and the drain electrode 38 having a width of 60 μm. The distance between the source electrode 39 and the drain electrode 38 (channel length) is 20 μm.

A solution containing an organic semiconductor material is ejected onto the channel area using the inkjet method. Then a drying process is performed at 100° C. to obtain the organic semiconductor 37. Thus, the organic TFT 29A is formed. The organic semiconductor material is a triaryl amine polymer, and is dissolved in toluene, xylene, THF, etc., to be used as an ink.

In the same way as in Embodiment 1, the via post 13 having a diameter of 100 μm is printed with an Ag paste and is heated at 130° C. such that the via post 13 having a height of about 12 μm is obtained.

An insulation paste including a silica filler, polyvinyl butyral resin, etc., is printed using the screen printing method, and is cured by heating at 130° C. to form the interlayer insulation film 23. A screen mask used for printing the interlayer insulation film 23 has a non-ejection area having a diameter of 150 μm. The printing is performed while the non-ejection area is aligned with the via post 13 on the source electrode 39. The interlayer insulation film 23 is printed to have the upper surface at the level lower than the head of the via post 13 such that the head of the via post 13 extends outward beyond the surface of the cured interlayer insulation film 23 by 3-4 μm.

Then, the 250 μm square pixel electrode 36 is printed on the interlayer insulation film 23 using the screen printing method, and is cured by heating at 130° C. Thus, the active matrix drive circuit 31 (element number: 320×240) comprising the organic TFTs 29A is completed. The head of the via post 13 extending outward beyond the surface of the interlayer insulation film 23 is covered with the pixel electrode 36.

The microcapsules 28 having a thickness of 50 μm, in which the negatively charged graphite particles 26 and the positively charged $TiO_2$ particles 27 are dispersed in the silicone oil, are applied to form a single layer on the pixel electrodes 36.

ITO is deposited on the surface of the opposed substrate 33 made of polycarbonate using the sputtering method, and the common transparent electrode 25 is formed by photolithography and etching. The opposed substrate 33 is disposed such that the microcapsules 28 are interposed between the pixel electrodes 36 and the common transparent electrodes 25. The opposed substrate 33 and the film substrate 35 are sealed by an epoxy adhesive agent. Thus, the flat panel display comprising the organic TFTs 29A is formed.

In order to evaluate the image quality of the flat panel display, full white, full black, and a test pattern were displayed by inputting select signals to all the gate electrodes 40 and data signals to all the drain electrodes 38. Then, it was found that the black reflectance is 5% or less, the white reflectance is 34% or higher, and the contrast is 7 or higher. Accordingly, the image quality of the flat panel display was found to be high. Defective bits were less than ten bits.

As described above, according to the method of manufacturing the flat panel display of this embodiment, in the process of forming the active matrix drive circuit 31 that drives the electrophoresis device 30, the via post 13 is formed on the source electrode 39, and then the interlayer insulation film 23 and the pixel electrode 36 are formed in this order. Thus, the source electrode 39 and the pixel electrode 36 are connected through the via hole 13 having the diameter of 100 μm.

With this configuration, the contact resistance between the organic TFT 29A and the pixel electrode 36 is very low. Therefore, if the organic TFT 29 is turned on by a combination of the select signal input to the gate electrode 40 and the data signal input to the drain electrode 38, high potential can be induced in the pixel electrode 36 connected to the turned-on organic TFT 29 due to very small contact resistance of the via post 13 and almost no voltage loss.

Generally, it is difficult to flow a large current through the organic TFT 29A because the organic TFT 29A has a low mobility. Therefore, in the case where a current-drive type display device is used, contrast is lowered, and high quality images cannot be easily produced.

The electrophoresis device 30 used in this embodiment is a voltage drive type. Therefore, by using the active matrix drive circuit 31 that has very low via hole resistance and can induce large voltage in the pixel electrode 36 as in this embodiment, the graphite particles 26 present in the microcapsules 28 easily gather on the pixel electrode 36 when the pixel electrode 36 is held at positive potential, and the $TiO_2$ particles 27 present in the microcapsules 28 easily gather on the pixel electrode 36 when the pixel electrode 36 is held at negative potential. Accordingly, the flat panel display of this embodiment can produce a clear contrast and provide high quality images even though the organic TFT 29A are used.

The display device that can be used in this embodiment is not limited to the electrophoresis device 30. Other display devices such as liquid crystal display devices and EL devices may alternatively be used if the mobility of the organic TFTs 29A is improved, or if suitable organic semiconductor material, channel width, and channel length are selected.

According to this embodiment, via holes having the same size as the via hole of an organic TFT of an active matrix drive circuit formed by photolithography and dry etching or laser drilling can be formed more easily and at lower cost. As mentioned earlier, screen printing is more suitable for dot printing than for hole printing. At present, although it is difficult to print a hole having a diameter as large as 100 μm, it is easy to print a dot having a diameter as small as 50 μm. Therefore, the diameter of the via hole (via post 13) can be reduced to 50 μm with use of the method of this embodiment.

Since the interlayer insulation film 23 is printed to have the upper surface at the level lower than the head of the via post 13, the via post 13 extends outward beyond the surface of the interlayer insulation film 23 without being completely covered with the interlayer insulation film 23. Therefore, a via post having good contact resistance can be formed by just forming the pixel electrode 36 directly on the via post 13. Thus, the switching properties of the organic TFT 29A are not made to degraded.

The insulation paste is printed using the screen mask having the non-ejection area slightly larger than the head of the via post 13 while the non-ejection area is generally aligned with the head of the via post 13. Therefore, the void between the via post 13 and the insulation paste can be filled during the leveling by properly controlling the viscoelasticity of the insulation paste. Even if a small void remains between the via post 13 and the interlayer insulation film 23 after the insulation paste leveling, since the small void is present on the surface of the interlayer insulation film 23, the small void can be easily filled with a conductive paste in the process of printing the pixel electrode 36. Therefore, the frequency of the void remaining between the via post 13 and the interlayer insulation film 23 is lowered, and the flat panel display having long-term reliability can be produced.

According to the manufacturing method of this embodiment, the via post 13, the interlayer insulation film 23, and the pixel electrode 36 are formed with the screen printing method after forming the organic semiconductor 37 with the inkjet method. That is, none of the lithography, dry etching, and laser drilling processes is included in the processes after the formation of the organic semiconductor 37.

Therefore, even if organic semiconductor materials that are soluble in an organic solvent are used, the organic TFT 29A having good switching properties can be formed while preventing dissolution of the organic semiconductor 37 by a developer and a remover for lithography as well as plasma and thermal damage to the organic TFT 29A. Accordingly, unlike related art methods, the flat panel display capable of producing high quality images can be manufactured using the organic semiconductor materials that are soluble in an organic solvent. Moreover, since lithography, dry etching, and laser drilling are not used, a wider variety of organic semiconductor materials, such as polythiophene, polyphenylene vinylene, and polyfluorene can be used according to intended use of the flat panel display. Especially, triaryl amine polymer is not easily oxidized due to its relatively high ionization potential and therefore can increase the long-term reliability of the active matrix drive circuit 31. Eventually, the life time of the flat panel display comprising the organic TFT 29A is prolonged.

Although the screen printing method is used for forming the via post 13 in this embodiment, the same effects can be obtained even if the dispenser method and the inkjet method are alternatively used for forming the via post 13 as in Embodiments 3 and 4.

In the case where the via post 13 is formed using the inkjet method, by forming plural pairs of alignment marks on each end of the substrate 35 in advance in the step of printing the source electrode 39 and sequentially reading the plural pairs of alignment marks, the position of the substrate 12 can be corrected each time a pair of alignment marks is read. Accordingly, the via post 13 can be more accurately aligned with the source electrode 39.

If the screen printing method, which forms the via posts 13 all at once, is used, a large alignment error occurs around the active matrix drive circuit 31 because the film substrate 35 shrinks due to heat during the heat curing process of the source electrode 39 and the drain electrode 38. Because of such an alignment error, it is difficult to increase the number of pixels. On the other hand, when the inkjet method is used, the via posts 13 can be printed while performing position correction with reference to the plural pairs of alignment marks as described above. Therefore, alignment is correctly performed within all area of the active matrix drive circuit 31, and the flat panel display having higher resolution can be formed compared to flat panel displays formed using the screen printing method.

Although the polyimide substrate is used as the film substrate 35 in this embodiment, other common substrates, such as polycarbonate (PC) substrates, polyethylene terephthalate (PET) substrates, polyethylene naphthalate (PEN) substrates, and polyether sulfone (PES) substrates, as well as inorganic insulation substrates, such as glass substrates, quartz substrates, and ceramic substrates may alternatively be used.

Although the via post 13 is formed on the source electrode 39 in this embodiment, the via post 13 may alternately be formed on the drain electrode 38 such that the drain electrode 38 and the pixel electrode 36 are connected through the via post 13. In that case, a select signal is input to the gate electrode 40, and a data signal is input to the source electrode 39.

Although the pixel electrode 36 is formed using the screen printing method in this embodiment, other common printing methods that can match with meet the design rule of the pixel electrode 36, such as dispenser methods, inkjet methods, and gravure printing methods, may alternatively be used.

Although the organic TFTs 29A are used as switching elements of the active matrix drive circuit 31 in this embodiment, the manufacturing method and configuration of the via post 13 and the interlayer insulation film 23 are applicable to vertical SITs and diodes.

Embodiment 12

The following describes Embodiment 12, again with reference to FIGS. 10A and 10B.

In the same way as in Embodiment 11, an organic TFT 29A having triaryl amine polymer as an active layer is formed on a polyimide substrate 35, and a via post 13 is formed on a source electrode 39 using the screen printing method. The via post 13 has a diameter of 100 µm and a height of about 12 µm.

After that, the same insulation paste as used in Embodiment 11 is printed by screen printing and cured by heating so as to form an interlayer insulation film 23. A screen mask used herein has a non-ejection area. The design rule of a distance OL between the non-ejection area and the via post 13 with one side is in a range of 10-50 µm.

Then, in the same way as in Embodiment 11, a pixel electrode 36 is formed on the surface of the interlayer insulation film 23 using the screen printing method. Thus, an active matrix drive circuit 31 is formed. It is to be noted that active matrix drive circuits 31 were prepared with the above described method, wherein the distance OL between the non-ejection area and the via post 13 with one side was changed in a range of 0-100 µm for evaluation purposes. One thousand via posts 13 were randomly selected and observed with a supersonic microscope. This observation was performed for every different distance OL. Based on the results of this observation with the supersonic microscope and a defective bit evaluation (described below), the distance OL in a range of 10-50 µm is selected.

Then, an electrophoresis device 30 that includes microcapsules 28 containing graphite particles 26 and $TiO_2$ particles 27 is attached to the active matrix drive circuit 31, so that the flat panel display comprising the organic TFTs 29A is formed.

As mentioned above, the defective bit evaluation was performed in which full white, full black, and a test pattern were displayed by inputting select signals to all the gate electrodes 40 and data signals to all the drain electrodes 38. The results are shown in the table of FIG. 11.

In the table of FIG. 11, ○ indicates that there are less than 10 defective bits; Δ indicates that there are 10 or more but less than 100 defective bits; and X indicates that there are 100 or more defective bits.

When the distance OL was in a range of 10-100 µm, there were very few defective bits, and high quality images were produced. However, when the distance OL was in a range of 60-100 µm, voids were found in 5-32 out of the one thousand via holes.

From the above results, the distance OL in a range of 10-50 µm is found to be preferable and selected for the manufacturing method of this embodiment. However, since the flat panel display in which the diameter of the via hole 13 is 100 µm and the distance OL is in a range of 60-100 has only a very small number of defective bits, connection between the source electrode 39 and the pixel electrode 36 is good. Therefore, the distance OL may be in the range of 60-100 in Embodiment 11 if the size of the void satisfies the target reliability of the flat panel display.

Embodiment 13

Figure 12A:
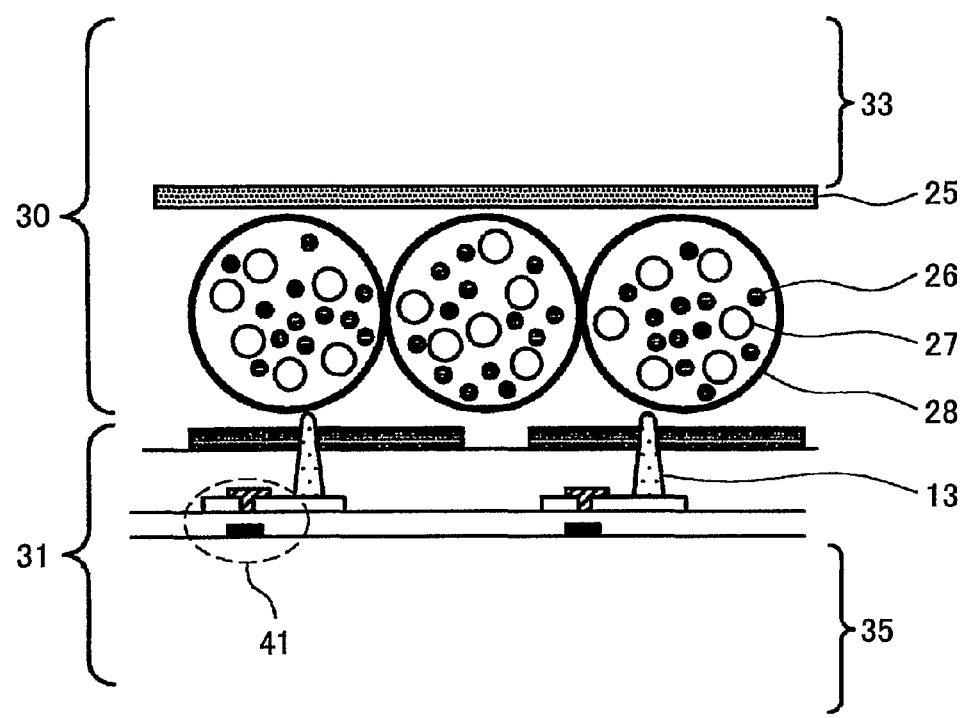
Figure 12B:
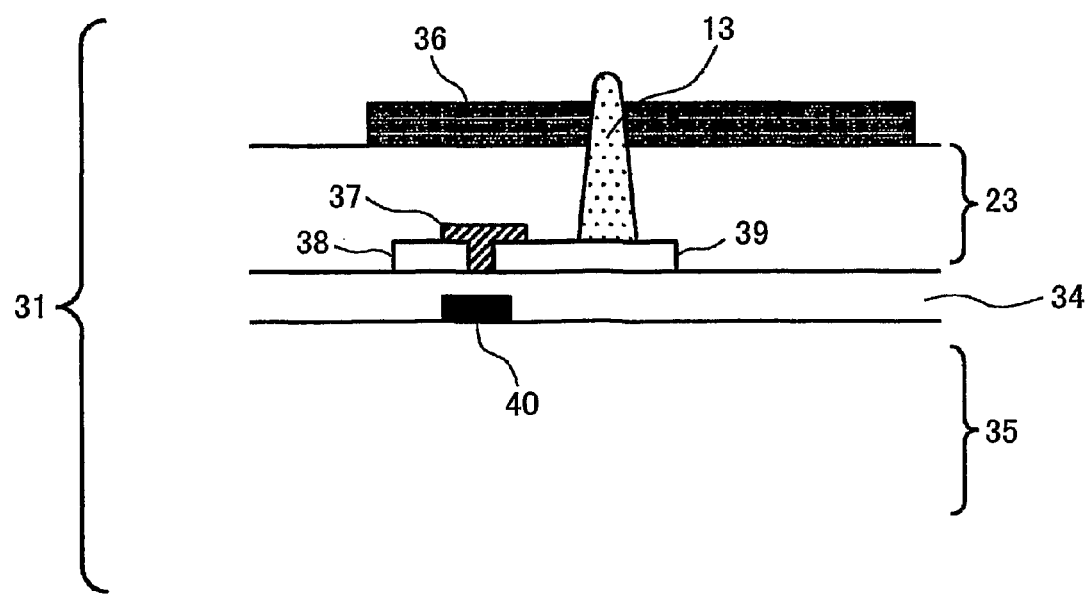

The following describes Embodiment 13 with reference to FIGS. 12A and 12B.

In the same way as in Embodiment 11, an organic TFT 41 having triaryl amine polymer as an active layer is formed on a polyimide substrate 35, and a via post 13 is formed on a source electrode 39 using the screen printing method. The via post 13 has a diameter of 100 µm and a height of about 12 µm.

After that, in the same way as in Embodiment 11, an insulation paste is printed by screen printing and cured by heating so as to form an interlayer insulation film 23. A screen mask used herein has a non-ejection area. The design value of a distance OL between the non-ejection area and the via post 13 with one side is 25 μm. The head of the cured via post 13 extends outward beyond the surface of the interlayer insulation film 23 by 3-4 μm.

Then, a 250 μm square pixel electrode 36 is printed with a conductive ink on the surface of the interlayer insulation film 23 using the screen printing method. The conductive ink used herein is a nano Ag ink having a viscosity of 10-15 Pa·S. The film thickness of the pixel electrode 36 is about 0.5 μm, and the via post 13 extending outward beyond the surface of the interlayer insulation film 23 extends through the pixel electrode 36. Then, only the vicinity of the pixel electrode 36 is heated at 180° C. by an RTA so as to cure the pixel electrode 36.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

The same observation and evaluation as in Embodiment 11 were performed on the flat panel display of this embodiment, and the image quality was found to be high.

According to this embodiment, in the process of forming the active matrix drive circuit 31 that drives the electrophoresis device 30, the via post 13 is formed on the source electrode 39, and then the interlayer insulation film 23 and the pixel electrode 36 are formed in this order. Thus, the source electrode 39 and the pixel electrode 36 are connected through the via hole 13 having the diameter of 100 μm. That is, the active matrix drive circuit 31 having low contact resistance can be manufactured using a simple and low cost process.

Moreover, since the voltage loss in the via hole (via post 13) is reduced, the voltage induced in the pixel electrode 36 does not decrease. Accordingly, the flat panel display can produce high quality images.

In this embodiment, since none of the lithography, dry etching, and laser drilling processes is included in the processes after the formation of the organic TFT 41, the organic TFT 41 is prevented from thermal and plasma damage and can maintain the switching properties.

Since photolithography is not used, organic semiconductor materials that are soluble in an organic solvent can be used. That is, a wider variety of materials can be used according to intended use of the flat panel display.

Embodiment 14

In the same way as in Embodiment 11, an organic TFT 41 having triaryl amine polymer as an active layer is formed on a polyimide substrate 35, and a via post 13 is formed on a source electrode 39 using the screen printing method. The via post 13 has a diameter of 80 μm and a height of about 10 μm.

Then, in the same way as in Embodiment 11, an insulation paste containing a silica filler is printed by screen printing. A screen mask used herein has a non-ejection area. A distance OL between the non-ejection area and the via post 13 with one side is 25 μm. The head of the printed via post 13 extends outward beyond the surface of the interlayer insulation film 23.

Then, the polyimide substrate 35 on which the insulation paste (interlayer insulation film 23) is printed is heated at a temperature lower than a curing temperature (130° C. in this embodiment) of the insulation paste. In this embodiment, the polyimide substrate 35 is heated in an oven at 50° C. for 10 minutes. The viscosity of the insulation paste is lowered due to heat, so that the insulation paste fills an air gap present at the interface with the via post 13.

The insulation paste is cured by heating at 130° C. to finish the interlayer insulation film 23. Then, an Ag paste is printed on the surface of the interlayer insulation film 23 using the screen printing method, and is cured by heating at 130° C. to form a 250 μm square pixel electrode 36. Thus, the active matrix drive circuit 31 is formed.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

The same observation and evaluation as in Embodiment 11 were performed on the flat panel display of this embodiment, and the image quality was found to be high.

According to this embodiment, the via post 13 is formed on the source electrode 39, and the interlayer insulation film 23 lower than the via post 13 is printed using the screen mask having the non-ejection area slightly larger than the head of the via post 13 while the non-ejection area is generally aligned with the head of the via post 13. Then the polyimide substrate 35 is heated at a temperature lower than the curing temperature of the interlayer insulation film 23 (insulation paste). The viscosity of the insulation paste is lowered due to heat, so that the insulation paste fills a void present at the interface with the via post 13. Therefore, the frequency of the void remaining between the via post 13 and the interlayer insulation film 23 is further lowered. That is, the flat panel display of this embodiment has higher long-term reliability than the flat panel displays of Embodiments 11-13.

Although the screen printing method is used for forming the via post 13 in this embodiment, the dispenser method and the inkjet method may alternatively be used for forming the via post 13.

Embodiment 15

The following describes Embodiment 15, again with reference to FIGS. 10A and 10B.

In the same way as in Embodiment 11, an organic TFT 29A having triaryl amine polymer as an active layer is formed on a polyimide substrate 35, and a via post 13 is formed on a source electrode 39 using the screen printing method. The via post 13 has a diameter of 80 μm and a height of about 10 μm.

Then, an interlayer insulation film 23 is formed on the organic TFT 29A using the inkjet method. An insulation ink used herein for printing contains polyvinyl butyral, a dispersing agent, etc., and has a viscosity of 5-50 Pa·S.

More specifically describing the above process, the substrate 35 is positioned while reading an alignment mark of the via post 13 by a CCD camera of an inkjet machine. Then, printing data of an interlayer insulation film 23 are input to the inkjet machine, and printing is performed by ejecting the insulation ink from an ejection head.

To prevent the insulation ink from being printed to the head of the via post 13, an area slightly larger than the outer circumference of the via post 13 is determined as a non-print area (area not to be printed) in view of the inclination of the ejection head, ink destination accuracy, and alignment accuracy of the inkjet machine. In this embodiment, the non-print area is the area inside the outer circumference of the via post 13 and the area extending outward by 15 μm around the outer circumference of the via post 13.

Since the interlayer insulation film 23 having a target thickness cannot be formed by one ejection with the inkjet method, the insulation ink is ejected onto the same spot two or more times until the interlayer insulation film 23 has the target thickness.

Because the ejected insulation ink is formed to be about 2 μm thick so as to have the upper surface at the level lower than the head of the via post 13 in this embodiment, the via post 13 extends outward beyond the surface of the interlayer insulation film 23 by about 8 μm after the insulation ink is printed.

The insulation ink is cured by heating at 120° C. to finish the interlayer insulation film 23. The via post 13 after the process of curing the insulation ink remains extending outward beyond the surface of the interlayer insulation film 23.

Then, in the same way as in Embodiment 11, a pixel electrode 36 is formed on the surface of the interlayer insulation film 23 using the screen printing method. Thus, the active matrix drive circuit 31 is completed. The head of the via post 13 extending out of the interlayer insulation film 23 is covered with the pixel electrode 36.

Then, an electrophoresis device 30 that includes microcapsules 28 containing graphite particles 26 and $TiO_2$ particles 27 is attached to the active matrix drive circuit 31, so that the flat panel display comprising the organic TFTs 29A is formed.

In order to evaluate the image quality of the flat panel display, full white, full black, and a test pattern were displayed by inputting select signals to all the gate electrodes 40 and data signals to all the drain electrodes 38 in the same way as in Embodiment 11.

Then, it was found that the black reflectance is less than 6%, the white reflectance is 32% or higher, and the contrast is 6 or higher. Accordingly, the image quality of the flat panel display was found to be high. Defective bits were less than ten bits.

According to the manufacturing method of this embodiment, since the interlayer insulation film 23 is printed to have the upper surface at the level lower than the head of the via post 13 after forming the via post 13 on the source electrode 39, the via post 13 extends outward beyond the surface of the interlayer insulation film 23. Therefore, the via hole (via post 13) having very low contact resistance can be formed by only printing and curing the pixel electrode 36 directly on the via post 13, and a large potential can be induced in the pixel electrode 36 as in Embodiment 11. That is, the flat panel display can produce high quality images.

Since the interlayer insulation film 23 does not require pattern forming in this embodiment, the insulation ink having relatively low viscosity can be used with the inkjet method. When such an insulation ink is ejected except on the non-print area slightly larger than the outer circumference of the via post 13, the ejected insulation ink is easily spread on the source electrode 39 and can fill the air gap between the via post 13 and the insulation ink. Accordingly, the flat panel display having high long-term reliability can be formed.

According to the manufacturing method of this embodiment, the via post 13, the interlayer insulation film 23, and the pixel electrode 36 are formed with the screen printing method and the inkjet method after forming the organic semiconductor 37 with the inkjet method. That is, none of the lithography, dry etching, and laser drilling processes is included in the processes after the formation of the organic semiconductor 37.

Therefore, the organic TFT 29A is prevented from thermal and plasma damage and can maintain the switching properties.

Since photolithography is not used, organic semiconductor materials that are soluble in an organic solvent can be used. That is, a wider variety of materials can be used according to intended use of the flat panel display.

Although the interlayer insulation film 23 is printed using the inkjet method in this embodiment, the dispenser method that ejects ink droplets may alternatively be used for printing the interlayer insulation film 23. Even if the dispenser method is used, the insulation ink having relatively low viscosity can be used as long as pattern forming is not required. Therefore, the same effects can be obtained.

Although the screen printing method is used for forming the via post 13 in this embodiment, the dispenser method and the inkjet method may alternatively be used for forming the via post 13.

Embodiment 16

In the same way as in Embodiment 15, an organic TFT 29A having triaryl amine polymer as an active layer is formed on a polyimide substrate 35, and a via post 13 is formed on a source electrode 39 using the screen printing method. The via post 13 has a diameter of 100 μm and a height of about 12 μm.

Then, an interlayer insulation film 23 is formed on the organic TFT 29A using the inkjet method. An insulation ink 15 used herein for printing is the same one as used in Embodiment 15. In this embodiment, to prevent the insulation ink from being printed to the head of the via post 13, an area larger than the outer circumference of the via post 13 is determined as a non-print area (area not to be printed). More specifically, the non-print area is the area inside the outer circumference of the via post 13 and the area extending outward by 30 μm around the outer circumference of the via post 13.

Since the interlayer insulation film 23 having a target thickness cannot be formed by one ejection with the inkjet method, the insulation ink is ejected onto the same spot two or more times until the interlayer insulation film 23 has the target thickness.

Then, the polyimide substrate 35 is heated at a temperature lower than a curing temperature (120° C. in this embodiment) of the insulation ink. In this embodiment, the polyimide substrate 35 is heated in an oven at 40° C. for 15 minutes. The viscosity of the insulation ink is lowered due to heat, so that the insulation ink fills a void present at the interface with the via post 13.

The insulation ink is cured by heating in an oven at 130° C. to finish the interlayer insulation film 23. The head of the via post 13 after the process of curing the insulation ink remains extending outward beyond the surface of the interlayer insulation film 23.

Then, in the same way as in Embodiment 11, a pixel electrode 36 is formed on the surface of the interlayer insulation film 23 using the screen printing method. It is to be noted that one thousand via posts 13 in this production step were randomly selected and observed with a supersonic microscope, and a via hole having a void was not detected.

Then, an electrophoresis device 30 that includes microcapsules 28 containing graphite particles 26 and $TiO_2$ particles 27 is attached to the active matrix drive circuit 31, so that the flat panel display comprising the organic TFTs 29A is formed.

The same observation and evaluation as in Embodiment 15 were performed on the flat panel display of this embodiment, and the image quality was found to be high.

According to the manufacturing method of this embodiment, the interlayer insulation film 23 is printed with the inkjet method so as to have the upper surface at the level lower than the head of the via post 13. Then the substrate 35 is heated at a temperature lower than the curing temperature of the interlayer insulation film 23. Therefore, the void present between the interlayer insulation film 23 and the via post 13 can be more efficiently filled.

Although the interlayer insulation film 23 is printed using the inkjet method in this embodiment, the dispenser method that ejects ink droplets may alternatively be used for printing the interlayer insulation film 23. Even in that case, the same effects can be obtained.

Embodiment 17

Figure 13A:
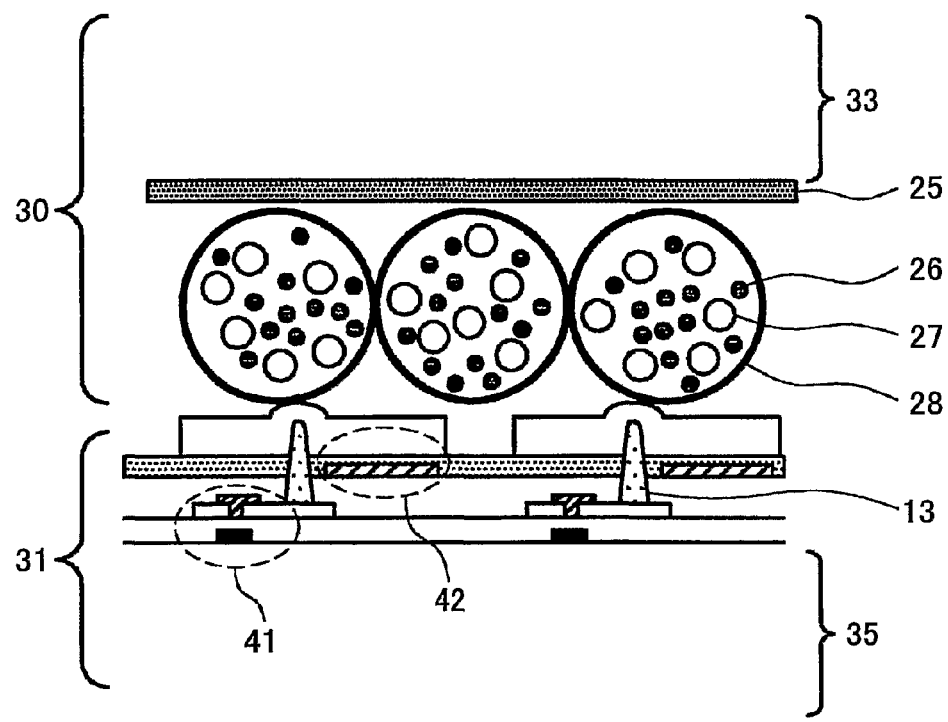
FIGS. 13A and 13B illustrate a flat panel display according to Embodiment 17 of the present invention.
Figure 13B:
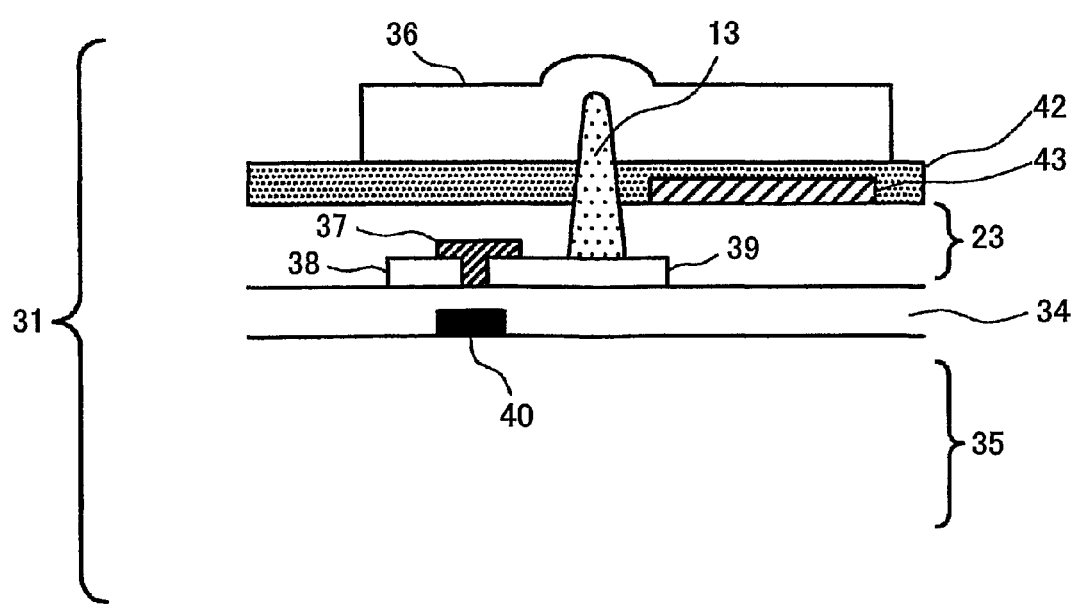

FIGS. 13A and 13B illustrate an example of a flat panel display according to Embodiment 17 of the present invention. FIG. 13A is a cross-sectional view of the flat panel display including active matrix drive circuit 31, and FIG. 13B is a cross-sectional view of the active matrix drive circuit 31 including organic TFTs 41.

The active matrix drive circuit 31 includes 320×240 elements of the organic TFT 41 arranged at 300 μm intervals in a matrix form on a film substrate 35 made of polycarbonate.

A gate electrode 40, a source electrode 39, and a drain electrode 38 of the organic TFT 41 are made of Ag. An organic semiconductor 37 made of triaryl amine polymer forms an active layer. A gate insulation film 34 is made of polyimide. The organic TFTs 41 arranged in a matrix form are covered with an interlayer insulation film 23 containing a silica filler. A lower electrode 43 made of Ag and a dielectric film 42 containing a $BaTiO_3$ filler are stacked on the interlayer insulation film 23. Plural pixel electrodes (320×240 elements) made of Ag are arranged in a matrix form on the dielectric film 42.

The source electrode 39 and the pixel electrode 36 of the organic TFT 41 are connected through a corresponding via hole (via post 13). The lower electrode 43, the dielectric film 42, and the pixel electrode 36 form a capacitor. The capacitor maintains the potential of the pixel electrode 36 when the organic TFT 41 is turned off.

The via post 13 (via hole) formed on the source electrode 39 extends through the interlayer insulation film 23 and the dielectric film 42 and extends outward beyond the surface of the dielectric film 42. The head of the via post 13 extending out of the dielectric film 42 is covered with the pixel electrode 36.

An electrophoresis device 30 is attached on the active matrix drive circuit 31 comprising the organic TFTs 41 to form the flat panel display. In the electrophoresis device 30, microcapsules 28 in which charged graphite particles 26 and $TiO_2$ particles 27 are dispersed in a silicone oil are interposed between the pixel electrodes 36 and an opposed substrate 33 made of polycarbonate. A common transparent electrode 25 made of ITO is disposed on the surface of the opposed substrate 33 in contact with the microcapsule 28.

The flat panel display including the organic TFTs 41 is manufactured with the method described below according to this embodiment.

With use of the inkjet method, the gate electrode 40 having a width of 60 μm is printed with a nano Ag ink on the film substrate 35 having a surface with a silicon oxide film. The substrate 35 is heated in an oven at 180° C. to finish the gate electrode 40.

Then, polyimide is formed onto the gate electrode 40 by the spin coat method and heated in an oven at 180° C., so that the polyimide is imidized to become a gate insulation film 34.

A photomask is placed on the gate insulation film 34 such that ultraviolet rays are irradiated onto only the areas where the source electrode 39 and the drain electrode 38 are to be formed. Thus, the polyimide surface exposed to ultra violet rays is modified. Then, a nano Ag ink is ejected onto the modified polyimide surface using the inkjet method. A heat treatment is performed in an oven at 180° C. to form the source electrode 39 having a width of 100 μm and the drain electrode 38 having a width of 60 μm. The distance between the source electrode 39 and the drain electrode 38 (channel length) is 20 μm.

A solution containing a material of the organic semiconductor 37 is ejected onto the channel area using the inkjet method. A drying process is performed at 100° C. to obtain the organic TFT 41. The organic semiconductor material is a triaryl amine polymer, and is dissolved in toluene, xylene, THF, etc., to be used as an ink.

In the same way as in Embodiment 11, the via post 13 having a diameter of 60 μm is printed with an Ag paste and is heated at 120° C. such that the via post 13 having a height of about 12 μm is formed.

An insulation paste containing a silica filler is printed using the screen printing method, and is cured by heating at 120° C. to form the interlayer insulation film 23. The insulation paste used for printing has a viscosity of 10-50 Pa·s. A first screen mask used for printing the interlayer insulation film 23 has a non-ejection area having a diameter of 100 μm. The printing is performed while the non-ejection area is aligned with the via post 13 on the source electrode 39.

The film thickness of the printed interlayer insulation film 23 is about 5 μm. The head of the via post 13 extends outward beyond the surface of the printed and cured interlayer insulation film 23.

Then, the 80 μm square lower electrode 43 is printed with an Ag paste on the interlayer insulation film 23 using the off-contact screen printing method, and is cured by heating at 120° C. The Ag paste used herein for printing contains Ag particles, acrylic resin, butyl carbitol, etc., and has a viscosity of 10-50 Pa·s. A screen mask used herein for printing is a stainless mesh No. 500 with an emulsion thickness of 1 μm or less.

The 80 μm square lower electrode 43 is printed with the above Ag paste, using the above screen mask and a squeegee having a rubber hardness of 70. The film thickness of the cured lower electrode 43 is about 3 μm.

Then, the dielectric film 42 is printed on the interlayer insulation film 23 and the lower electrode 43 using the off-contact screen printing method, and is cured by heating at 120° C. A dielectric paste used for printing the dielectric film 42 contains a $BaTiO_3$ filler, polyvinyl butyral resin, etc., and has a viscosity of 1-10 Pa·s. A second screen mask used for printing the dielectric film 42 is a stainless mesh No. 325 with an emulsion thickness of 1 μm or less. The second screen mask has a non-ejection area with a diameter of 100 μm sealed by the emulsion. An alignment mark of the second screen mask is aligned with an alignment mark of the via post 13, so that the non-ejection area is positioned on the head of the via post 13. Since a printing machine used herein has a alignment accuracy of ±10 μm, the head of the via post 13 formed on the source electrode 39 is located within the non-ejection area of the second screen mask even with a positioning error.

After the second screen mask is positioned, the dielectric paste is printed using a squeegee having a rubber hardness of 60.

In this embodiment, the print thickness of the dielectric paste is 0.5 μm, and the head of the via post 13 extends outward beyond the surface of the printed dielectric paste by 3-4 μm.

In the off-contact printing, high shear stress is exerted on the dielectric paste when the second screen mask is separated from the film substrate 35. Then, the viscosity of the dielectric paste is lowered. By adjusting the viscosity of the dielectric paste appropriately, the dielectric paste can fill a void between the dielectric paste and the via post 13.

The dielectric paste is cured by heating in an oven at 120° C. to finish the dielectric film 42.

Then, the 250 μm square pixel electrode 36 is printed on the dielectric film 42 using the screen printing method in the way as in Embodiment 11, and is cured by heating at 120° C. to finish the pixel electrode 36. Thus, the active matrix drive circuit 31 (element number: 320×240) comprising the organic TFTs 41 is formed. The head of the via post 13 extending outward beyond the surface of the dielectric film 42 is covered with the pixel electrode 36.

The microcapsules 28 having a thickness of 50 μm, in which the negatively charged graphite particles 26 and the positively charged $TiO_2$ particles 27 are dispersed in the silicone oil, form a single layer on the pixel electrodes 36.

ITO is deposited on the surface of the opposed substrate 33 made of polycarbonate using the sputtering method, and the common transparent electrode 25 is formed by photolithography and etching. The opposed substrate 33 is disposed such that the microcapsules 28 are interposed between the pixel electrodes 36 and the common transparent electrodes 25. The opposed substrate 33 and the film substrate 35 are sealed by an epoxy system adhesive agent. Thus, the flat panel display comprising the organic TFTs 41 is formed.

In order to evaluate the image quality of the flat panel display, full white, full black, and a test pattern were displayed by inputting select signals to all the gate electrodes 40 and data signals to all the drain electrodes 38. Then, it was found that the black reflectance is 4% or less, the white reflectance is 36% or higher, and the contrast is 8 or higher. Accordingly, the image quality of the flat panel display was found to be high. Defective bits were less than ten bits.

After displaying the test pattern, all the select signals and the data signals are cut off in order to evaluate memory properties of the display image. The contrast of the test pattern image did not degrade after one day, and was confirmed that the memory properties were sufficient to be used as electronic papers.

As described above, according to the method of manufacturing the flat panel display of this embodiment, in the process of forming the active matrix drive circuit 31 that drives the electrophoresis device 30, the via post 13 is formed on the source electrode 39, and then the interlayer insulation film 23, the lower electrode 43, the dielectric film 42, and the pixel electrode 36 are formed in this order. Thus, the source electrode 39 and the pixel electrode 36 are connected through the via post 13 having the diameter of 60 μm.

With this configuration, the contact resistance between the organic TFT 41 and the pixel electrode 36 is very low. Therefore, if the organic TFT 41 is turned on by a certain combination of the select signal input to the gate electrode 40 and the data signal input to the drain electrode 38, high potential can be efficiently induced in the pixel electrode 36 connected to the turned-on organic TFT 41 due to very small voltage loss in the via post 13.

The electrophoresis device 30 used in this embodiment is a voltage-drive type display element. Therefore, by using the active matrix drive circuit 31 that includes the via post having very low resistance and can induce a large potential in the pixel electrode 36 as in this embodiment, the flat panel display can produce a clear contrast and provide high quality images although the organic TFT 41 is used in the drive circuit 31.

Since the lower electrode 43, the dielectric film 42, and the pixel electrode 36 are stacked to form a capacitor, the potential of the pixel electrode 36 can be maintained by the capacitor even when the organic TFT 41 has been on is turned off. Accordingly, the flat panel display of this embodiment has good memory properties.

In the flat display panel of Embodiment 11 that does not include the capacitor, the charge is held by the capacity of the gate insulation film 34 of the organic TFT 41 and the interlayer insulation film 23, and it is not easy to balance the switching properties and the charge holding capacity of the organic TFT 41. Therefore, the contrast of the test pattern is lowered after one day, and the memory properties are not sufficient to be used as electronic papers.

In the flat panel display of this embodiment, the switching properties depend on the structure of the organic TFT 41, while the charge holding capacity mainly depends on the capacitor including the lower electrode 43, the dielectric film 42, and the pixel electrode 36. That is, the structure of the organic TFT 41 can be determined mainly in consideration of the switching performance. On the other hand, the charge holding capacity is not related to the TFT structure, can be formed by the area of the lower electrode 43 and the relative dielectric constant of the dielectric film 42, i.e., the relative dielectric constant of the dielectric filler, the amount of the dielectric filler, and the dielectric film thickness. Therefore, flat panel displays having desired structures, and flat panel display having good memory properties can be manufactured more easily.

According to the manufacturing method of this embodiment, via holes having the same size as the via hole of an organic TFT of a well-known active matrix drive circuit formed by photolithography and dry etching or laser drilling can be formed more easily and at lower cost. At present, dots having a diameter as small as 50 μm can be printed with the screen printing method, the diameter of the via hole (via post 13) can be reduced to 50 μm with use of the method of this embodiment.

The film thicknesses of the interlayer insulation film 23, the lower electrode 43, and the dielectric film 42 are adjusted such that the head of the via post 13 extends out of the dielectric film 42 without being covered with the dielectric film 42. Therefore, a via post having good contact resistance can be formed by just forming the pixel electrode 36 directly on the via post 13.

It is to be noted that the film thicknesses of the interlayer insulation film 23, the lower electrode 43, and the dielectric film 42 can be adjusted by paste viscosity, mesh, squeegee rubber hardness, clearance, printing pressure, attack angle, printing speed, etc.

The insulation paste and the dielectric paste are printed using the first and the second screen masks each having the non-ejection area slightly larger than the head of the via post 13 while the non-ejection areas are generally aligned with the head of the via post 13.

Therefore, the air gap between the via post 13 and the insulation paste and between the via post 13 and the dielectric paste can be filled during the leveling by properly controlling the viscoelasticity of the insulation paste and the dielectric paste. Therefore, the frequency of the void remaining between the via post 13 and the interlayer insulation film 23 and between the via post 13 and the dielectric film 42 is lowered, and the flat panel display having long-term reliability can be produced.

In this embodiment, the via post 13, the interlayer insulation film 23, the lower electrode 43, the dielectric film 42, and the pixel electrode 36 are formed using the screen printing and none of the lithography, dry etching, and laser drilling processes is included in the processes after the formation of the organic TFT 41. Therefore, the organic TFT 41 is prevented from thermal and plasma damage and can maintain the switching properties. Also, the flat panel display can be manufactured using a simple and low cost process.

Since photolithography is not used, organic semiconductor materials that are soluble in an organic solvent, such as polythiophene, polyphenylene vinylene, and polyfluorene, can be used. That is, a wider variety of materials can be used according to intended use of the flat panel display.

Although the via post 13 is formed on the source electrode 39 in this embodiment, the via post 13 may alternately be formed on the drain electrode 38 such that the drain electrode 38 and the pixel electrode 36 are connected through the via post 13. In that case, a select signal is input to the gate electrode 40, and a data signal is input to the source electrode 39.

Although the lower electrode 43 and the pixel electrode 36 are formed using the screen printing method in this embodiment, other common printing methods that can match with the design rule of the lower electrode 43 and the pixel electrode 36, such as dispenser methods, inkjet methods, and gravure printing methods, may alternatively be used.

Although the organic TFTs 41 are used as switching elements of the active matrix drive circuit 31 in this embodiment, the manufacturing method and configuration of the via post 13 and the interlayer insulation film 23 are applicable to vertical SITs and diodes.

Although the screen printing method is used for forming the via post 13 in this embodiment, the dispenser method and the inkjet method may alternatively be used for forming the via post 13.

Especially, in the case where the via post 13 is formed using the inkjet method, by forming plural pairs of alignment marks on each end of the substrate in advance in the step of printing the source electrode 39 and sequentially reading the plural pairs of alignment marks, the position of the substrate 12 can be corrected each time a pair of alignment marks is read. Accordingly, the via post 13 can be more accurately aligned with the source electrode 39.

Providing such alignment marks for accurate alignment is effective especially when manufacturing flat panel displays including film substrates.

Embodiment 18

In the same way as in Embodiment 17, an organic TFT 41 having triaryl amine polymer as an active layer is formed on a polycarbonate substrate 35, and a via post 13 is formed on a source electrode 39 using the screen printing method. The via post 13 has a diameter of 60 μm and a height of about 12 μm.

After that, in the same way as in Embodiment 17, an insulation paste is printed using the screen printing method and cured by heating so as to form an interlayer insulation film 23. A first screen mask used herein has a non-ejection area. The design rule of a distance OL between the non-ejection area and the via post 13 with one side is in a range of 10-50 μm.

Then, in the same way as in Embodiment 17, a lower electrode 43, a dielectric film 42, and a pixel electrode 36 are formed on the surface of the interlayer insulation film 23 using the screen printing method. A second screen mask used for printing the dielectric film 42 has a non-ejection area. The design rule of the distance OL between the non-ejection area and the via post 13 with one side is in a range of 10-50 μm. The distances OL of the first screen mask is equal to the distance OL of the second screen mask.

It is to be noted that active matrix drive circuits 31 were prepared with the above described method, wherein the distance OL between the non-ejection area and the via post 13 with one side was changed in a range of 0-100 μm for evaluation purposes. One thousand via posts 13 were then randomly selected and observed with a supersonic microscope in the same way as in Embodiment 11. This observation was performed for every different distance OL. Based on the results of this observation with the supersonic microscope and a defective bit evaluation (described below), the distance OL in a range of 10-50 μm is selected. Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

As mentioned above, the defective bit evaluation was performed in which full white, full black, and a test pattern were displayed by inputting select signals to all the gate electrodes 40 and data signals to all the drain electrodes 38. The results are shown in the table of FIG. 14. In the table of FIG. 14, ○ indicates that there are less than 10 defective bits; Δ indicates that there are 10 or more but less than 100 defective bits; and X indicates that there are 100 or more defective bits.

When the distance OL was in a range of 10-100 μm, there were very few defective bits, and high quality images were produced. However, when the distance OL was in a range of 60-100 μm, voids were found in 4-39 out of the one thousand via holes.

From the above results, the distance OL in a range of 10-50 μm is found to be preferable and selected for the manufacturing method of this embodiment. However, since the flat panel display in which the diameter of the via hole 13 is 60 μm and the distance OL is in a range of 60-100 μm has very few defective bits, the distance OL may be in the range of 60-100 μm in this embodiment if the size of the void satisfies the specification of the target flat display panel.

Embodiment 19

Figure 15A:
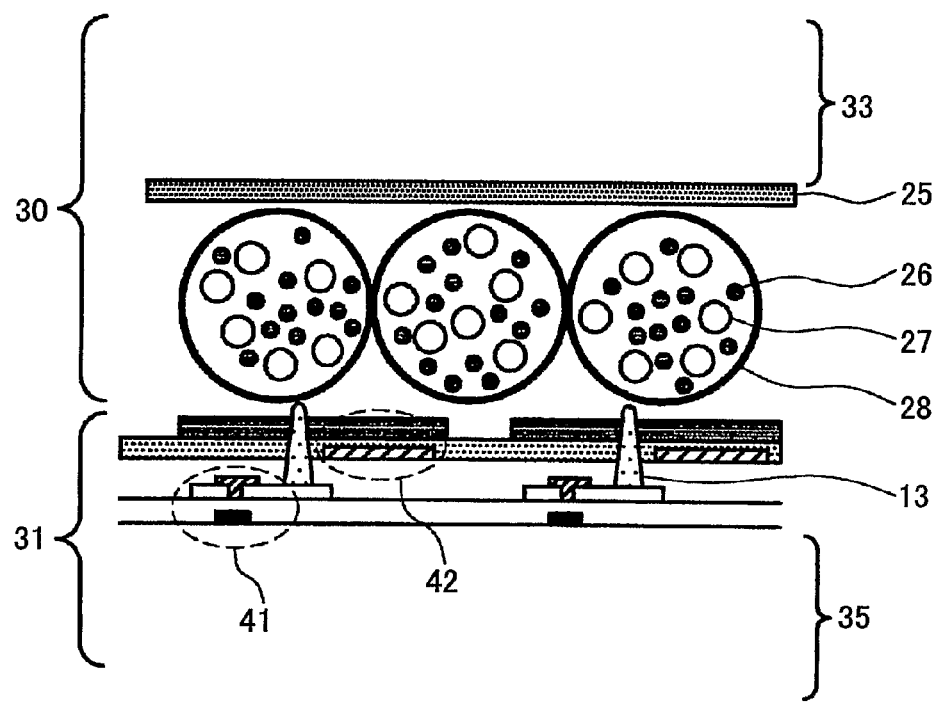
FIGS. 15A and 15B illustrate a flat panel display according to Embodiment 19 of the present invention.
Figure 15B:
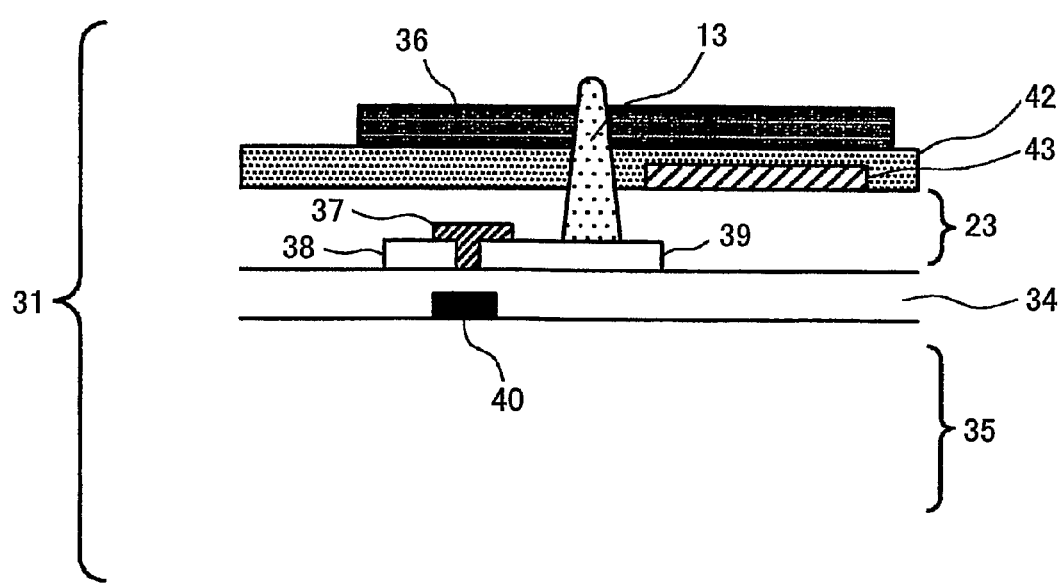
Figure 16:
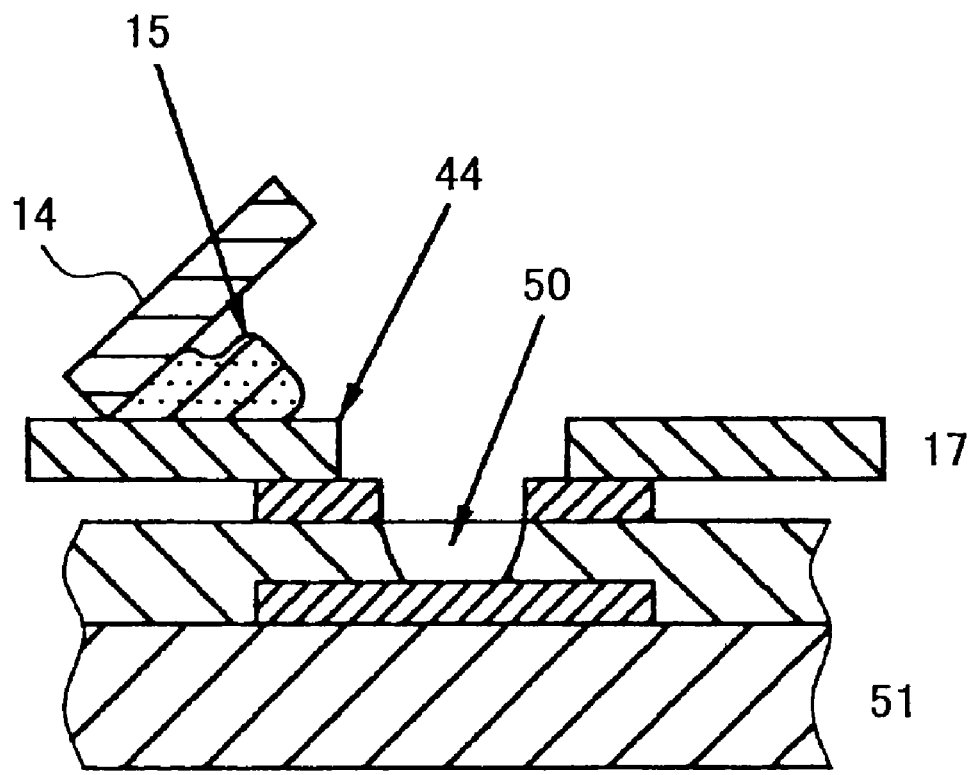
FIG. 16 is a cross-sectional view illustrating a related art printed wiring board.
Figure 17:
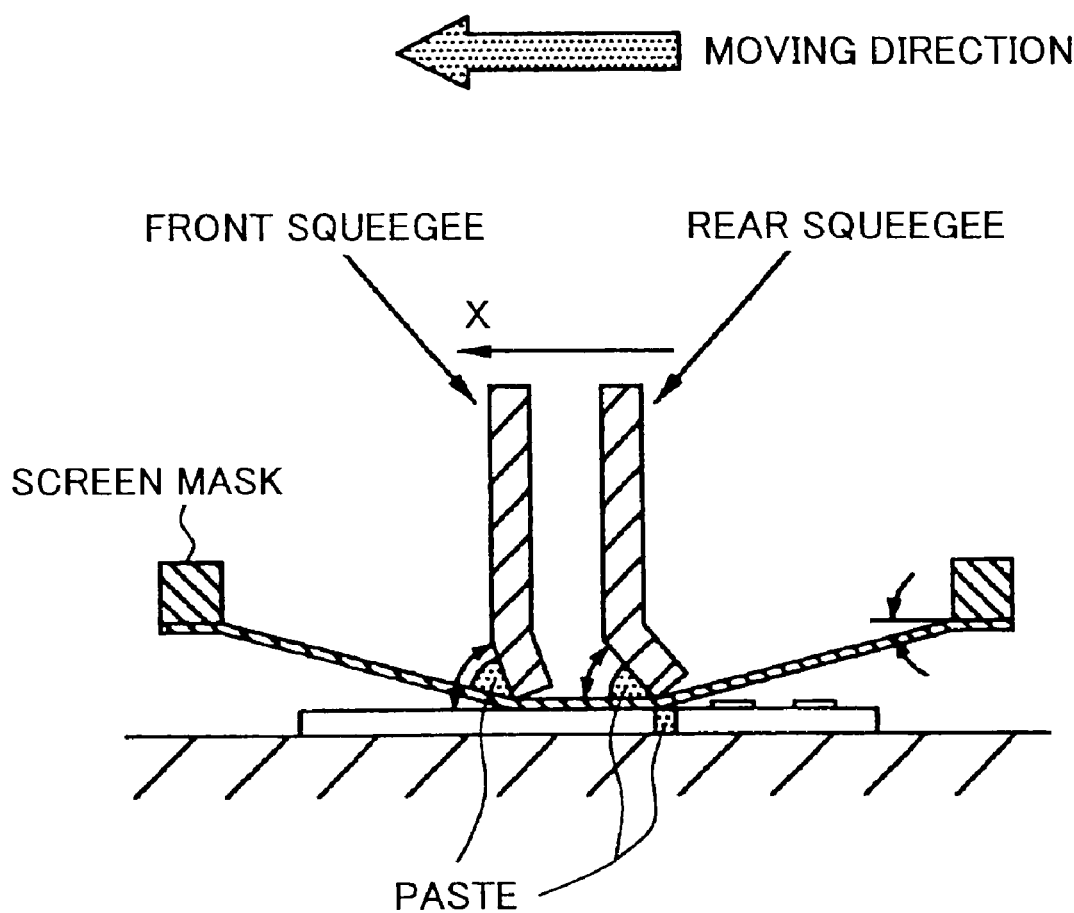
FIG. 17 illustrates a related art method of filling small via holes.
Figure 18A:
FIGS. 18A-18E illustrate a method of connecting upper metal wiring elements and lower metal wiring elements through-small via holes.
Figure 18B:
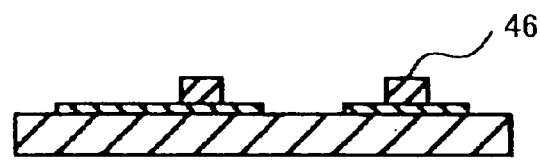
Figure 18C:
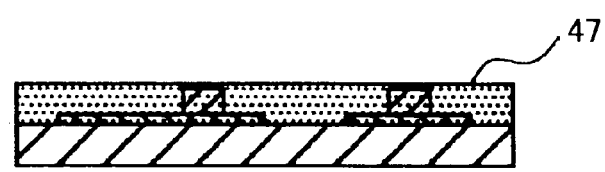
Figure 18D:
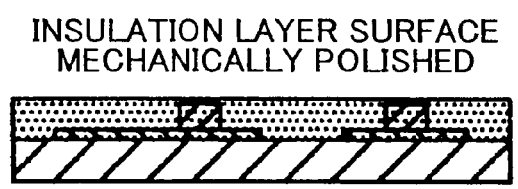
Figure 18E:
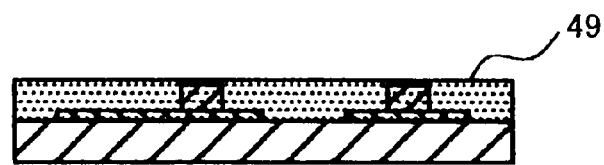

The following describes Embodiment 15 with reference to FIGS. 15A and 15B.

In the same way as in Embodiment 17, an organic TFT 41 having triaryl amine polymer as an active layer is formed on a polycarbonate substrate 35, and a via post 13 is formed on a source electrode 39 using the screen printing method. The via post 13 has a diameter of 60 μm and a height of about 12 μm.

After that, in the same way as in Embodiment 17, an insulation paste is printed using the screen printing method and cured by heating so as to form an interlayer insulation film 23. Then, in the same way as in Embodiment 17, a lower electrode 43 and a dielectric film 42 are formed on the surface of the interlayer insulation film 23 using the screen printing method. Each of first and second screen masks used herein has a non-ejection area. The design rule of a distance OL between the non-ejection area and the via post 13 is 20 μm. The head of the cured via post 13 extends outward beyond the surface of the dielectric film 42 by 3-4 μm.

Then, a 250 μm square pixel electrode 36 is printed with a conductive ink on the surface of the dielectric film 42 using the screen printing method. The conductive ink used herein is a nano Ag ink having a viscosity of 10-15 Pa·S. Then, only the vicinity of the pixel electrode 36 is heated at 180° C. by an RTA so as to finish the pixel electrode 36. The film thickness of the pixel electrode 36 is about 0.5 μm, and the via post 13 extending outward beyond the surface of the dielectric film 42 extends through the pixel electrode 36.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

The same observation and evaluation as in Embodiment 17 were performed on the flat panel display of this embodiment, and the flat panel display of this embodiment was found to produce high quality images and have memory properties sufficient to be used as electronic papers.

According to this embodiment, in the process of forming the active matrix drive circuit 31 that drives the electrophoresis device 30, the via post 13 is formed on the source electrode 39, and then the interlayer insulation film 23, the lower electrode 43, the dielectric film 42, and the pixel electrode 36 are formed in this order. Thus, the source electrode 39 and the pixel electrode 36 are connected through the via post 13 having the diameter of 60 μm. That is, the active matrix drive circuit 31 having low contact resistance can be manufactured using a simple and low cost process.

The electrophoresis device 30 used in this embodiment is a voltage-drive type display element. Therefore, by using the active matrix drive circuit 31 described in this embodiment, the flat panel display can provide high quality images although the organic TFT 41 is used.

Even when the organic TFT 41 that has been on is turned off, the potential of the pixel electrode 36 can be maintained by a capacitor including the lower electrode 43, the dielectric film 42, and the pixel electrode 36. Accordingly, the flat panel display of this embodiment has good memory properties.

Embodiment 20

In the same way as in Embodiment 17, an organic TFT 41 having triaryl amine polymer as an active layer is formed on a polycarbonate substrate 35, and a via post 13 is formed on a source electrode 39 using the screen printing method. The via post 13 has a diameter of 60 μm and a height of about 12 μm.

Then, in the same way as in Embodiment 17, an insulation paste is printed using the screen printing method. A first screen mask used herein has a non-ejection area. A distance OL between the non-ejection area and the via post 13 is 20 μm. The film thickness of the printed interlayer insulation film 23 is about 5 μm.

Then, the polycarbonate substrate 35 on which the insulation paste (interlayer insulation film 23) is printed is heated at a temperature lower than a curing temperature (120° C. in this embodiment) of the insulation paste. In this embodiment, the polycarbonate substrate 35 is heated in an oven at 50° C. for 10 minutes.

After that, the interlayer insulation film 23 is cured by heating at 120° C. Then, in the same way as in Embodiment 17, a lower electrode 43 is formed on the surface of the interlayer insulation film 23 using the screen printing method.

Then, a dielectric film 42 is printed on the interlayer insulation film 23 and the lower electrode 43 using the screen printing method. A second screen mask used for printing the dielectric film 42 also has a non-ejection area. A distance OL between the non-ejection area and the via post 13 is 20 μm.

Then, the polycarbonate substrate 35 on which the dielectric paste (dielectric film 42) is printed is heated at a temperature lower than a curing temperature (120° C. in this embodiment) of the dielectric paste. In this embodiment, the polycarbonate substrate 35 is heated in an oven at 50° C. for 10 minutes.

The dielectric paste is then cured by heating at 120° C. so as to form the dielectric film 42.

The head of the via post 13 remains extending outward beyond the surface of the dielectric film 42 even after the process of curing the dielectric paste.

Then, the 250 μm square pixel electrode 36 is printed on the dielectric film 42 using the screen printing method, and is cured by heating at 120° C. Thus, the active matrix drive circuit 31 is formed.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

The same observation and evaluation as in Embodiment 17 were performed on the flat panel display of this embodiment, and the flat panel display of this embodiment was found to produce high quality images and have memory properties sufficient to be used as electronic papers.

According to this embodiment, the via post 13 is formed on the source electrode 39, and the interlayer insulation film 23 is printed using the first screen mask having the non-ejection area slightly larger than the head of the via post 13 while the non-ejection area is generally aligned with the head of the via post 13. Then the polycarbonate substrate 35 is heated at a temperature lower than the curing temperature of the interlayer insulation film 23 (insulation paste). The viscosity of the insulation paste is lowered due to heat, so that the insulation paste fills a void present at the interface with the via post 13.

Further, according to this embodiment, after the interlayer insulation film 23 is cured, the lower electrode 43 is formed on the interlayer insulation film 23. Then, the dielectric film 42 is printed using the second screen mask having the non-ejection area slightly larger than the head of the via post 13 while the non-ejection area is generally aligned with the head of the via post 13. Then the polycarbonate substrate 35 is heated at a temperature lower than the curing temperature of the dielectric film 42 (dielectric paste). The viscosity of the dielectric paste is lowered due to heat, so that the dielectric paste fills the void present at the interface with the via post 13.

Therefore, the frequency of the void remaining between the via post 13 and the interlayer insulation film 23 and between the via post 13 and the dielectric film 42 is further lowered. That is, the flat panel display of this embodiment has a higher long-term reliability than the flat panel displays of Embodiments 17-19.

In this embodiment, the printed insulation paste is heated at the temperature lower than the curing temperature of the insulation paste such that the void between the via post 13 and the interlayer insulation film 23 is filled with the insulation paste. Further, the printed dielectric paste is heated at the temperature lower than the curing temperature of the dielectric paste such that the void between the via post 13 and the dielectric film 42 is filled with the dielectric paste. Thus, the void present between the via post 13 and the interlayer insulation film 23 and between the via post 13 and the dielectric film 42 is reduced. However the void between the via post 13 and the interlayer insulation film 23 and between the via post 13 and the dielectric film 42 can be reduced by heating the printed insulation paste at the temperature lower than the curing temperature of the insulation paste and simply curing the printed dielectric paste, or by simply curing the printed insulation paste and heating the printed dielectric paste at a temperature lower than the curing temperature of the dielectric paste. That is, the heating process after the printing process of the insulation ink and the heating process after the printing process of the dielectric ink may be selectively added according to the target reliability and costs of the flat panel display.

Although the screen printing method is used for forming the via post 13 in this embodiment, the dispenser method and the inkjet method may alternatively be used for forming the via post 13 as in some of the other embodiments.

Embodiment 21

The following describes Embodiment 21, again with reference to FIGS. 13A and 13B.

In the same way as in Embodiment 17, an organic TFT 41 having triaryl amine polymer as an active layer is formed on a polycarbonate substrate 35, and a via post 13 is formed on a source electrode 39 using the screen printing method. The via post 13 has a diameter of 60 μm and a height of about 12 μm.

Then, an interlayer insulation film 23 is formed on the organic TFT 41 using the inkjet method. An insulation ink used herein for printing contains polyvinyl butyral, a dispersing agent, etc., and has a viscosity of 5-50 Pa·s.

More specifically describing the above process, the substrate 35 is positioned while reading an alignment mark of the via post 13 by a CCD camera of an inkjet machine. Then, printing data of an interlayer insulation film 23 are input to the inkjet machine, and printing is performed by ejecting the insulation ink from an ejection head.

To prevent the insulation ink from being printed to the head of the via post 13, an area slightly larger than the outer circumference of the via post 13 is determined as a non-print area (area not to be printed) in view of the inclination of the ejection head, ink destination accuracy, and alignment accuracy of the inkjet machine. In this embodiment, the non-print area is the area inside the outer circumference of the via post 13 and the area extending outward by 20 μm around the outer circumference of the via post 13.

Since the interlayer insulation film 23 having a target thickness cannot be formed by one ejection with the inkjet method, the insulation ink is ejected onto the same spot two or more times until the interlayer insulation film 23 has the target thickness.

The insulation ink is cured by heating at 120° C. to finish the interlayer insulation film 23.

After that, in the same way as in Embodiment 17, a lower electrode 43 is formed on the surface of the interlayer insulation film 23 using the screen printing method. Then, a dielectric film 42 is printed by the inkjet printing method. A dielectric ink used herein for printing contains a $BaTiO_3$ filler, polyvinyl butyral, a dispersing agent, etc., and has a viscosity of 5-50 Pa·S.

More specifically describing the above process, the substrate 35 is positioned while reading an alignment mark of the via post 13 by a CCD camera of an inkjet machine. Then, printing data of a dielectric film 42 are input to the inkjet machine, and printing is performed by ejecting the dielectric ink from an ejection head.

To prevent the dielectric ink from being printed to the head of the via post 13, an area slightly larger than the outer circumference of the via post 13 is determined as a non-print area (area not to be printed) based on the inclination of the ejection head, ink destination accuracy, and alignment accuracy of the inkjet machine. In this embodiment, the non-print area is the area inside the outer circumference of the via post 13 and the area extending outward by 20 μm around the outer circumference of the via post 13.

The dielectric ink is cured by heating at 120° C. to finish the dielectric film 42. The thicknesses of the interlayer insulation film 23, the lower electrode 43, and the dielectric film 42 are adjusted such that the head of the via post 13 extends outward beyond the surface of the printed dielectric film 42. The film thicknesses of the interlayer insulation film 23 and the dielectric film 42 can be adjusted by ink viscosity, the number of ejections, printing speed, etc., while the film thickness of the lower electrode 43 can be adjusted by paste viscosity, mesh, squeegee rubber hardness, clearance, printing pressure, attack angle, printing speed, etc.

Then, in the same way as in Embodiment 17, a pixel electrode 36 is formed on the surface of the dielectric film 42 using the screen printing method. Thus, the active matrix drive circuit 31 is formed. The head of the via post 13 extending out of the dielectric film 42 is covered with the pixel electrode 36.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

In order to evaluate the image quality of the flat panel display, full white, full black, and a test pattern were displayed by inputting select signals to all the gate electrodes 40 and data signals to all the drain electrodes 38 in the same way as in Embodiment 17.

Then, it was found that the black reflectance is 5% or less, the white reflectance is 36% or higher, and the contrast is 7 or higher. Accordingly, the image quality of the flat panel display was found to be high. Defective bits were less than ten bits.

After displaying the test pattern, all the select signals and the data signals are cut off in order to evaluate memory properties of the display image. The contrast of the test pattern image did not degrade after one day, and was confirmed that the memory properties were sufficient to be used as electronic papers.

As described above, according to the manufacturing method of this embodiment, after the via post 13 is formed of the source electrode 39, the interlayer insulation film 23 is formed with the inkjet method. Then, the lower electrode 43 is formed, and the dielectric film 42 is formed with the inkjet method. The film thicknesses of the interlayer insulation film 23, the lower electrode 43, and the dielectric film 42 are adjusted such that the head of the via post 13 extends outward beyond the surface of the dielectric film 42. Therefore, the via hole (via post 13) having very low contact resistance can be formed by only printing and curing the pixel electrode 36 directly on the via post 13, and a large potential can be induced in the pixel electrode 36 as in Embodiment 17. That is, the flat panel display can produce high quality images.

Since the lower electrode 43, the dielectric film 42, and the pixel electrode 36 form a capacitor, the potential of the pixel electrode 36 can be maintained by the capacitor even when the organic TFT 41 that has been on is turned off. Accordingly, the flat panel display of this embodiment has good memory properties.

When the interlayer insulation film 23 and the dielectric film 42 that do not require pattern forming as in this embodiment are printed with the inkjet method, inks having relatively low viscosity can be used. When such inks are ejected except on the non-print area slightly larger than the outer circumference of the via post 13, the ejected inks are easily spread on the source electrode 39 and can fill the void between the via post 13 and the inks.

Accordingly, the flat panel display having high long-term reliability can be formed.

According to the manufacturing method of this embodiment, after forming an organic semiconductor 37, the via post 13, the lower electrode 43, and the pixel electrode 36 are formed with the screen printing method and the interlayer insulation film 23 and the dielectric film 42 are formed with the inkjet method. That is, none of the lithography, dry etching, and laser drilling processes is included in the processes after the formation of the organic semiconductor 37. Therefore, the organic TFT 41 is prevented from thermal and plasma damage and can maintain the switching properties.

Since photolithography is not used, organic semiconductor materials that are soluble in an organic solvent can be used. That is, a wider variety of materials can be used according to intended use of the flat panel display.

Although the interlayer insulation film 23 and the dielectric film 42 are printed using the inkjet method in this embodiment, the dispenser method that ejects ink droplets may alternatively be used for printing the interlayer insulation film 23 and the dielectric film 42. Even in that case, the same effects can be obtained.

Further, even if either one of the interlayer insulation film 23 or the dielectric film 42 is printed using the screen printing method as in Embodiment 17, the same effects can be obtained.

Although the screen printing method is used for forming the via post 13 in this embodiment, the dispenser method and the inkjet method may alternatively be used for forming the via post 13.

Embodiment 22

In the same way as in Embodiment 21, an organic TFT 41 having triaryl amine polymer as an active layer is formed on a polycarbonate substrate 35, and a via post 13 is formed on a source electrode 39 using the screen printing method. The via post 13 has a diameter of 60 μm and a height of about 12 μm.

Then, in the same way as in Embodiment 21, an insulation paste is printed using the inkjet method.

To prevent the insulation ink from being printed to the head of the via post 13, an area slightly larger than the outer circumference of the via post 13 is determined as a non-print area (area not to be printed) in view of the inclination of the ejection head, ink destination accuracy, and alignment accuracy of the inkjet machine. In this embodiment, the non-print area is the area inside the outer circumference of the via post 13 and the area extending outward by 20 μm around the outer circumference of the via post 13.

Since the interlayer insulation film 23 having a target thickness cannot be formed by one ejection with the inkjet method, the insulation ink is ejected onto the same spot two or more times until the interlayer insulation film 23 has the target thickness.

Then, the polycarbonate substrate 35 on which the insulation ink is printed is heated at a temperature lower than a curing temperature (120° C. in this embodiment) of the insulation ink. In this embodiment, the polycarbonate substrate 35 is heated in an oven at 50° C. for 10 minutes.

After that, the interlayer insulation film 23 is cured by heating at 120° C. Then, in the same way as in Embodiment 21, a lower electrode 43 is formed on the surface of the interlayer insulation film 23 using the screen printing method.

Then, a dielectric film 42 is printed on the interlayer insulation film 23 and the lower electrode 43 using the inkjet method. To prevent the dielectric ink from being printed to the head of the via post 13 while printing the dielectric film 42, an area slightly larger than the outer circumference of the via post 13 is determined as a non-print area (area not to be printed) based on the inclination of the ejection head, ink destination accuracy, and alignment accuracy of the inkjet machine. In this embodiment, the non-print area is the area inside the outer circumference of the via post 13 and the area extending outward by 20 μm around the outer circumference of the via post 13.

Then, the polycarbonate substrate 35 on which the dielectric ink (dielectric film 42) is printed is heated at a temperature lower than a curing temperature (120° C. in this embodiment) of the dielectric ink. In this embodiment, the polycarbonate substrate 35 is heated in an oven at 50° C. for 10 minutes.

The dielectric ink is then cured by heating at 120° C. so as to form the dielectric film 42. The head of the via post 13 remains extending outward beyond the surface of the dielectric film 42 even after the process of curing the dielectric ink.

Then, the 250 μm square pixel electrode 36 is printed on the dielectric film 42 using the screen printing method, and is cured by heating at 120° C. Thus, the active matrix drive circuit 31 is formed.

Then, an electrophoresis device 30 that includes microcapsules 28 containing graphite particles 26 and $TiO_2$ particles 27 is attached to the active matrix drive circuit 31, so that the flat panel display comprising the organic TFTs 41 is formed.

The same observation and evaluation as in Embodiment 21 were performed on the flat panel display of this embodiment, and the flat panel display of this embodiment was found to produce high quality images and have memory properties sufficient to be used as electronic documents.

According to this embodiment, the via post 13 is printed on the source electrode 39, and then the interlayer insulation film 23 is printed with the inkjet method. After that, the polycarbonate substrate 35 is heated at a temperature lower than the curing temperature of the interlayer insulation film 23 (insulation ink). The viscosity of the insulation ink is lowered due to heat, so that the insulation ink fills the void present at the interface with the via post 13.

After the interlayer insulation film 23 is cured, the lower electrode 43 is formed on the interlayer insulation film 23. Then, the dielectric film 42 is printed using with the inkjet method, and the polycarbonate substrate 35 is heated at a temperature lower than the curing temperature of the dielectric film 42 (dielectric ink). The viscosity of the dielectric ink is lowered due to heat, so that the dielectric ink fills the void present at the interface with the via post 13.

Therefore, the frequency of the void remaining between the via post 13 and the interlayer insulation film 23 and between the via post 13 and the dielectric film 42 is further lowered. That is, the flat panel display of this embodiment has a higher long-term reliability than the flat panel display of Embodiment 21.

In this embodiment, the printed insulation ink is heated at a temperature lower than the curing temperature of the insulation ink such that the void between the via post 13 and the interlayer insulation film 23 is filled with the insulation ink. Further, the printed dielectric ink is heated at the temperature lower than the curing temperature of the dielectric ink such that the void between the via post 13 and the dielectric film 42 is filled with the dielectric ink. Thus, the void present between the via post 13 and the interlayer insulation film 23 and between the via post 13 and the dielectric film 42 is reduced. However the void between the via post 13 and the interlayer insulation film 23 and between the via post 13 and the dielectric film 42 can be reduced by heating the printed insulation ink at the temperature lower than the curing temperature of the insulation ink and simply curing the printed dielectric ink, or by simply curing printed insulation ink and heating the printed dielectric ink at the temperature lower than the curing temperature of the dielectric ink. That is, the heating process after the printing process of the insulation ink and the heating process after the printing process of the dielectric ink may be selectively added according to the target reliability and costs of the flat panel display.

Although the screen printing method is used for forming the via post 13 in this embodiment, the dispenser method and the inkjet method may alternatively be used for forming the via post 13 as in some of the other embodiments.

In this embodiment, as in Embodiment 21, the interlayer insulation film 23 and the dielectric film 42 may be printed with the dispenser method in place of the inkjet method. Further, one of the interlayer insulation film 23 or the dielectric film 42 may be printed with the screen printing method as mentioned in Embodiment 21.

Embodiment 23

Figure 20:
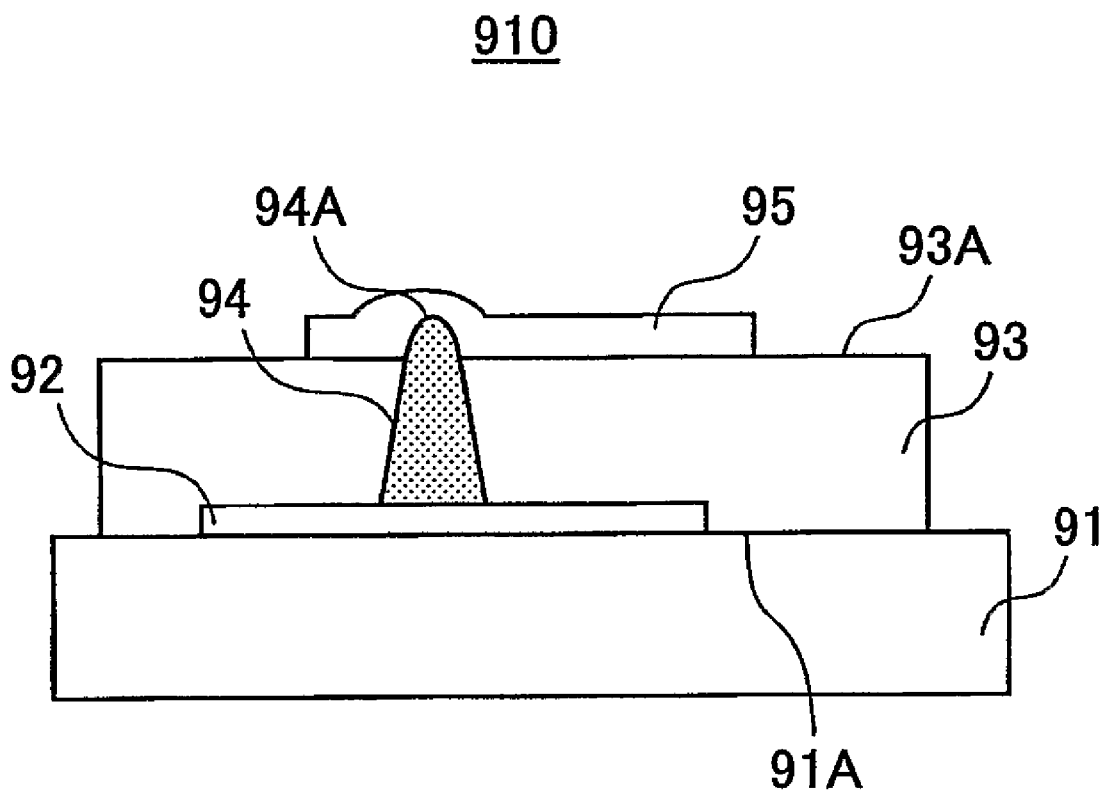
FIG. 20 is a cross-sectional view schematically showing a multilayer wiring structure according to Embodiment 23 of the present invention.

FIG. 20 is a cross-sectional view schematically showing a multilayer wiring structure 910 according to Embodiment 23 of the present invention. Referring to FIG. 20, the multilayer wiring structure 910 of Embodiment 23 comprises a first metal wiring element 92, an interlayer insulation film 93, a dielectric post 94, and a second metal wiring element 95.

The first metal wiring element 92 is formed on a first principle surface 91A of a substrate 91 by screen printing. The interlayer insulation film 93 is formed on the first principle surface 91A of the substrate 91 by screen printing so as to cover the first metal wiring element 92.

The dielectric post 94 is generally columnar, and is formed on the first metal wiring element 92 by screen printing so as to extend through the interlayer insulation film 93. A top portion 94A of the dielectric post 94 extends upward relative to a first principle surface 93A of the interlayer insulation film 93. In other words, the height of the dielectric post 94 is greater than the thickness of the interlayer insulation film 93. The second metal wiring element 95 is formed on the first principle surface 93A of the interlayer insulation film 93 by screen printing so as to cover the top portion 94A of the dielectric post 94.

Although FIG. 20 shows only one first metal wiring element 92 and one second metal wiring element 95, there are actually more than one first metal wiring element 92 and more than one second metal wiring element 95.

The substrate 91 is made of glass. Each of the first and second metal wiring elements 92 and 95 is made of silver (Ag), and has a line width of 50 µm. The interlayer insulation film 93 is made of a silica-based insulating material. The dielectric post 94 is made of barium titanate ($BaTiO_3$).

The film thickness of the first metal wiring element 92 is about 6 µm, whereas the film thickness of the interlayer insulation film 93 is about 4 µm. The height of the dielectric post 94 is about 6 µm, and the film thickness of the second metal wiring element 95 is about 6 µm.

Accordingly, the height of the dielectric post 94 having a columnar shape is greater than the thickness of the interlayer insulation film 93 in the multilayer wiring structure 910.

In the multilayer wiring structure 910, the first metal wiring element 92, the dielectric post 94, and the second metal wiring element 95 form a capacitor. Specifically, the first metal wiring element 92 and the second metal wiring element 95 form a lower electrode and an upper electrode, respectively, of the capacitor. That is, the multilayer wiring structure 910 is an embedded-capacitor multilayer wiring structure. The area of each of the lower and upper electrodes is 50 µm×80 µm.

FIGS. 21A-21E illustrate a method of manufacturing the multilayer wiring structure 910 of FIG. 20. Referring to FIGS. 21A-21E, the first metal wiring element 92 is formed on the substrate 91 by screen printing. A conductive paste used herein for screen printing is an Ag paste. The Ag paste contains Ag fillers, acrylic resin, carbitol acetal, etc., and has a viscosity in a range of 150-250 Pa·s. A screen mask used herein for screen printing is a stainless mesh No. 500 with an emulsion thickness of 8 µm.

The first metal wiring element 92 having a width of 50 µm is printed on the substrate 91 with the above Ag paste using the above screen mask and a squeegee having a rubber hardness of 70. After the printing, the Ag paste is cured by heating in an oven at 200° C. for 30 minutes so as to finish the first metal wiring element 92 (see Step A1 of FIG. 21A).

Then, the dielectric post 94 having a columnar shape is formed on the lower electrode (first metal wiring element 92) by screen printing. A dielectric paste used herein for screen printing is a $BaTiO_3$ paste. The $BaTiO_3$ paste contains $BaTiO_3$ fillers, acrylic resin, butyl carbitol, etc., and has a viscosity in a range of 200-300 Pa·s. A screen mask used herein for screen printing is a stainless mesh No. 500 with an emulsion thickness of 5 µm. This screen mask has an ejection hole that is not sealed by the emulsion.

An alignment mark of this screen mask is aligned with an alignment mark of the first metal wiring element 92. Then, the dielectric paste is applied onto the first metal wiring element 92 using a squeegee with a rubber hardness of 70. After that, the dielectric paste is cured by heating in an oven at 200° C. for 30 minutes to obtain the dielectric post 94 on the first metal wiring element 92 (see Step B1 of FIG. 21B).

The dielectric post 94 is slightly tapered, and has a height of about 6 µm.

Then, the interlayer insulation film 93 is formed on the first metal wiring element 92 by off-contact screen printing. An insulation paste used herein for screen printing includes a silica filler, cresol novolac epoxy resin, epoxy resin, and butyl cellosolve acetate, etc., and has a viscosity in a range of 50-150 Pa·s. A screen mask 920 used herein for screen printing is a stainless mesh No. 500 with an emulsion thickness of 1 µm. This screen mask 920 has a non-ejection area 921 of 110 µm×140 µm that is sealed by the emulsion.

An alignment mark of the screen mask 920 is aligned with an alignment mark at the same layer as the dielectric post 94 on the substrate, so that the non-ejection area 921 is positioned on the top portion 94A of the dielectric post 94. Since a printing machine used herein has an alignment accuracy of ±10 µm, the top portion 94A of the dielectric post 94 formed on the first metal wiring element 92 is located within the non-ejection area 921 of the screen mask 920 even with a positioning error.

An insulation paste 930 is put on the screen mask 920, and then applied onto the first metal wiring element 92 while moving a squeegee 940 having a rubber hardness of 60 in the direction of an arrow 911 (see Step C1 in FIG. 21C).

Figure 22:
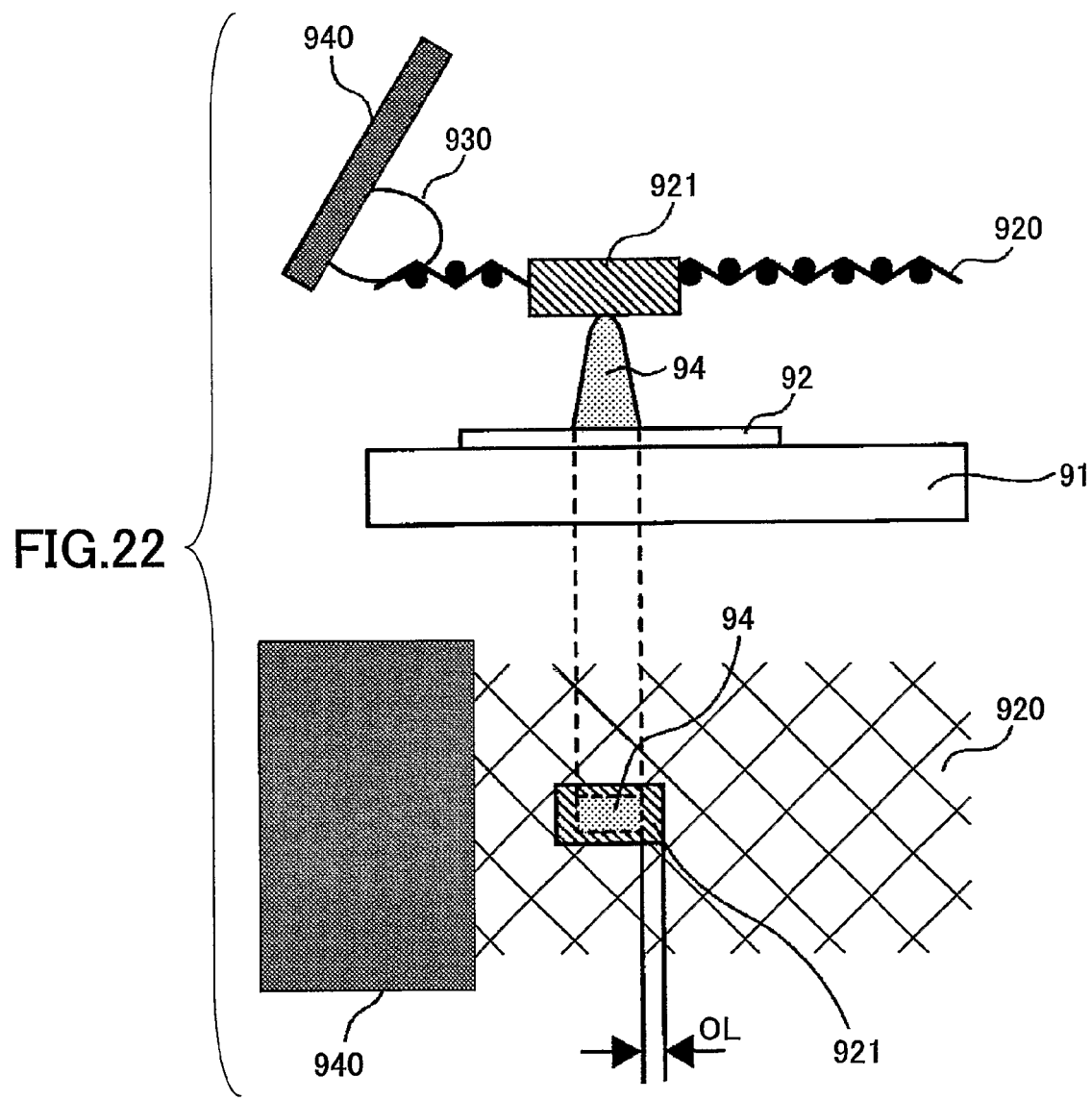
FIG. 22 shows a positional relationship between a dielectric post and a non-ejection area in Step C1 of FIG. 21C.

FIG. 22 shows a positional relationship between the dielectric post 94 and the non-ejection area 921 in Step C1 of FIG. 21C. Referring to FIG. 22, the design rule of a distance OL between an edge of the dielectric post 94 and an edge of the non-ejection area 921 is 20 rpm. Therefore, even if the non-ejection area 921 with one side is positioned with a alignment error (±10 µm), since the design value of the distance OL between the edge of the dielectric post 94 and the edge of the non-ejection area 921 is 20 µm, the dielectric post 94 is located within the non-ejection area 921 of the screen mask 920.

Referring back to FIG. 21C, the insulation paste 930 is applied onto the first metal wiring element 92 in Step C1. Then, the insulation paste 930 is cured by heating in an oven at 200° C. for 30 minutes to obtain the interlayer insulation film 93 on the substrate 91, covering the first metal wiring element 92 (see Step D1 of FIG. 21D).

The film thickness of the interlayer insulation film 93 is 4 µm, and the height of the dielectric post 94 is 6 µm. Accordingly, the top portion 94A of the dielectric post 94 extends beyond the interlayer insulation film 93 by 2 µm. The insulation paste 930 shrinks little in volume upon the heating at 200° C. for 30 minutes, so that the top portion 94A of the dielectric post 94 remains extending beyond the interlayer insulation film 93 by 2 µm even after the interlayer insulation film 93 is cured.

After the interlayer insulation film 93 is formed, the second metal wiring element 95 is formed on the interlayer insulation film 93 by screen printing so as to cover the top portion 94A of the dielectric post 94. A conductive paste used herein for screen printing is the same Ag paste as used for the first metal wiring element 92. A screen mask used herein for screen printing is a stainless mesh No. 500 with an emulsion thickness of 5 µm.

An alignment mark of this screen mask is aligned with an alignment mark at the same layer as the dielectric post 94 on the substrate, so that the second metal wiring element 95 is positioned on the top portion 94A of the dielectric post 94.

The Ag paste having a width of 50 µm is applied using the above screen mask and a squeegee having a rubber hardness of 70. The applied Ag paste is cured by heating in an oven at 200° C. for 30 minutes so as to obtain the second metal wiring element 95 (see Step E1 of FIG. 21E).

The film thickness of the second metal wiring element 95 is about 6 µm, and the top portion 94A of the dielectric post 94 extending out of the interlayer insulation film 93 is covered with the second metal wiring element 95.

FIGS. 23A-23C illustrate Step C1 of FIG. 21C in greater detail. Referring to FIG. 23A-23C, the screen mask 920 is positioned such that the non-ejection area 921 is located on the dielectric post 94. Then, the insulation paste 930 is applied onto the substrate 91 while moving the squeegee 940 in the direction of the arrow 911.

Thus, an insulation paste 931 is formed around the dielectric post 94, but an air gap 912 remains between the insulation paste 931 and the dielectric post 94 by non-ejection area 921. Therefore, an air gap 912 is formed between the insulation paste 931 and the dielectric post 94 (see Step C1-1 in FIG. 23A).

Generally, in off-contact screen printing, a large share stress is exerted on the paste upon separating the screen mask 920 from the substrate 91, so that the viscosity of the paste is lowered. As a result, the paste is leveled. If the insulation paste 930 has appropriate viscosity, the insulation paste 930 is fluidized and fills the air gap 912 when the screen mask 920 is separated from the substrate 91.

The insulation paste 930 used in this embodiment has a TI, which is an indication of viscoelasticity, of 2.2-4.0. A TI measurement was performed at 10 rpm and 50 rpm using a Brookfield HBT No. 14 spindle.

When the squeegee 940 is further moved in the direction of the arrow 911, the insulation pastes 931 and 932 are formed around the dielectric post 94. The insulation pastes 931 and 932 fill the void around the dielectric post 94 (see Step C1-2 of FIG. 23B).

When the squeegee 940 is further moved in the direction of the arrow 911, an insulation paste 933 in contact with the dielectric post 94 is formed on the substrate 91 (see Step C1-3 of FIG. 23C).

In this way, although the size of the non-ejection area 921 of the screen mask 920 is larger than the size of the dielectric post 94, the insulation pastes 931 and 932 applied through an ejection area of the screen mask 920 fill the void between the dielectric post 94 and the insulation pastes 931 and 932 so as to form the insulation paste 933 in contact with the dielectric post 94 on the substrate 91 with the use of the insulation paste 930 having appropriate viscosity.

Since the interlayer insulation film 93 is printed on the substrate 91 with the insulation paste 30 using the screen mask 20 of stainless mesh No. 500 and the squeegee 940 having a rubber hardness of 60 at an attack angle of 70 degrees, the interlayer insulation film 93 having a film thickness less than the height of the dielectric post 94 can be formed.

If the attack angle is smaller, a greater amount of the insulation paste 930 is applied onto the substrate 91 through the ejection area of the screen mask 920 and therefore the relative thickness of the interlayer insulation film 93 is increased. When the attack angle is 70 degrees, the film thickness of the interlayer insulation film 93 is smaller than the height of the dielectric post 94.

There are stainless meshes with various different mesh numbers. The stainless meshes having the number closer to 500 are used for smaller size dielectric posts 94.

The thickness of the interlayer insulation film 93 can be controlled by selecting the mesh number of the stainless mesh, the attack angle, etc. In this embodiment, the interlayer insulation film 93 having a thickness less than the height of the dielectric post 94 can be formed by using the stainless mesh with the above number and by using the above attack angle.

Although the design value of the distance OL of FIG. 22 between the edge of the dielectric post 94 and the edge of the non-ejection area 921 with one side is 20 µm in the above description, the distance OL may vary in a preferable range, which is determined as follows.

The multilayer wiring structures 910, the distances OL of which vary in a range of 0-100µm for examination purposes, were prepared using the method of manufacturing the multilayer wiring structure 910 illustrated in FIGS. 21A-21E. The capacity of the capacitor and the presence of the void between the insulation paste and the dielectric post 4 were examined on each multilayer wiring structure 910.

Table 1 shows the capacity and presence of the void with respect to the distance OL.

TABLE 1

| OL(µm) | CAPACITY | VOID |
|---|---|---|
| 0 | X | ◯ |
| 5 | X | ◯ |
| 10 | ◯ | ◯ |
| 20 | ◯ | ◯ |
| 30 | ◯ | ◯ |
| 40 | ◯ | ◯ |
| 50 | ◯ | ◯ |
| 60 | ◯ | X |
| 70 | ◯ | X |
| 80 | X | X |
| 90 | X | X |
| 100 | X | X |

◯: DEVIATION <20%
X: DEVIATION ≧20%
◯: VERY SMALL OR NO VOID DETECTED
X: VOID DETECTED

In "capacity" columns in Table 1, "◯" indicates that the deviation of the actual capacity from the designed capacity is less than 20%, and "X" indicates that the deviation of the actual capacity from the designed capacity is 20% or greater. In "void" columns, "◯" indicates that there is almost no void, and "X" indicates that there is a void. A supersonic microscope was used for examining the presence of the void.

As can be seen from the result shown in Table 1, the deviation of the capacity of the capacitor was less than 20% when the distance OL was in a range of 10-70 μm, and was 20% or greater when the distance OL was in a range of 80-100 μm.

There was almost no void when the distance OL was in a range of 0-50 μm, and there was a void when the distance OL was in a range of 60-100 μm.

The reason why the capacity deviation is 20% or higher when the distance OL is in a range of 0-5 μm is because the interlayer insulation film 93 is formed on the top portion 94A of the dielectric post 94 due to a alignment error of about ±10 μm of the screen mask 920 for forming the interlayer insulation film 93.

The reason why the capacity deviation is 20% or higher when the distance OL is in a range of 80-100 μm is because there is a void.

Accordingly, the multilayer wiring structure 910 with the internal capacitor that has a small deviation from the designed capacity and has high long-term reliability can be manufactured when the distance OL is in a range of 10-50 μm.

Therefore, in this embodiment, the multilayer wiring structure 910 is manufactured while setting the distance OL in a range of 10-50 μm.

The following describes a result of a thermal impact test. After the multilayer wiring structure 910 of FIG. 20 was manufactured, a thermal impact was applied to the multilayer wiring structure 910 by repeating a heat cycle of −65° C. and 200° C. one hundred times. The capacity was measured before and after applying the thermal impact, and it was found that the capacity variation was ±5%.

Accordingly, the multilayer wiring structure 910 with the internal capacitor that has stability against thermal impact can be manufactured with the manufacturing method illustrated in FIGS. 21A-21E.

As described above, according to the method of manufacturing the multilayer wiring structure 910 illustrated in FIGS. 21A-21E, the dielectric post 94 having a columnar shape is formed on the first metal wiring element 92. Then, the interlayer insulation film 93 is formed to surround the dielectric post 94. In the last step, the second metal wiring element 95 is formed to cover the top portion 94A of the dielectric post 94. Thus, the dielectric post 94 is interposed between the first and second metal wiring elements 92 and 95. In this way, a small capacitor can be easily formed.

Especially, since small dots can be easily formed by screen printing, there is no difficulty in forming a dot having a diameter of 50 μm. In this Embodiment 23, since the dielectric post 94 having a dot shape is used as a dielectric body for the capacitor, the capacitor having a size of about 50-100 μm can be easily formed.

Since the interlayer insulation film 93 is printed to have a height lower than the height of the dielectric post 94, the dielectric post 94 extends beyond the surface of the interlayer insulation film 93 without being completely covered with the interlayer insulation film 93. Accordingly, the capacitor can be formed by only forming the second metal wiring element 95 on the dielectric post 94. Therefore, unlike the method disclosed in Patent Document 2, neither the mechanical polishing process nor the cleaning process is required, so that the manufacturing process of the multilayer wiring structure 910 is simplified.

The insulation paste 930 is printed using the screen mask 920 having the non-ejection area 921 slightly larger than the top portion 94A of the dielectric post 94 while the non-ejection area 921 is generally aligned with the top portion 94A of the dielectric post 94. The void between the dielectric post 94 and the insulation paste 931 and 932 can be filled during the leveling by properly controlling the viscosity of the insulation paste 930. Therefore, the void between the interlayer insulation film 93, and the dielectric post 94 rarely remains. Accordingly, the capacitor having high long-term reliability can be formed.

According to the method of manufacturing the multilayer wiring structure 910 illustrated in FIGS. 21A-21E, since the first metal wiring element 92, the interlayer insulation film 93, the dielectric post 94, and the second metal wiring element 95 are all formed by screen printing, the multilayer wiring structure 910 with the small capacitor can be formed at low cost.

Moreover, according to the method of manufacturing the multilayer wiring structure 910 illustrated in FIGS. 21A-21E, the capacity of the capacitor can be controlled by adjusting the area of the lower electrode (first metal wiring element 92) and the upper electrode (second metal wiring element 95), the relative dielectric constant of the dielectric post 94, and the height of the dielectric post 94. That is, various capacitors having desired capacities can be manufactured by adjusting the above parameters.

Although the screen printing is used throughout the manufacturing process of the multilayer wiring structure 910 in this embodiment, an inkjet method and a dispenser method, which are relatively low-cost methods, may alternatively be used for forming the first and second metal wiring elements 92 and 95.

Although the dielectric paste that contains $BaTiO_3$ as a filler is used for forming the dielectric post 94 in this embodiment, other dielectric pastes containing $SiO_2$, PbO, ZnO, $Al_2O_3$, $TiO_2$, etc., as a filler may alternatively be used.

Although the Ag paste is used as conductive paste for forming the first and second metal wiring elements 92 and 95 in this embodiment, Cu paste, Ni Paste, Pt Paste, Pd Paste, and other conductive paste including carbon resin, conductive polymer resin, etc., may alternatively be used for forming the first and second metal wiring elements 92 and 95.

Although the insulation paste including cresol novolac resin and epoxy resin are used in this embodiment, other insulation pastes including insulating resin such as polyimide resin, phenolic resin, acrylic resin, polyvinyl resin, etc., may alternatively be used for forming the interlayer insulation film 93. Further, the insulation paste may be a thermocuring type or may be a photocuring type. If a photocuring insulation paste is used, ultraviolet rays are irradiated onto the insulation paste in the process of curing the insulation paste.

Although the manufacturing method of the multilayer wiring structure 910 with the internal capacitor is described in this embodiment, a double-layer wiring structure with an internal capacitor in which first and second metal wiring elements are connected through a via hole filled with metal can be formed by forming the via hole between the first and second metal wring elements.

A multilayer wiring structure with an internal capacitor having three or more layers can be formed by repeating Steps A1-E1 of FIGS. 21A-21E.

The via hole filled with metal can be formed using any method well known in the art.

In Embodiment 23, the dielectric post 94 forms an "intermediate body".

Embodiment 24

Figure 24:
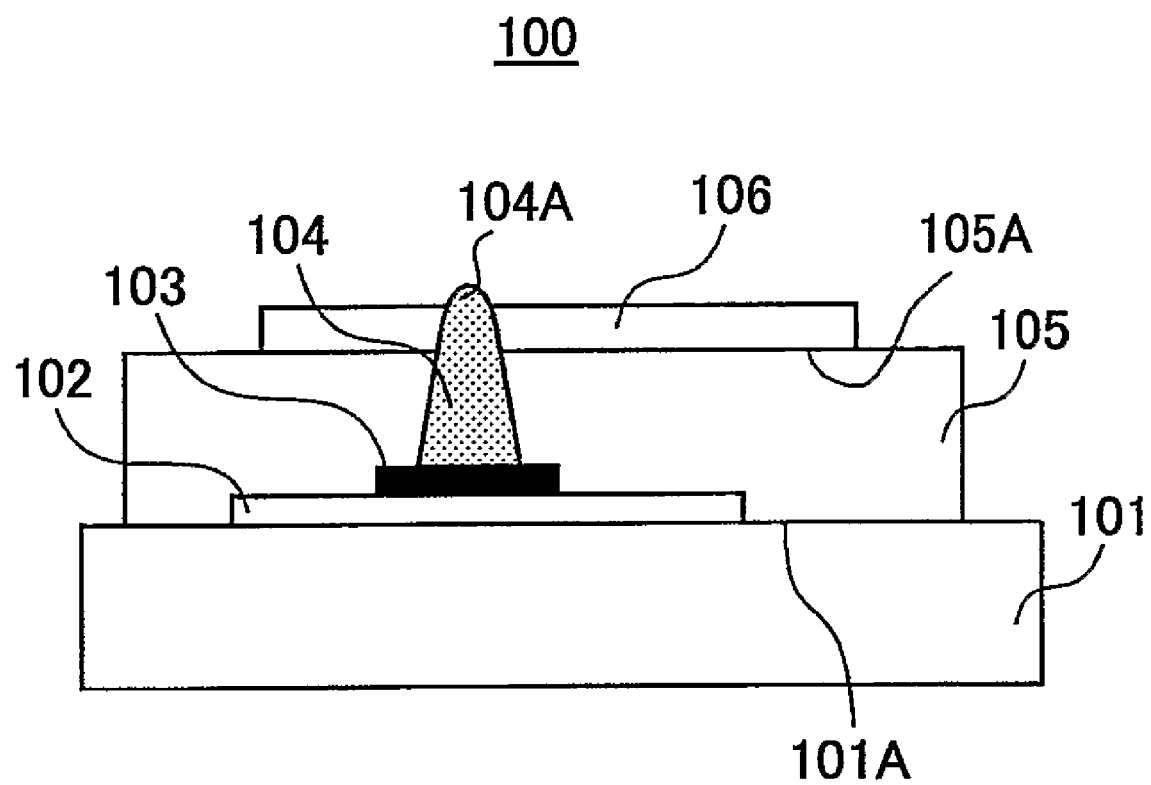
FIG. 24 is a cross-sectional view schematically illustrating a multilayer wiring structure according to Embodiment 24.

FIG. 24 is a cross-sectional view schematically illustrating a multilayer wiring structure 100 according to Embodiment 24. Referring to FIG. 24, the multilayer wiring structure 100 of Embodiment 24 comprises a first metal wiring element 102, a dielectric film 103, a metal post 104, an interlayer insulation film 105, and a second metal wiring element 106.

The first metal wiring element 102 is formed on a first principle surface 101A of a substrate 101 by screen printing. The dielectric film 103 is formed on the first metal wiring element 102 by screen printing. The metal post 104 is generally columnar, and is formed on the dielectric film 103 by screen printing.

The interlayer insulation film 105 is formed on the first principle surface 101A of the substrate 101 by screen printing so as to cover the first metal wiring element 102 and the dielectric film 103. The second metal wiring element 106 is formed on a first principle surface 105A of the interlayer insulation film 105 by screen printing.

Although FIG. 24 shows only one first metal wiring element 102 and one second metal wiring element 106, there are actually more than one first metal wiring element 102 and more than one second metal wiring element 106.

The substrate 101 is made of polyimide. Each of the first and second metal wiring elements 102 and 106 is made of silver (Ag), and has a line width of 70 μm. The dielectric film 103 is made of BaTiO$_3$. The metal post 104 is made of Ag. The interlayer insulation film 105 is made of a silica-based insulating material.

The first metal wiring element 102 has a film thickness of about 6 μm, whereas the dielectric film 103 has a size of 100 μm×100 μm and has a film thickness of about 1 μm. The metal post 104 has a diameter of 60 μm and a height of about 14 μm. The interlayer insulation film 105 has a film thickness of about 8 μm. The second metal wiring element 106 has a film thickness of 4-5 μm.

In the multilayer wiring structure 100, the height of the metal post 104 having a columnar shape is greater than the sum of the film thickness of the interlayer insulation film 105 and the film thickness of the second metal wiring element 106. Moreover, the metal post 104 is formed on the first metal wiring element 102 and the dielectric film 103. Accordingly, the metal post 104 extends through the interlayer insulation film 105 and the second metal wiring element 106 such that a top portion 104A of the metal post 104 extends out of the second metal wiring element 106.

In the multilayer wiring structure 100, the first metal wiring element 102, the dielectric film 103, and the metal post 104 form a capacitor. Specifically, the first metal wiring element 102 and the metal post 104 form a lower electrode and an upper electrode, respectively, of the capacitor. That is, the multilayer wiring structure 100 is a capacitor-embedded multilayer wiring structure.

FIGS. 25A to 25F illustrate a method of manufacturing the multilayer wiring structure 100 of FIG. 24. Referring to FIGS. 25A-25F, the first metal wiring element 102 is formed on the substrate 101 by screen printing. A conductive paste used herein for screen printing is an Ag paste. The Ag paste contains Ag fillers, acrylic resin, carbitol acetal, etc., and has a viscosity in a range of 150-250 Pa·s. A screen mask used herein for screen printing is a stainless mesh No. 500 with an emulsion thickness of 8 μm.

The first metal wiring element 102 having a width of 70 μm is printed on the substrate 101 with the above Ag paste using the above screen mask and a squeegee having a rubber hardness of 70. After printing the first metal wiring element 102 with the Ag paste, the Ag paste is cured by heating in an oven at 150° C. for 30 minutes so as to finish the first metal wiring element 102 (see Step A2 of FIG. 25A).

Then, the dielectric film 103 is formed on the first metal wiring element 102 by screen printing. A dielectric paste used herein for screen printing is a BaTiO$_3$ paste, and has a viscosity in a range of 50-100 Pa·s. A screen mask used herein for screen printing is a stainless mesh No. 380 with an emulsion thickness in a range of 0.1-1 μm.

The dielectric film 103 of 100 μm×100 μm is printed on the first metal wiring element 102 with the above BaTiO$_3$ paste using the above screen mask and a squeegee having a rubber hardness of 80. After printing the dielectric film 103 with the BaTiO$_3$ paste, the BaTiO$_3$ paste is cured by heating in an oven at 150° C. for 30 minutes so as to finish the dielectric film 103 (see Step B2 of FIG. 25B).

Then, the metal post 104 having a columnar shape is formed on the dielectric film 103 by screen printing. A conductive paste used herein for screen printing is an Ag paste. The Ag paste contains Ag fillers, acrylic resin, butyl carbitol, etc., and has a viscosity in a range of 200-300 Pa·s. A screen mask used herein for screen printing is a stainless mesh No. 500 with an emulsion thickness of 5 μm. This screen mask has an ejection hole with a diameter of 60 μm that is not sealed by the emulsion.

An alignment mark of this screen mask is aligned with an alignment mark of the dielectric film 103. Then, the Ag paste is printed onto the dielectric film 103 using a squeegee with a rubber hardness of 70. After that, the Ag paste is cured by heating in an oven at 150° C. for 30 minutes so as to obtain the metal post 104 on the dielectric film 103 (see Step C2 of FIG. 25C).

The metal post 104 is slightly tapered, and has a height of about 14 μm.

Then, the interlayer insulation film 105 is formed on the first metal wiring element 102 by off-contact screen printing. An insulation paste used herein for screen printing includes a silica filler, cresol novolac epoxy resin, epoxy resin, butyl cellosolve acetate, etc., and has a viscosity in a range of 50-150 Pa·s. A screen mask 120 used herein for screen printing is a stainless mesh No. 500 with an emulsion thickness of 1 μm. This screen mask 120 has a non-ejection area 122 with a diameter of 120 μm that is sealed by the emulsion.

An alignment mark of the screen mask 120 is aligned with an alignment mark at the same layer as the metal post 104 on the substrate, so that the non-ejection area 122 is positioned on the top portion 104A of the metal post 104. Since a printing machine used herein has an alignment accuracy of ±10 μm, the top portion 104A of the metal post 104 formed on the first metal wiring element 102 is located within the non-ejection area 122 of the screen mask 120 even with an alignment error. A distance OL between the edge of the metal post 104 and the edge of the non-ejection area 122 with one side is 30 μm.

An insulation paste 150 is put on the screen mask 120, and then printed onto the first metal wiring element 102 while moving a squeegee 140 having a rubber hardness of 60 in the direction of the arrow 911 (see Step D2 in FIG. 25D).

As described in Embodiment 23, the print thickness of the insulation paste can be made smaller than the height of the metal post 104 by selecting the mesh number of the stainless mesh, rubber hardness, and attack angle, etc. In Embodiment 24, the thickness of the insulation paste is 8 μm, and the top portion 104A of the metal post 104 extends beyond the printed insulation paste by 6 μm.

In the same way as described with reference to FIGS. 23A-23C, when the screen mask 120 is separated from the substrate 101, the insulation paste is leveled because the viscosity thereof lowers. Thus, an air gap between the insulation paste and the metal post 104 is filled with the insulation paste.

The printed insulation paste is cured by heating in an oven at 150° C. for 30 minutes so as to obtain the interlayer insulation film 105 on the substrate 101, covering the first metal wiring element 102 and the dielectric film 103 (see Step E2 of FIG. 25E).

Because the insulation paste shrinks little in volume upon the heating at 150° C. for 30 minutes, the metal post 104 remains extending beyond the surface of the interlayer insulation film 105 by 6 μm even after the insulation paste is cured.

After the interlayer insulation film 105 is formed, the second metal wiring element 106 is formed on the interlayer insulation film 105 by screen printing. A conductive paste used herein for screen printing is the same Ag paste as used for the first metal wiring element 102.

A screen mask used herein for screen printing is a stainless mesh No. 500 with an emulsion thickness of 5 μm.

An alignment mark of this screen mask is aligned with an alignment mark at the same layer as the metal post 104 on the substrate 101, so that the second metal wiring element 106 is positioned on the top portion 104A of the metal post 104.

The Ag paste having a width of 70 μm is applied using the above screen mask and a squeegee having a rubber hardness of 70. The applied Ag paste is cured by heating in an oven at 150° C. for 30 minutes so as to obtain the second metal wiring element 106 (see Step F1 of FIG. 25F).

Since the film thickness of the second metal wiring element 106 is in a range of 4-5 μm, the top portion 104A of the metal post 104 extends out of the second metal wiring element 106.

Thus, the manufacturing process of the multilayer wiring structure 100 is completed.

As described above, according to the method of manufacturing the multilayer wiring structure 100 illustrated in FIGS. 25A-25F, the dielectric film 103 is formed on the first metal wiring element 102. The metal post 104 having a columnar shape is formed on the dielectric film 103, and then the interlayer insulation film 105 is formed to surround the metal post 104. In the last step, the second metal wiring element 106 is formed such that the top portion 104A of the metal post 104 extends out of the second metal wiring element 106. Thus, the dielectric film 103 is interposed between the first metal wiring element 102 and the metal post 104. In this way, a small capacitor can be easily formed. Moreover, since the film thickness of the dielectric film 103 can be made smaller than the dielectric post 94 of Embodiment 23, the capacitor having higher capacity can be formed.

Since the interlayer insulation film 105 is printed to have a height lower than the height of the metal post 104, the metal post 104 extends beyond the surface of the interlayer insulation film 105 without being completely covered with the interlayer insulation film 105. Accordingly, the capacitor can be formed by only forming the second metal wiring element 106 on the metal post 104. Therefore, unlike the method disclosed in Patent Document 2, neither the mechanical polishing process nor the cleaning process is required, so that the manufacturing process of the multilayer wiring structure 100 is simplified.

The insulation paste 150 is printed using the screen mask 120 having the non-ejection area 122 slightly larger than the top portion 104A of the metal post 104 while the non-ejection area 122 is generally aligned with the top portion 104A of the metal post 104. The air gap between the metal post 104 and the insulation paste can be filled during the leveling by properly controlling the viscosity of the insulation paste 150. Therefore, the void between the interlayer insulation film 105 and the metal post 104 rarely remains. Accordingly, the capacitor having high long-term reliability can be formed.

According to the method of manufacturing the multilayer wiring structure 100 illustrated in FIGS. 25A-25F, since the first metal wiring element 102, the dielectric film 103, the metal post 104, the interlayer insulation film 105, and the second metal wiring element 106 are all formed by screen printing, the multilayer wiring structure 100 with the small capacitor can be formed at low cost.

Moreover, according to the method of manufacturing the multilayer wiring structure 100 illustrated in FIGS. 25A-25F, the capacity of the capacitor can be controlled by adjusting the area of the lower electrode (first metal wiring element 102) and the upper electrode (the metal post 104), the relative dielectric constant of the dielectric film 103, and the thickness of the dielectric film 103. That is, various capacitors having desired capacities can be manufactured by adjusting the above parameters such as the area of the lower electrode.

Although the manufacturing method of the multilayer wiring structure 100 with the internal capacitor is described in this embodiment, a double-layer wiring structure with an internal capacitor in which first and second metal wiring elements are connected through a via hole filled with metal can be formed by forming the via hole between the first and second metal wring elements.

A multilayer wiring structure with an internal capacitor having three or more layers can be formed by repeating Steps A2-E2 and F1 of FIGS. 25A-25F.

The via hole filled with metal can be formed using any method well known in the art.

In Embodiment 24, the dielectric film 103 and the metal post 104 form an "intermediate body".

Embodiment 25

Figure 26:
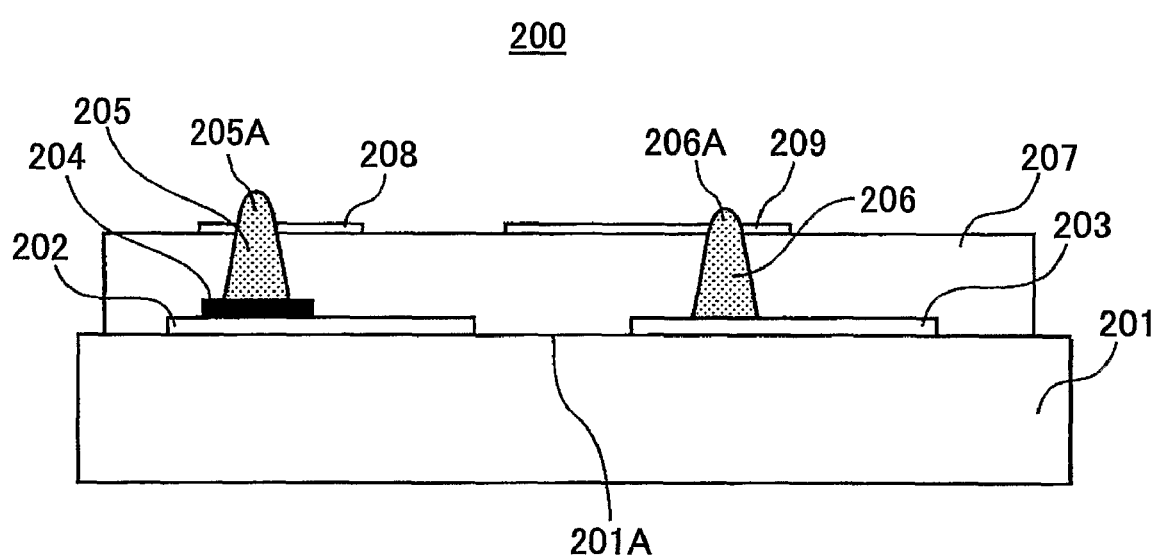
FIG. 26 is a cross-sectional view schematically illustrating a multilayer wiring structure according to Embodiment 25.

FIG. 26 is a cross-sectional view schematically illustrating a multilayer wiring structure 200 according to Embodiment 25. Referring to FIG. 26, the multilayer wiring structure 200 of Embodiment 25 comprises first metal wiring elements 202 and 203, a dielectric film 204, metal posts 205 and 206, an interlayer insulation film 207, and second metal wiring elements 208 and 209.

The first metal wiring elements 202 and 203 are formed on a first principle surface 201A of a substrate 201 by screen printing. The dielectric film 204 is formed on the first metal wiring element 202 by screen printing. The metal post 205 is generally columnar, and is formed on the dielectric film 204 by screen printing.

The metal post 206 is generally columnar, and is formed on the first metal wiring element 203 by screen printing. The interlayer insulation film 207 is formed on the first principle surface 201A of the substrate 201 by screen printing so as to cover the first metal wiring elements 202 and 203 and the dielectric film 204. The second metal wiring elements 208 and 209 are formed on the metal posts 205 and 206, respectively, by screen printing.

Although FIG. 26 shows only two first metal wiring elements 202 and 203 and two second metal wiring elements 208 and 209, there are actually more than two first metal wiring elements 202 and 203 and more than two second metal wiring elements 208 and 209.

The substrate 201 is made of polyimide. Each of the first metal wiring elements 202 and 203 and the second metal wiring elements 208 and 209 is made of silver (Ag), and has a line width of 70 μm. The dielectric film 204 is made of $BaTiO_3$. The metal posts 205 and 206 are made of Ag. The interlayer insulation film 207 is made of a silica-based insulating material.

Each of the first metal wiring elements 202 and 203 has a film thickness of about 4 μm, whereas the dielectric film 204 has a size of 100 μm×100 μm and has a film thickness of about 1 μm. The metal post 205 has a diameter of 60 μm and a height of about 14 μm. The metal post 206 has a diameter of 80 μm and a height of about 14 μm. The interlayer insulation film 207 has a film thickness of about 8 μm. Each of the second metal wiring elements 208 and 209 has a film thickness of about 4 μm.

In the multilayer wiring structure 200, the height of the metal post 205 having a columnar shape is greater than the sum of the film thickness of the interlayer insulation film 207 and the film thickness of the second metal wiring element 208, and the metal post 205 is formed on the first metal wiring element 202 and the dielectric film 204. Accordingly, the metal post 205 extends through the interlayer insulation film 207 and the second metal wiring element 208 such that a top portion 205A of the metal post 205 extends out of the second metal wiring element 208.

The height of the metal post 206 having a columnar shape is greater than the sum of the film thickness of the interlayer insulation film 207 and the film thickness of the second metal wiring element 209, and the metal post 206 is formed on the first metal wiring element 203. Accordingly, the metal post 206 extends through the interlayer insulation film 207 and the second metal wiring element 209 such that a top portion 206A of the metal post 206 extends out of the second metal wiring element 209.

In the multilayer wiring structure 200, the first metal wiring element 202, the dielectric film 204, and the metal post 205 form a capacitor. Specifically, the first metal wiring element 202 and the metal post 205 form a lower electrode and an upper electrode, respectively, of the capacitor.

Also, in the multilayer wiring structure 200, the first metal wiring element 203, the metal post 206, and the second metal wiring element 209 form multilayer wiring in which the first and second metal wiring elements 203 and 209 disposed on the upper and lower sides are connected to each other.

That is, the multilayer wiring structure 200 is a capacitor-embedded multilayer wiring structure.

FIGS. 27A to 27F illustrate a method of manufacturing the multilayer wiring structure 200 of FIG. 26. Referring to FIGS. 27A-27F, the first metal wiring elements 202 and 203 are formed on the substrate 201 by screen printing.

A conductive paste used herein for screen printing is an Ag paste. The Ag paste contains Ag fillers, acrylic resin, carbitol acetal, etc., and has a viscosity in a range of 150-250 Pa·s.

A screen mask used herein for screen printing is a stainless mesh No. 500 with an emulsion thickness of 8 μm.

The first metal wiring elements 202 and 203 each having a width of 70 μm is printed on the substrate 201 with the above Ag paste using the above screen mask and a squeegee having a rubber hardness of 70. After printing the first metal wiring elements 202 and 203 with the Ag paste, the Ag paste is cured by heating in an oven at 150° C. for 30 minutes so as to finish the first metal wiring elements 202 and 203 (see Step A3 of FIG. 27A).

The first metal wiring element 203, on which the metal post 206 is to be formed, has a diameter of 120 μm.

Then, the dielectric film 204 is formed on the first metal wiring element 202 by screen printing. A dielectric paste used herein for screen printing is a BaTiO$_3$ paste, and has a viscosity in a range of 50-100 Pa·s. A screen mask used herein for screen printing is a stainless mesh No. 380 with an emulsion thickness in a range of 0.1-1 μm.

The dielectric film 204 of 100 μm×100 μm is printed on the first metal wiring element 202 with the above BaTiO$_3$ paste using the above screen mask and a squeegee having a rubber hardness of 80. After printing the dielectric film 204 with the BaTiO$_3$ paste, the BaTiO$_3$ paste is cured by heating in an oven at 150° C. for 30 minutes so as to finish the dielectric film 204 (see Step B3 of FIG. 27B).

Then, the metal post 205 and the metal post 206 having columnar shapes are formed at the same time on the dielectric film 204 and the first metal wiring element 203, respectively, by screen printing. A conductive paste used herein for screen printing is an Ag paste. The Ag paste contains Ag particles, acrylic resin, butyl carbitol, etc., and has a viscosity in a range of 200-300 Pa·s. A screen mask used herein for screen printing is a stainless mesh No. 500 with an emulsion thickness of 5 μm. This screen mask has an ejection hole with a diameter of 60 μm and another ejection hole with a diameter of 80 μm that are not sealed by the emulsion. The ejection hole with the diameter of 60 μm is for forming the metal post 205, while the ejection hole with the diameter of 80 μm is for forming the metal post 206.

An alignment mark of this screen mask is aligned with an alignment mark of the dielectric film 204. Then, the Ag paste is applied onto the dielectric film 204 and the first metal wiring element 203 using a squeegee with a rubber hardness of 70. After that, the Ag paste is cured by heating in an oven at 150° C. for 30 minutes to obtain the metal posts 205 and 206 on the dielectric film 204 and the first metal wiring element 203, respectively (see Step C3 of FIG. 27C).

Each of the metal posts 205 and 206 has a height of about 14 μm.

Then, the interlayer insulation film 207 is formed on the first metal wiring elements 202 and 203 by off-contact screen printing. An insulation paste used herein for screen printing includes a silica filler, cresol novolac epoxy resin, epoxy resin, butyl cellosolve acetate, etc., and has a viscosity in a range of 50-150 Pa·s. A screen mask 260 used herein for screen printing is a stainless mesh No. 500 with an emulsion thickness in a range of 1-10 μm. This screen mask 260 has a non-ejection area 261 with a diameter of 100 μm and another non-ejection area 262 with a diameter of 120 μm that are sealed by the emulsion.

An alignment mark of the screen mask 260 is aligned with an alignment mark at the same layer as the metal posts 205 and 206 on the substrate, so that the non-ejection areas 261 and 262 are positioned on the top portions 205A and 206A of the metal posts 205 and 206, respectively. Since a printing machine used herein has an alignment accuracy of ±10 μm, the top portion 205A of the metal post 205 formed on the dielectric film 204 is located within the non-ejection area 261 of the screen mask 260 even with an alignment error. Similarly, the top portion 206A of the metal post 206 formed on the first metal wiring element 203 is located within the non-ejection area 262 of the screen mask 260 even with an alignment error. Each of a distance OL1 between the edge of the metal post 205 and the edge of the non-ejection area 261 and a distance OL2 between the edge of the metal post 206 and the edge of the non-ejection area 262 is 20 μm.

An insulation paste 270 is put on the screen mask 260, and then printed onto the dielectric film 204 and the first metal wiring element 203 while moving a squeegee 240 having a rubber hardness of 60 in the direction of the arrow 911 (see Step D3 in FIG. 27D).

As described in Embodiment 23, the print thickness of the insulation paste can be made smaller than the height of the metal posts 205 and 206 by selecting the mesh number of the stainless mesh, rubber hardness, attack angle, etc. In Embodiment 25, the thickness of the insulation paste is 8 μm, and each of the top portions 205A and 206A of the metal posts 205 and 206 extends beyond the printed insulation paste by 6 μm.

As described with reference to FIGS. 23A-23C, when the screen mask 260 is separated from the substrate 201, the insulation paste is leveled because the viscosity thereof lowers. Thus, an air gap between the insulation paste and the metal posts 205 and 206 is filled with the insulation paste.

The printed insulation paste is cured by heating in an oven at 150° C. for 30 minutes so as to obtain the interlayer insulation film 207 on the substrate 201, covering the first metal wiring elements 202 and 203 and the dielectric film 204 (see Step E3 of FIG. 27E).

Because the insulation paste shrinks little in volume upon the heating at 150° C. for 30 minutes, each of the metal posts 205 and 206 remains extending beyond the surface of the interlayer insulation film 207 by 6 μm even after the insulation paste is cured.

After the interlayer insulation film 207 is formed, the second metal wiring elements 208 and 209 are formed on the interlayer insulation film 207 by screen printing. A conductive paste used herein for screen printing is the same Ag paste as used for the first metal wiring elements 202 and 203. A screen mask used herein for screen printing is a stainless mesh No. 500 with an emulsion thickness of 5 μm.

An alignment mark of this screen mask is aligned with an alignment mark at the same layer as the metal posts 205 and 206 on the substrate, so that the second metal wiring elements 208 and 209 are positioned on the top portions 205A and 206A of the metal posts 205 and 206, respectively.

The Ag paste having a width of 70 μm is applied using the above screen mask and a squeegee having a rubber hardness of 70. The applied Ag paste is cured by heating in an oven at 150° C. for 30 minutes so as to obtain the second metal wiring elements 208 and 209 (see Step F2 of FIG. 27F).

The film thickness of the second metal wiring elements 208 and 209 is about 4 μm, and the top portions 205A and 206A of the metal posts 205 and 206 extend out of the second metal wiring elements 208 and 209, respectively.

Thus, the manufacturing process of the multilayer wiring structure 200 is completed.

Although each of the distance OL1 between the edge of the metal post 205 and the edge of the non-ejection area 261 and the distance OL2 between the edge of the metal post 206 and the edge of the non-ejection area 262 is 20 μm in the above description, the distance OL1 and OL2 may vary in a preferable range, which is determined as follows.

The multilayer wiring structures 200, the distances OL1 and OL2 of which vary in a range of 0-100 μm for examination purposes, were prepared using the method of manufacturing the multilayer wiring structure 200 illustrated in FIGS. 27A-27F. The capacity of the capacitor, presence of void near the metal post 205, contact resistance of the metal post 205, and presence of void near the metal post 206 are examined on each multilayer wiring structure 200.

Table 2 shows the capacity of the capacitor, presence of void near the metal post 205, contact resistance of the metal post 206, and presence of void near the metal post 206 with respect to the distance OL1=OL2=OL.

TABLE 2

| OL(μm) | CAPACITOR CAPACITY | VOID NEAR CAPACITOR | CONTACT RESISTANCE | VOID NEAR VIA HOLE |
|---|---|---|---|---|
| 0 | X | ○ | Δ | ○ |
| 5 | X | ○ | Δ | ○ |
| 10 | ○ | ○ | ○ | ○ |
| 20 | ○ | ○ | ○ | ○ |
| 30 | ○ | ○ | ○ | ○ |

TABLE 2-continued

| OL(μm) | CAPACITOR CAPACITY | VOID NEAR CAPACITOR | CONTACT RESISTANCE | VOID NEAR VIA HOLE |
|---|---|---|---|---|
| 40 | ○ | ○ | ○ | ○ |
| 50 | ○ | ○ | ○ | ○ |
| 60 | ○ | X | ○ | X |
| 70 | ○ | X | ○ | X |
| 80 | X | X | ○ | X |
| 90 | X | X | ○ | X |
| 100 | X | X | ○ | X |

○: DEVIATION <20%
X: DEVIATION ≧20%
X: CONDUCTIVE FAILURE
Δ: CONTACT RESISTANCE INCREASED
○: CONTACT RESISTANCE <10Ω
○: VERY SMALL OR NO VOID DETECTED
X: VOID DETECTED
○: VERY SMALL OR NO VOID DETECTED
X: VOID DETECTED

In "capacitor capacity" columns in Table 2, "○" indicates that the deviation of the actual capacity from the designed capacity is less than 20%, and "X" indicates that the deviation of the actual capacity from the designed capacity is 20% or greater. In "void near capacitor" and "void near via hole (metal post 206)" columns, "○" indicates that there is almost no void, and "X" indicates that there is a void. A supersonic microscope was used for examining the presence of the void. Further, in "contact resistance" columns, "○" indicates that the contact resistance is less than 10 Ω, which is considered as a desired range, or in other words, good contact resistance is obtained; "Δ" indicates that the contact resistance is increased; and "X" indicates that there is conduction failure.

As can be seen from the result shown in Table 2, the deviation of the capacity of the capacitor was less than 20% when the distance OL was in a range of 10-70 μm, and was 20% or greater when the distance OL was in a range of 80-100 μm.

There was almost no void near the capacitor and the via hole (metal post 206) when the distance OL was in a range of 0-50 μm, and there was a void when the distance OL was in a range of 60-100 μm.

Good contact resistance was obtained when the distance OL was in a range of 10-100 μm.

Accordingly, the multilayer wiring structure 200 with the internal capacitor that has a small deviation from the designed capacity, has good contact resistance, and has high long-term reliability can be manufactured when the distance OL is in a range of 10-50 μm.

Therefore, in this embodiment, the multilayer wiring structure 200 is manufactured while setting the distance OL in a range of 10-50 μm.

The following describes a result of a thermal impact test. After the multilayer wiring structure 200 of FIG. 26 was manufactured, a thermal impact was applied to the multilayer wiring structure 200 by repeating a heat cycle of −65° C. and 200° C. one hundred times. The capacity was measured before and after applying the thermal impact, and it was found that there was little capacity variation.

The thermal impact test was also performed on the multilayer wiring structure 200 formed on a flexible printed board or a ceramic substrate using the manufacturing method illustrated in FIGS. 27A-27F, and it was found that there was little capacity variation.

Accordingly, the multilayer wiring structure 200 with the internal capacitor that has stability against thermal impact can be manufactured with the manufacturing method illustrated in FIGS. 27A-27F.

As described above, according to the method of manufacturing the multilayer wiring structure 200 of FIG. 26, the dielectric film 204 is formed on the first metal wiring element 202. The metal post 205 having a columnar shape is formed on the dielectric film 204, and then the interlayer insulation film 207 is formed to surround the dielectric post 205. In the last step, the second metal wiring element 208 is formed such that the top portion 205A of the metal post 205 extends out of the second metal wiring element 208. Thus, the dielectric film 204 is interposed between the first metal wiring element 202 and the metal post 205. In this way, a small capacitor can be easily formed. Moreover, since the film thickness of the dielectric film 204 can be made smaller than the dielectric post 94 of Embodiment 23, the capacitor having higher capacity can be formed.

Further, according to the method of manufacturing the multilayer wiring structure 200 of FIG. 26, the metal post 206 having a columnar shape is formed on the first metal wiring element 203. Then, the interlayer insulation film 207 is formed to surround the metal post 206. In the last step, the second metal wiring element 209 is formed such that the top portion 206A of the metal post 206 extends out of the second metal wiring element 209. Thus, the first metal wiring element 203 and the second metal wiring element 209 are connected through the metal post 206 (via hole filled with metal).

Generally, screen printing is more suitable for dot printing than for hole printing. Although it is difficult to print a hole having a diameter as large as 100 μm by screen printing, it is easy to print a dot having a diameter as small as 50 μm by screen printing.

Accordingly, a via hole (metal post 206) smaller than via holes formed with the related art methods, especially the via hole (metal post 206) having a diameter of 100 μm or less, can be easily formed by using screen printing.

Since the interlayer insulation film 207 is printed to have a height less than the height of the metal posts 205 and 206, the metal posts 205 and 206 extend beyond the surface of the interlayer insulation film 207 without being completely covered with the interlayer insulation film 207. Accordingly, the capacitor and the via-hole (metal post 206) having good contact resistance can be formed by just forming the second metal wiring elements 208 and 209 on the metal posts 205 and 206, respectively. Therefore, unlike the method disclosed in Patent Document 2, neither the mechanical polishing process nor the cleaning process is required, so that the manufacturing process of the multilayer wiring structure 200 is simplified.

Since the metal posts 205 and 206 are formed at the same time by performing screen printing one time, the capacitor and the via hole filled with a conductor can be formed using the same method as described in Embodiment 24 (see FIGS. 25A-25F). Accordingly, a process of forming a via hole for connecting the upper and lower metal wiring elements and a process of filling the via hole are eliminated.

The insulation paste 270 is printed using the screen mask 260 having the non-ejection area 261 and 262 slightly larger than the top portions 205A and 206A of the metal posts 205 and 206, respectively, while the non-ejection areas 261 and 262 are generally aligned with the top portions 205A and 206A of the metal posts 205 and 206. The void between the metal posts 205 and 206 and the insulation paste 270 can be filled during the leveling by properly controlling the viscosity of the insulation paste 270. Therefore, the void between the interlayer insulation film 207 and the metal posts 205 and 206 rarely remains. Accordingly, the capacitor having high long-term reliability can be formed.

According to the method of manufacturing the multilayer wiring structure 200 illustrated in FIGS. 27A-27F, since the first metal wiring elements 202 and 203, the dielectric film 204, the metal posts 205 and 206, the interlayer insulation film 207, and the second metal wiring elements 208 and 209 are all formed by screen printing, the multilayer wiring structure 200 with the small capacitor can be formed at low cost.

Moreover, according to the method of manufacturing the multilayer wiring structure 200 illustrated in FIGS. 27A-27F, the capacity of the capacitor can be controlled by the area of the lower electrode (first metal wiring element 202) and the upper electrode (the metal post 205), the relative dielectric constant of the dielectric film 204, and the thickness of the dielectric film 204. That is, various capacitors having desired capacities can be manufactured by adjusting the above parameters such as the area of the lower electrode. A multilayer wiring structure with an internal capacitor having three or more layers can be formed by repeating Steps A3-E3 and F2 of FIGS. 27A-27F.

In Embodiment 25, the dielectric film 204 and the metal posts 205 and 206 form an "intermediate body". Specifically, the metal post 206 forms a "first intermediate body" while the metal post 205 forms a "second intermediate body".

MODIFIED EMBODIMENT

Figure 28:
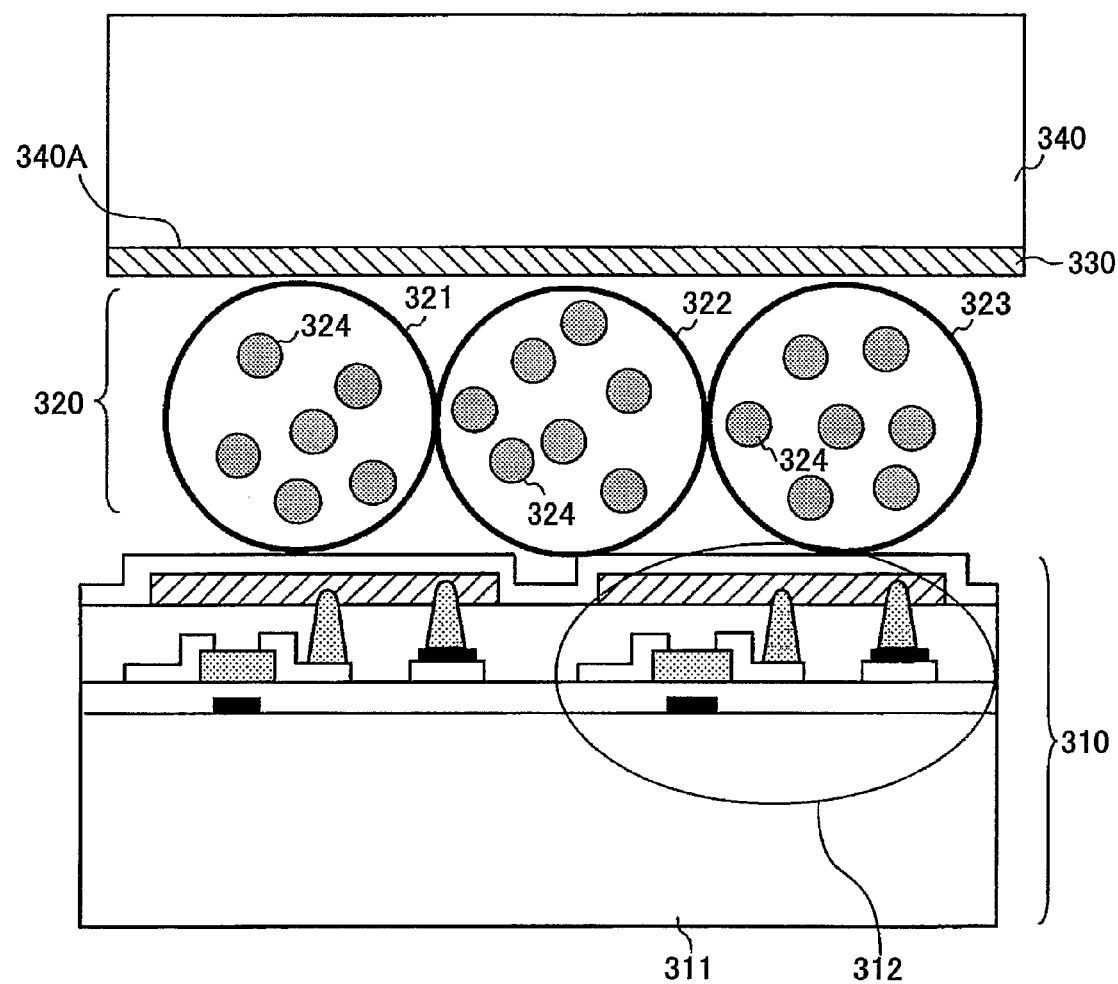
FIG. 28 is a cross-sectional view schematically illustrating a flat panel display device comprising the multilayer wiring structure of FIG. 26.

FIG. 28 is a cross-sectional view schematically illustrating a flat panel display device 300 comprising the multilayer wiring structure of FIG. 26. Referring to FIG. 28, the flat panel display device 300 comprises an active matrix drive circuit 310, an electrophoresis device 320, a common electrode 330, and an opposed substrate 340.

The active matrix drive circuit 310 comprises a substrate 311 and plural TFTs 312. The substrate 311 is made of polycarbonate. The TFTs 312 are formed on the substrate 311.

The electrophoresis device 320 comprises microcapsules 321-323. Each of the microcapsules 321-323 comprises plural electrophoresis particles 324. The microcapsules 321-323 are in contact with both the active matrix drive circuit 310 and the common electrode 330.

The common electrode 330 is made of ITO (Indium Tin Oxide), and formed on a first principle surface 340A of the opposed substrate 340. The common electrode 330 is in contact with the electrophoresis device 320. The opposed substrate 340 is made of polycarbonate.

Figure 29:
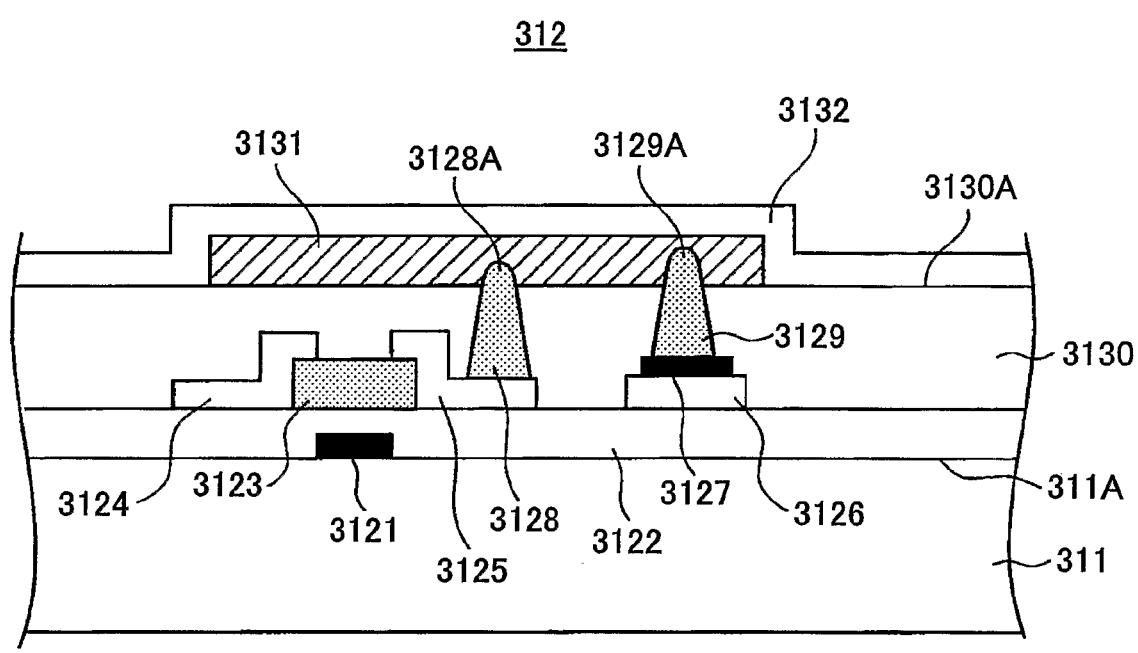
FIG. 29 is a cross-sectional view illustrating a TFT shown in FIG. 28.

FIG. 29 is a cross-sectional view illustrating the TFT 312 of FIG. 28. Referring to FIG. 29, the TFT 312 comprises a gate electrode 3121, a gate insulation film 3122, an active layer 3123, a drain electrode 3124, a source electrode 3125, a lower electrode 3126, a dielectric film 3127, metal posts 3128 and 3129, an interlayer insulation film 3130, a pixel electrode 3131, and a passivation film 3132.

The gate electrode 3121 is formed on a first principle surface 311A of the substrate 311. The gate insulation film 3122 is formed on the first principle surface 311A of the substrate 311 so as to cover the gate electrode 3121. The active layer 3123 is formed on the gate insulation film 3122 so as to face the gate electrode 3121. The drain electrode 3124 and the source electrode 3125 are formed on the gate insulation film 3122 and the active layer 3123. The lower electrode 3126 is formed on the gate insulation film 3122.

The dielectric film 3127 is formed on the lower electrode 3126. The metal posts 3128 and 3129 are formed on the source electrode 3125 and the dielectric film 3127, respectively. The interlayer insulation film 3130 is formed on the gate insulation film 3122 so as to cover the active layer 3123, the drain electrode 3124, the source electrode 3125, the lower electrode 3126, and the dielectric film 3127, and to be in contact with the metal posts 3128 and 3129. The interlayer insulation film 3130 is formed such that a first principle surface 3130A is lower than the height of the metal posts 3128 and 3129.

That is, top portions 3128A and 3129A of the metal posts 3128 and 3129 extend beyond the first principle surface 3130A of the interlayer insulation film 3130 through the interlayer insulation film 3130.

The pixel electrode 3131 is formed on the first principle surface 3130A of the interlayer insulation film 3130 so as to cover the top portions 3128A and 3129A of the metal posts 3128 and 3129. The passivation film 3132 is formed on the first principle surface 3130A of the interlayer insulation film 3130 so as to cover the pixel electrode 3131.

The gate electrode 3121 is made of aluminum (Al), and the gate insulation film 3122 is made of silicon dioxide ($SiO_2$). The active layer 3123 is made of amorphous silicon (a-Si), and the drain electrode 3124, the source electrode 3125, and the lower electrode 3126 are made of Al.

The dielectric film 3127 is made of $BaTiO_3$, and the metal posts 3128 and 3129 are made of Ag. The interlayer insulation film 3130 is made of the above-described insulation paste, and the pixel electrode 3131 is made of Ag. The passivation film 3132 is made of silicon nitride (SiN).

In the TFT 312, the lower electrode 3126, the dielectric film 3127, the metal post 3129, and the pixel electrode 3131 form a capacitor. Therefore, the TFT 312 functions as a transistor with an internal capacitor.

The following describes a method of manufacturing the flat panel display device 300. Al is sputtered onto the substrate 311 made of polycarbonate. The sputtered Al is patterned by photolithography etching such that the gate electrode 3121 is formed on the substrate 311.

$SiO_2$ is deposited by plasma CVD such that the gate insulation film 3122 is formed on the substrate 311 to cover the gate electrode 3121. The a-Si film is formed on the gate insulation film 3122 by plasma CVD. The a-Si film is then patterned by photolithography etching so as to form the active layer 3123.

Then, Al is sputtered onto the gate insulation film 3122 to cover the active layer 3123. The sputtered Al is patterned by photolithography etching so as to form the drain electrode 3124, the source electrode 3125, and the lower electrode 3126.

With these steps, 120×180 elements of thin-film transistors made of a-Si are formed in a matrix form.

Then, the dielectric film 3127 is formed on the lower electrode 3126 by screen printing. The dielectric film 3127 has a size of 70 μm×70 μm and a film thickness of 1 μm. A dielectric paste used for forming the dielectric film 3127 by screen printing is a $BaTiO_3$ paste. The conditions of screen printing are the same conditions as described above.

Then, the metal posts 3128 and 3129 are formed on the source electrode 3125 and the dielectric film 3127, respectively, by screen printing. Each of the metal posts 3128 and 3129 has a diameter of 60 μm.

The interlayer insulation film 3130 is formed with the insulation paste by screen printing. A screen mask used for forming the interlayer insulation film 3130 by screen printing has two non-ejection areas each having a diameter of 100 μm. The insulation paste is applied while the two non-ejection areas are aligned with the metal post 3128 and 3129. The interlayer insulation film 3130 has a film thickness such that the first principle surface 3130A is lower than the top level of the metal posts 3128 and 3129.

Subsequently, the 250 μm square pixel electrode 3131 is formed by screen printing. A SiN film is formed on the interlayer insulation film 3130 by cat-CVD to cover the pixel electrode 3131 so as to obtain the passivation film 3132. With these steps, the active matrix drive circuit 310 is completed.

Then, an ITO film is formed on the first principle surface 340A of the opposed substrate 340 by sputtering. The ITO film formed by sputtering is patterned by photolithography etching so as to form the common electrode 330. The microcapsules 321-323 encapsulating the electrophoresis particles 324 are coated onto the common electrode 330. The opposed substrate 340 on which the microcapsules 321-323 are coated is placed on the active matrix drive circuit 310 such that the microcapsules 321-323 are in contact with the TFTs 312. Then an epoxy type sealer is applied to seal around the substrate 311 and the opposed substrate 340.

With these steps, the flat panel display device 300 is formed.

The electrophoresis device 320 of the flat panel display device 300 can be driven by the active matrix drive circuit 310 and has the same image quality level as electrophoresis devices of drive circuits with the same DR formed only by photolithography etching.

Since the capacitor formed by the lower electrode 3126, the dielectric film 3127, and the metal post 3129 accumulates charges when arbitrary of the TFTs 312 is turned off, the active matrix drive circuit 310 has memory property sufficient to be used as electronic papers.

Since the flat panel display device 300 comprises a multilayer wiring structure with an internal capacitor connected through the metal posts 3128 and 3129, the flat panel display device 300 is formed at lower cost than flat panel display devices having a capacitor, via holes, and a pixel electrode formed by photolithography etching.

Although the electrophoresis device 320 is used as a display device of the flat panel display device 300 in this embodiment, liquid crystal display devices and EL (Electro Luminescence), etc., may alternatively be used as a display device of the flat panel display device 300.

Further, poly-Si TFTs and organic semiconductor TFTs, etc., may be used as the TFTs 312 of the active matrix drive circuit 310. The present invention is not limited to display devices, TFTs forming drive circuits, and diodes, but includes any objects using any of the above multilayer wiring structures 910, 100, and 200.

Although the multilayer wiring structure 910 of Embodiment 23 is formed on the glass substrate and the multilayer wiring structures 100 and 200 of Embodiment 24 and 25 are formed on the polyimide substrates in the above description, the multilayer wiring structure 910, 100, and 200 may alternatively be formed on ceramic substrate or printed boards other than the glass and polyimide substrates. Generally, the multilayer wiring structure 910, 100, and 200 are formed on insulation substrates.

Each of the multilayer wiring structures 910, 100, and 200 formed on printed boards or the ceramic substrates forms an "element substrate".

The foregoing description of the preferred embodiments of the invention has been presented for purposes of illustration and description. It is not intended to be exhaustive or to limit the invention to the precise form disclosed, and obviously many modifications and variations are possible in light of the above teachings. The scope of the present invention is defined by the appended claims.

The present application is based on Japanese Priority Applications No. 2005-070227 filed on Mar. 14, 2005, No. 2005-143590 filed on May 17, 2005, and No. 2005-306592 filed on Oct. 21, 2005, with the Japanese Patent Office, the entire contents of which are hereby incorporated by reference.

INDUSTRIAL APPLICABILITY

The present invention is applicable to a multilayer wiring structure with a small internal capacitor. The present invention is also applicable to a method of manufacturing a multilayer wiring structures with a small internal capacitor without adding a polishing process and a cleaning process. Further, the present invention is applicable to an element substrate comprising a multilayer wiring structures with a small internal capacitor. The present invention is also applicable to a flat panel display device comprising a multilayer wiring structure with a small internal capacitor.

The invention claimed is:

1. A method of manufacturing a multilayer wiring structure, comprising:
   a step of forming plural pairs of alignment marks on each end of a substrate on which a first metal wiring element is formed;
   a step of forming a via post on the first metal wiring element while subsequently reading the pairs of alignment marks formed on each end of the substrate, feeding back positions of the alignment marks, and correcting a position of the substrate by using the positions of the alignment marks;
   a step of printing an interlayer insulation film on the first metal wiring element, with use of a screen mask having a non-ejection area slightly larger than a head of the via post, such that the interlayer insulation film has an upper surface at a level lower than the head of the via post, while aligning the non-ejection area with the head of the via post;
   a step of curing the interlayer insulation film; and
   a step of forming a second metal wiring element in contact with the via post on the interlayer insulation film such that the first metal wiring element and the second metal wiring element are connected through the via post.

2. The method of manufacturing a multilayer wiring element as claimed in claim 1, wherein the non-ejection area of the screen mask extends outward around the via post by 10-50 µm when aligned with the head of the via post.

3. A method of manufacturing a multilayer wiring structure, comprising:
   a step of forming plural pairs of alignment marks on each end of a substrate on which a first metal wiring element is formed;
   a step of forming a via post on the first metal wiring element while subsequently reading the pairs of alignment marks formed on each end of the substrate, feeding back positions of the alignment marks, and correcting a position of the substrate by using the positions of the alignment marks;
   a step of printing an interlayer insulation film on the first metal wiring element by an inkjet method or a dispenser method such that the interlayer insulation film has an upper surface at a level lower than a head of the via post;
   a step of curing the interlayer insulation film; and
   a step of forming a second metal wiring element in contact with the via post on the interlayer insulation film such that the first metal wiring element and the second metal wiring element are connected through the via post.

4. The method of manufacturing a multilayer wiring structure as claimed in claim 1, wherein the via post is formed by an inkjet method.

5. A method of manufacturing a multilayer wiring structure, comprising:
   a step of forming plural pairs of alignment marks on each end of a substrate on which a first metal wiring element is formed;
   a step of forming a via post on the first metal wiring element while subsequently reading the pairs of alignment marks formed on each end of the substrate, feeding back positions of the alignment marks, and correcting a position of the substrate by using the positions of the alignment marks;
   a step of printing an interlayer insulation film on the first metal wiring element, with use of a screen mask having a non-ejection area slightly larger than a head of the via post, such that the interlayer insulation film has an upper surface at a level lower than the head of the via post, while aligning the non-ejection area with the head of the via post;
   a step of heating the interlayer insulation film at a temperature lower than a curing temperature of the interlayer insulation film;
   a step of curing the interlayer insulation film; and
   a step of forming a second metal wiring element in contact with the via post on the interlayer insulation film such that the first metal wiring element and the second metal wiring element are connected through the via post.

6. The method of manufacturing a multilayer wiring element as claimed in claim 5, wherein the non-ejection area of the screen mask extends outward around the via post by 10-50 µm when aligned with the head of the via post in the step of printing the interlayer insulation film.

7. A method of manufacturing a multilayer wiring structure, comprising:
   a step of forming plural pairs of alignment marks on each end of a substrate on which a first metal wiring element is formed;
   a step of forming a via post on the first metal wiring element while subsequently reading the pairs of alignment marks formed on each end of the substrate, feeding back positions of the alignment marks, and correcting a position of the substrate by using the positions of the alignments marks;
   a step of printing an interlayer insulation film on the first metal wiring element by an inkjet method or a dispenser method such that the interlayer insulation film has an upper surface at a level lower than a head of the via post;
   a step of heating the interlayer insulation film at a temperature lower than a curing temperature of the interlayer insulation film;
   a step of curing the interlayer insulation film; and
   a step of forming a second metal wiring element in contact with the via post on the interlayer insulation film such that the first metal wiring element and the second metal wiring element are connected through the via post.

8. The method of manufacturing a multilayer wiring structure as claimed in claim 5, wherein the via post is formed by an inkjet method.

* * * * *